(12) United States Patent
Hamada et al.

(10) Patent No.: US 7,602,211 B2
(45) Date of Patent: Oct. 13, 2009

(54) SEMICONDUCTOR INTEGRATED CIRCUIT DEVICE

(75) Inventors: Mototsugu Hamada, Yokohama (JP); Tsuyoshi Nishikawa, Kawasaki (JP); Toshiyuki Furusawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/132,428

(22) Filed: Jun. 3, 2008

(65) Prior Publication Data

US 2008/0238485 A1  Oct. 2, 2008

Related U.S. Application Data

(63) Continuation of application No. 11/502,572, filed on Aug. 11, 2006, now Pat. No. 7,397,271.

(30) Foreign Application Priority Data

Aug. 19, 2005 (JP) .............................. 2005-238747
Jun. 12, 2006 (JP) .............................. 2006-162560

(51) Int. Cl.
*H03K 17/16* (2006.01)
*H03K 19/003* (2006.01)

(52) U.S. Cl. .............................. 326/33; 326/93; 326/119

(58) Field of Classification Search .................. 326/17, 326/33, 93, 112, 119, 121
See application file for complete search history.

(56) References Cited

U.S. PATENT DOCUMENTS 6,493,856 B2 *  12/2002  Usami et al. ................... 716/10

| 6,750,680 B2 | 6/2004 | Zama et al. |
| 6,759,701 B2 | 7/2004 | Shimizume |
| 7,397,271 B2 * | 7/2008 | Hamada et al. ............... 326/33 |

OTHER PUBLICATIONS

G. Uvieghara, et al., "A Highly-Integrated 3G CDMA2000 1X Cellular Baseband Chip With GSM/AMPS/GPS/Bluetooth/Multimedia Capabilities And ZIF RF Support", IEEE International Solid-State Circuits Conference, paper 23.3, Slide Supplements, 2004, 19 pages.
G. Uvieghara, et al., "A Highly-Integrated 3G CDMA2000 1X Cellular Baseband Chip With GSM/AMPS/GPS/Bluetooth/Multimedia Capabilities and ZIF RF Support", IEEE International Solid-State Circuits Conference, Session 23, Feb. 18, 2004, 5 pages.

* cited by examiner

*Primary Examiner*—Anh Q Tran
(74) *Attorney, Agent, or Firm*—Oblon, Spivak, McClelland, Maier & Neustadt, L.L.P.

(57) ABSTRACT

A semiconductor integrated circuit device has a combinational logic circuit including one or plural logic cells connected in series. At least one of the logic cells includes a standard cell which includes a MIS transistor, an input terminal to which an output signal from a previous stage is inputted as an input signal, and an output terminal. A first conductivity-type first MIS transistor which is provided between the output terminal of the standard cell and a first power supply voltage, the first MIS transistor including a control terminal to which a circuit control signal is inputted, and the first MIS transistor supplying the first power supply voltage to the output terminal of the standard cell based on the circuit control signal in order to bring the standard cell into an operation-stopped state. A second conductivity-type second MIS transistor cuts off a leakage current of the MIS transistor in the standard cell.

20 Claims, 55 Drawing Sheets

| State | EN | CLK | B | HT-latch | C | M-latch | D | S-latch | OUT |
|---|---|---|---|---|---|---|---|---|---|
| (1) | H | H | Q | Thru | Q | Hold | R | Thru | R |
| (2) | H | L | Q | Thru | Q | Thru | Q | Hold | R |
| (3) | L | H | Q | Hold | R | Hold | S | Thru | S |
| (4) | L | L | Q | Hold | R | Thru | R | Hold | S |

FIG.39

| State | EN | CLK | B | HT-latch | C | M-latch | D | S-latch | OUT |
|---|---|---|---|---|---|---|---|---|---|
| (1) | H | H | Q | Thru | Q | Hold | R | Thru | R |
| (2) | H | L | Q | Thru | Q | Thru | Q | Hold | R |
| (3) | L | H | Q | Hold | R | Hold | S | Thru | S |
| (4) | L | L | Q | Hold | R | Thru | R | Hold | S |

FIG.41

SEMICONDUCTOR INTEGRATED CIRCUIT DEVICE

CROSS REFERENCE TO RELATED APPLICATION

This application is a continuation of Ser. No. 11/502,572, filed on Aug. 11, 2006 now U.S. Pat No. 7,397,271, which claims benefit of priority under 35 U.S.C. §119 to Japanese Patent Applications No. 2005-238747, filed on Aug. 19, 2005, and No. 2006-162560, filed on Jun. 12, 2006. The entire contents of all of the above applications are incorporated herein by reference.

BACKGROUND OF THE INVENTION

1. Field of the Invention

The present invention relates to a semiconductor integrated circuit device, and particularly relates to a semiconductor integrated circuit device including a combinational logic circuit.

2. Related Background Art

Uvighara, et al. show a leakage current reducing method in ISSCC2004 Digest of Technical Papers (23.3) February, 2004 and Slide Supplements (23.3) [Non-Patent Document 1].

In the leakage current reducing method disclosed in Non-Patent Document 1, two types of logic cells, a normal logic cell and a logic cell with a foot switch, are prepared. The normal logic cell includes only high threshold voltage (HVT) transistors, but the logic cell with the foot switch includes a standard cell formed by a low threshold voltage (LVT) transistor and the foot switch formed by a high threshold voltage (HVT) transistor.

In this case, the logic cell with the foot switch can operate at higher speed than the normal logic cell including only the high threshold voltage transistors, but the leakage current while the foot switch is on is larger than that of the normal logic cell.

In Non-Patent Document 1, a combinational logic circuit is formed by a mixture of these normal logic cell and logic cell with the foot switch. On this occasion, the use of the normal logic cell is tried as much as possible, and only when the speed requirement is not met, the logic cell with the foot switch is used.

Generally, there are plural clock domains inside a semiconductor integrated circuit. Power consumption is reduced by stopping the supply of a clock signal of a clock domain corresponding to a portion which need not be operated, and this technique is called gated clock or clock gating.

The control whether the clock signal is supplied to a specific clock domain is performed by a control circuit provided in the middle of a clock tree. When the supply of the clock signal is stopped, a combinational logic circuit of its corresponding clock domain is stopped, and consequently if a logic cell with a foot switch is provided in this combinational logic circuit, the leakage current can be reduced by turning off this foot switch. To turn on/off the foot switch of the logic cell with the foot switch, the control circuit is required to supply its control signal to the foot switch.

However, if the foot switch of the combinational logic circuit is turned off before the combinational logic circuit finishes an operation, a proper operation result is not sometimes obtained, and therefore, also in Non-Patent Document 1, the foot switch is turned off several cycles after the supply of the clock signal is stopped, and the clock signal is supplied several cycles after the foot switch is turned on.

In Non-Patent Document 1, the number of delay cycles is ex post adjustable. More specifically, it suggests setting the number of delay cycles after manufacturing since it is difficult to estimate the required number of delay cycles in the design phase of the combinational logic circuit. This is because the setting of the number of delay cycles corresponds to that of a waiting time during operation of the integrated circuit, so that setting with minimum expenditures of time is desired.

As can be seen from the above, Non-Patent Document 1 has three main problems. The first problem is that a relatively long delay cycle is needed for switching between active and standby states where the clock signal is supplied/stopped, respectively, and to control this, complicated hardware is necessary. The second problem is that it is difficult to estimate the number of delay cycles required to obtain the proper operation result from the combinational logic circuit in the design phase, and hence the adjustment of the number of delay cycles is needed after manufacturing. The third problem is that the number of delay cycles to be set may vary from product to product due to variations in manufacturing process, so that the burden required for its adjustment becomes extremely large.

SUMMARY OF THE INVENTION

In order to accomplish the aforementioned and other objects, according to one aspect of the present invention, a semiconductor integrated circuit device comprises a combinational logic circuit including one or plural logic cells connected in series, wherein at least one of the logic cells comprises:

a standard cell which includes a MIS transistor, the standard cell including an input terminal to which an output signal from a previous stage is inputted as an input signal and an output terminal, and the standard cell performing a predetermined logic operation based on the input signal and outputting a result of the logic operation as an output signal from the output terminal;

a first conductivity-type first MIS transistor which is provided between the output terminal of the standard cell and a first power supply voltage, the first MIS transistor including a control terminal to which a circuit control signal is inputted, and the first MIS transistor supplying the first power supply voltage to the output terminal of the standard cell based on the circuit control signal in order to bring the standard cell into an operation-stopped state; and a second conductivity-type second MIS transistor which is provided between the standard cell and a second power supply voltage, the second MIS transistor including a control terminal to which the circuit control signal is inputted, and the second MIS transistor cutting off a leakage current of the MIS transistor in the standard cell based on the circuit control signal in order to bring the standard cell into the operation-stopped state.

BRIEF DESCRIPTION OF THE DRAWINGS

FIG. 39 shows logic levels of input/output signals and respective nodes in FIG. 38 in tabular form;

FIG. 41 shows logic levels of input/output signals and respective nodes in FIG. 40 in tabular form;

DETAILED DESCRIPTION OF THE EMBODIMENTS

First Embodiment

Figure 1:
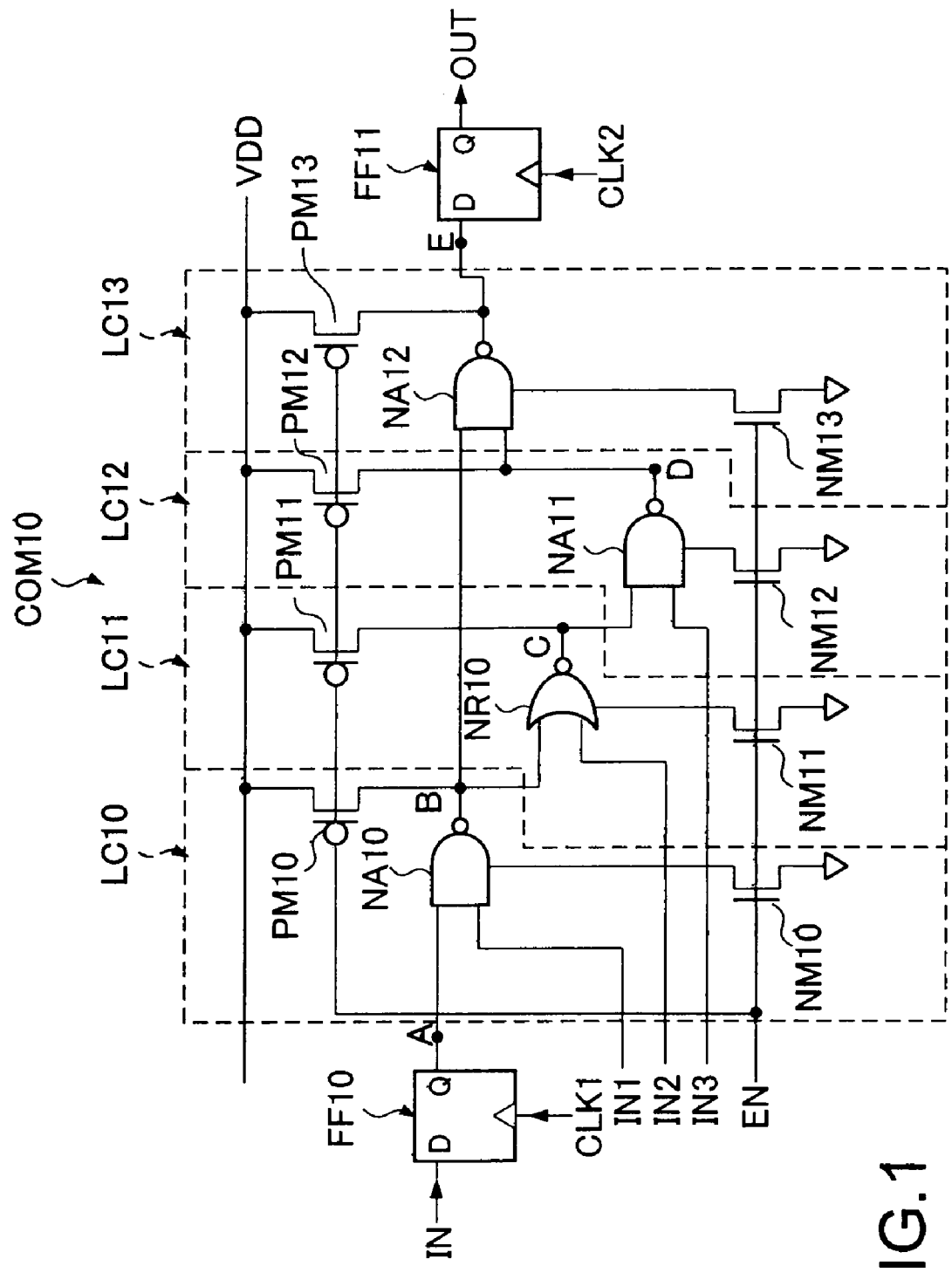
FIG. 1 shows an example of a circuit configuration of a semiconductor integrated circuit device according to a first embodiment.
Figure 2:
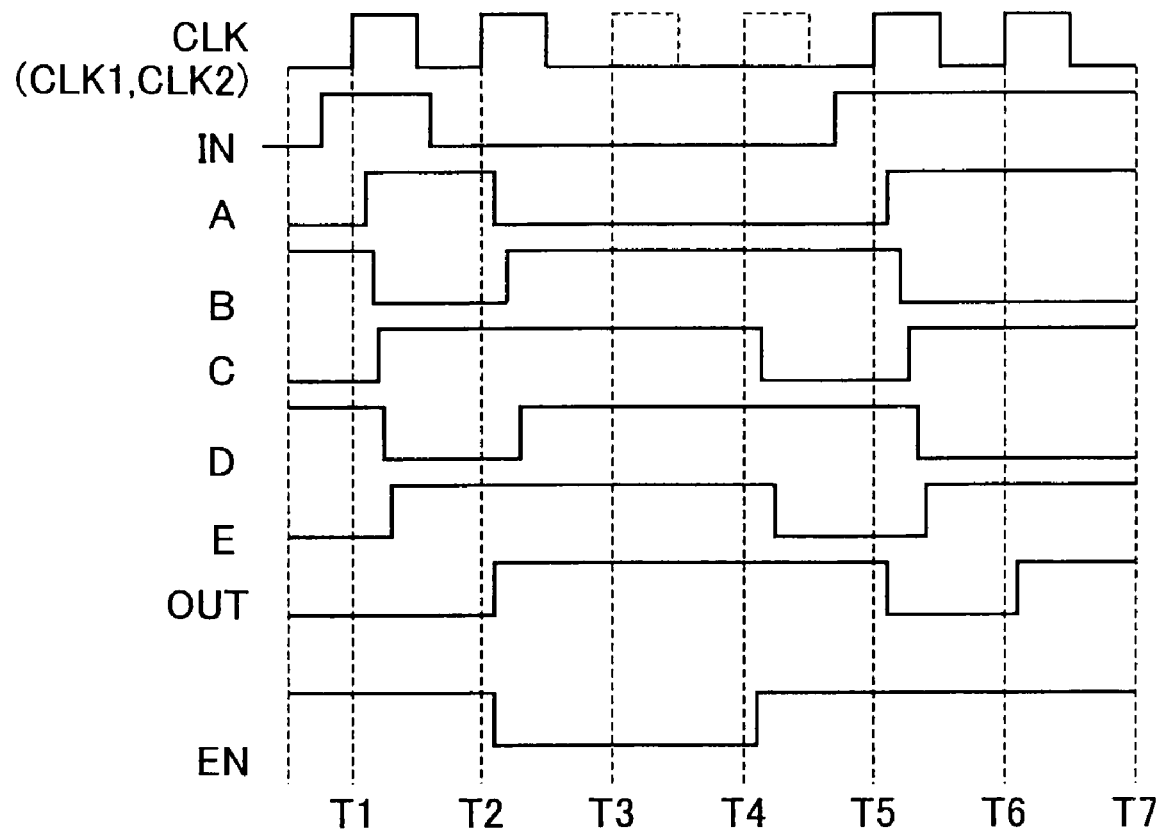
FIG. 2 shows an example of an operation timing chart of the semiconductor integrated circuit device shown in FIG. 1.

FIG. 1 shows an example of a circuit configuration of a combinational logic circuit in a semiconductor integrated circuit device according to this embodiment, and FIG. 2 shows an operation timing chart of the semiconductor integrated circuit device shown in FIG. 1.

As shown in FIG. 1, a clock operating circuit in the semiconductor integrated circuit device according to this embodiment includes a flip-flop circuit FF10, a combinational logic circuit COM10, and a flip-flop circuit FF11.

An input signal IN as a data signal is inputted to a data input terminal D of the flip-flop circuit FF10 and outputted as an output signal from a data output terminal Q in synchronization with a clock signal CLK1 inputted from a clock input terminal. The output signal outputted from the flip-flop circuit FF10 is inputted to the combinational logic circuit COM10.

In the combinational logic circuit COM10, a predetermined logic operation is performed, and a result of the logic operation is outputted as an output signal from the combinational logic circuit COM10. The output signal from the combinational logic circuit COM10 is inputted to a data input terminal D of the flip-flop circuit FF11 and outputted as an output signal OUT from a data output terminal Q in synchronization with a clock signal CLK2 inputted from a clock input terminal.

As specific operations of the flip-flop circuits FF10 and FF11, when the clock signals CLK1 and CLK2 each switch from low to high, the data signal inputted to the data input terminal D is received and outputted as the output signal from the data output terminal Q, but when the clock signals CLK1 and CLK2 are each in a state other than this state, the output signal is maintained.

The combinational logic circuit COM10 includes one or plural logic cells to perform the predetermined logic operation, and, for example, in FIG. 1, it includes four logic cells LC10 to LC13. Each logic cell includes a P-type MOS transistor, a logic circuit, and an N-type MOS transistor.

In each logic cell, when a circuit control signal EN is high, the N-type MOS transistor is turned on, the P-type MOS transistor is turned off, and the logic level of the logic circuit is outputted to its output terminal and inputted to the subsequent-stage logic cell. On the other hand, when the circuit control signal EN is low, the N-type MOS transistor is turned off, the P-type MOS transistor is turned on, and regardless of the logic level of the logic circuit, its output signal is pulled up high and inputted to the subsequent-stage logic cell.

As shown in FIG. 1, in this embodiment, a P-type MOS transistor PM10, a NAND circuit NA10, and an N-type MOS transistor NM10 form one logic cell LC10, a P-type MOS transistor PM11, a NOR circuit NR10, and an N-type MOS transistor NM11 form one logic cell LC11, a P-type MOS transistor PM12, a NAND circuit NA11, and an N-type MOS transistor NM12 form one logic cell LC12, and a P-type MOS transistor PM13, a NAND circuit NA12, and an N-type MOS transistor NM13 form one logic cell LC13. As can be seen from the above, in this embodiment, the logic cells LC10 to LC13 each form a logic cell with a foot switch.

A first reference signal VDD is inputted to each of source terminals of the P-type MOS transistors PM10 to PM13, and the circuit control signal EN is inputted to each of control terminals thereof. The output signal of the flip-flop circuit FF10 and an input signal IN1 are inputted to two input terminals of the NAND circuit NA10. An output terminal of the NAND circuit NA10 and a drain terminal of the P-type MOS transistor PM10 are connected to one input terminal of the NOR circuit NR10. An input signal IN2 is inputted to the other input terminal of the NOR circuit NR10.

An output terminal of the NOR circuit NR10 and a drain terminal of the P-type MOS transistor PM11 are connected to one input terminal of the NAND circuit NA11. An input terminal IN3 is inputted to the other input terminal of the NAND circuit NA11. An output terminal of the NAND circuit NA11 and a drain terminal of the P-type MOS transistor PM12 are connected to one input terminal of the NAND circuit NA12. The other input terminal of the NAND circuit NA12 is connected to the output terminal of the NAND circuit NA10 and the drain terminal of the P-type MOS transistor PM10.

An output terminal of the NAND circuit NA12 and a drain terminal of the P-type MOS transistor PM13 are connected to the data input terminal D of the flop-flop circuit FF11. A second reference signal GND of a ground voltage is inputted to each of source terminals of the N-type MOS transistors NM10 to NM13, and the circuit control signal EN is inputted to each of control terminals thereof. The circuit control signal EN is also inputted to each of the control terminals of the P-type MOS transistors PM10 to PM13. Note that the shown COM 10 is an example of a combinational logic circuit and applicable to a general combinational logic circuit including CMOS standard cells.

As can be seen from FIG. 2, the circuit control signal EN is a signal which, when the clock signals CLK1 and CLK2 are supplied, goes high in synchronization with their rising edge, and when the clock signals CLK1 and CLK2 are stopped, goes low in synchronization with the original rising edge. In this embodiment, an operation-enabled state where the circuit control signal EN is high is defined as an active mode, and an operation-stopped state where the circuit control signal EN is low is defined as a sleep mode.

Incidentally, the P-type MOS transistors PM10 to PM13 each correspond to a first conductivity-type MOS transistor in this embodiment, and the N-type MOS transistors NM10 to NM13 each correspond to a second conductivity-type MOS transistor in this embodiment. The voltage of the first reference signal VDD inputted to the source terminals of the P-type MOS transistors PM10 to PM13 corresponds to a first power supply voltage in this embodiment, and the voltage of the second reference signal GND inputted to the source terminals of the N-type MOS transistors NM10 to NM13 corresponds to a second power supply voltage in this embodiment.

Figure 3:
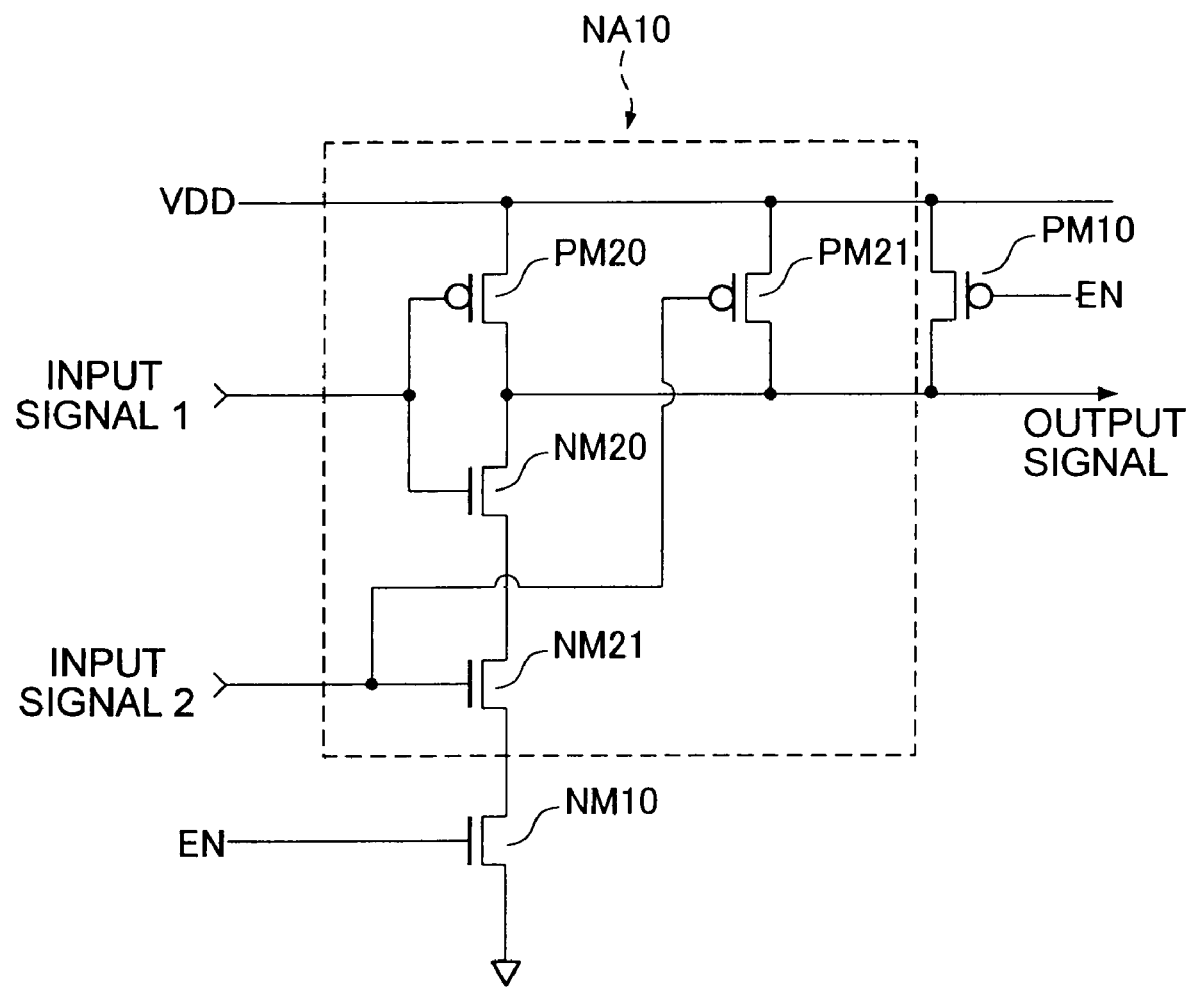
FIG. 3 shows an example of a circuit configuration of a NAND circuit used in the semiconductor integrated circuit device shown in FIG. 1.

Moreover, in this embodiment, the NAND circuits NA10 to NA12 and the NOR circuit NR10 are each an example of a standard cell which performs the predetermined logic operation and formed by MOS transistors. The NAND circuit can be formed, for example, by MOS transistors such as shown in FIG. 3. In the example in FIG. 3, the NAND circuit is formed by P-type MOS transistors PM20 and PM21 connected in parallel with each other and N-type MOS transistors NM20 and NM21 connected in series with each other and in series with the P-type MOS transistors PM20 and PM21.

In FIG. 3, the configuration of the logic cell LC10 including the NAND circuit NA10 is shown as an example, and hence, the pull-up MOS transistor PM10 is provided in parallel with the P-type MOS transistor PM21, and the MOS transistor NM10 as a foot switch is provided between the N-type MOS transistor NM21 and a signal line of the second reference signal GND. As is clear from this configuration, if the pull-up MOS transistor PM10 is turned on, the output signal goes high regardless of a logic output of the NAND circuit NA10. If the MOS transistor NM10 as the foot switch is turned off, the leakage current is cut off regardless of the state of the internal MOS transistors forming the NAND circuit NA10.

Figure 4:
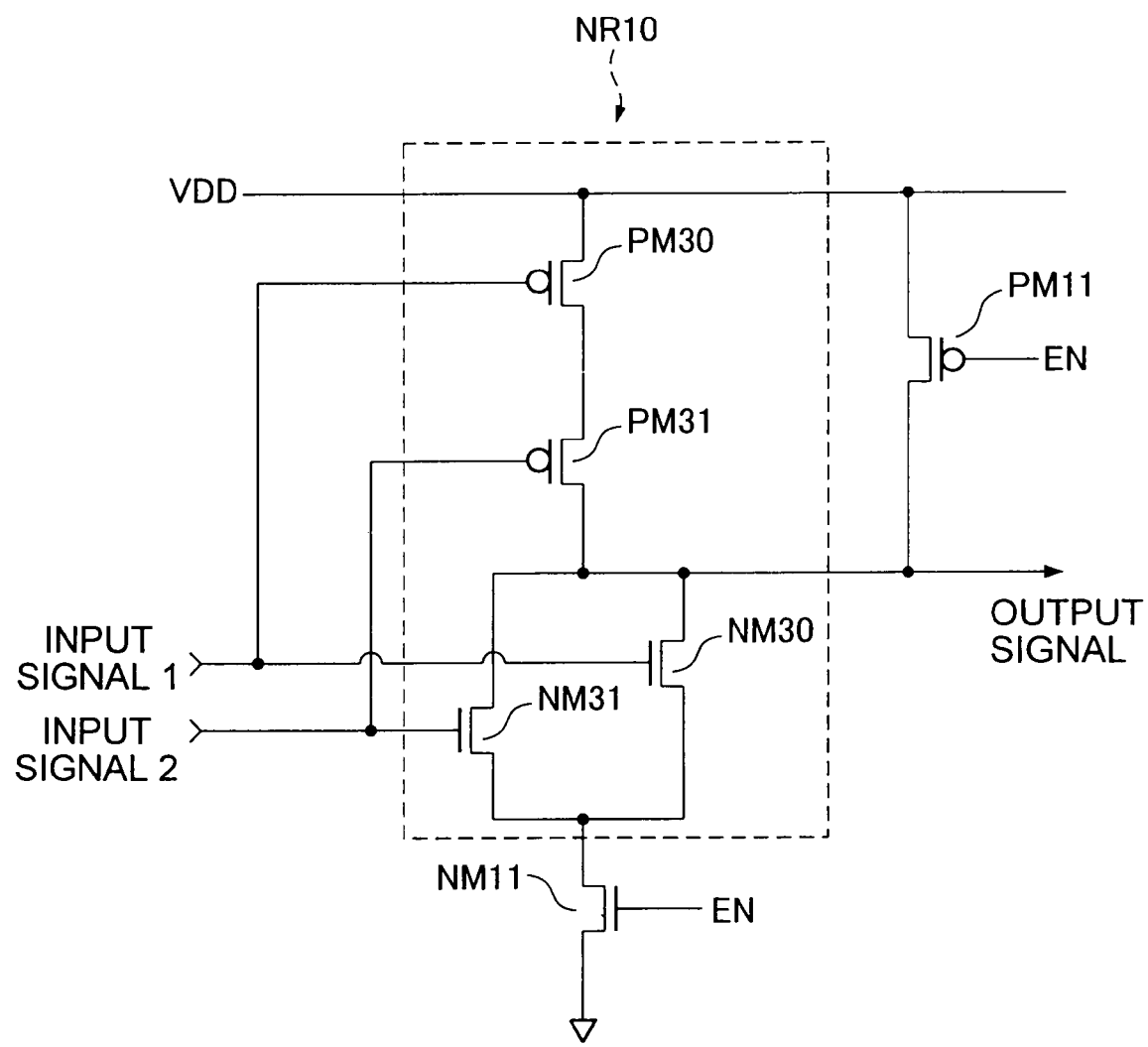
FIG. 4 shows an example of a circuit configuration of a NOR circuit used in the semiconductor integrated circuit shown in FIG. 1.

The NOR circuit can be formed, for example, by MOS transistors such as shown in FIG. 4. In the example is FIG. 4, the NOR circuit is formed by P-type MOS transistors PM30 and PM31 connected in parallel with each other and N-type MOS transistors NM30 and NM31 connected in parallel with each other and in series with the P-type MOS transistors PM30 and PM31.

In FIG. 4, the configuration of the logic cell LC11 including the NOR circuit NA10 is shown as an example, and hence, the pull-up MOS transistor PM11 is provided in parallel with the P-type MOS transistors PM30 and PM31, and the MOS transistor NM11 as a foot switch is provided between the N-type MOS transistors NM30 and NM31 and a signal line of the second reference signal GND. As is clear from this configuration, if the pull-up MOS transistor PM11 is turned on, the output signal goes high regardless of a logic output of the NOR circuit NR10. If the MOS transistor NM11 as the foot switch is turned off, the leakage current is cut off regardless of the state of the internal MOS transistors forming the NOR circuit NR10.

Incidentally, such a configuration that the threshold voltage of the MOS transistors NM10 to NM13 becomes higher than the threshold voltage of the MOS transistors PM20, PM21, NM20, and NM21 forming the NAND circuits NA10 to NA12 and the MOS transistors PM30, PM31, NM30, and NM31 forming the NOR circuit NR10 is also possible. This configuration makes it possible to increase the operation speeds of the NAND circuit and the NOR circuit being standard cells and more certainly cut off the leakage current by the N-type MOS transistors NM10 to NM13. In this case, the threshold voltage of the P-type MOS transistors PM10 to PM13 may be the same or lower than the threshold voltage of the N-type MOS transistor NM10.

Next, the operation of the combinational logic circuit COM10 shown in FIG. 1 will be described in detail with reference to FIG. 2. It is assumed here that the first reference signal (VDD) is high and the second reference signal (GND) is low. It is further assumed here that the same clock signal CLK is inputted to CLK1 and CLK2. It is furthermore assumed that the first reference signal (VDD) is inputted to IN1 and IN3 and the second reference signal (GND) is inputted to IN2.

First, in a first clock cycle between a time T1 and a time T2, the combinational logic circuit COM10 operates similarly to a normal logic circuit since the circuit control signal EN is high.

In a next second clock cycle between the time T2 and a time T3, after the clock signal CLK rises, the circuit control signal EN changes from high to low and enters the sleep mode. As a result, four nodes of a node B, a node C, a node D, and a node E are pulled up by the P-type MOS transistors PM10 to PM13, respectively and go high. In other words, in the sleep mode, the output signals of the logic cells LC10 to LC13 go high regardless of outputs of the NAND circuits NA10 to NA12 and the NOR circuit NR10 as the standard cells of the logic cells LC10 to LC13. Therefore, the input signal to the data input terminal D of the flip-flop circuit FF11 is also fixed high.

In a next third clock cycle between the time T3 and a time T4, the circuit control signal EN is maintained low, and a clock gating state in which the supply of the clock signal CLK is stopped is maintained.

In a next fourth clock cycle between the time T4 and a time T5, immediately after this clock cycle is started, the circuit control signal EN goes from low to high and changes to the active mode. When the circuit control signal EN goes high, the P-type MOS transistors PM10 to PM13 are turned off and the N-type MOS transistors NM10 to NM13 are turned on, so that the NAND circuits NA10 to NA12 and the NOR circuit NR10 as the standard cells each operate to perform the predetermined logic operation and output a result of the logic operation to the output terminal. Namely, the node A to the node E sequentially return to values immediately before the sleep mode is entered. In this embodiment, the value of the node E returns to the value immediately before the sleep mode is entered during the fourth clock cycle, that is, before the time T5.

In a next fifth clock cycle between the time T5 and a time T6, when the clock signal CLK changes from low to high at the time T5, the flip-flop circuit FF11 receives the value of the node E inputted to the data input terminal D and outputs it as the output signal OUT from the data output terminal Q. Consequently, the flip-flop circuit FF11 is brought into a state in which it could receive the value immediately before the sleep mode is entered and normally output it as the output signal OUT. The combinational logic circuit COM10 goes into a state capable of a normal operation synchronized with the clock signal CLK.

Meanwhile, it is recommended that the gate width of the pull-up MOS transistor is smaller than the gate widths of the other MOS transistors. This is because it is recommended to make the size small in terms of parasitic capacitance since the pull-up MOS transistor remains off during the active mode. Although this size influences the switching time when switching from the active mode to the sleep mode is made, the time is only required to be approximately equal to the clock cycle, so that the gate width can be made smaller compared with the other MOS transistors.

Next, the operation of the logic cell in the sleep mode, that is, when the circuit control signal EN is low will be described. For example, the logic cell LC 13 formed by the NAND circuit has the circuit configuration shown in FIG. 3, and in the sleep mode, that is, when the circuit control signal EN is low. an input signal 1 (node B) and an input signal 2 (node D) go high. The output signal (node E) also goes high. At this time, the source potential of the MOS transistors NM20 and NM21 becomes a potential lower than the power supply voltage VDD by the threshold voltage of the MOS transistor NM20 (NM21).

Most of the gate leakage current in the logic cell LC13 flows from a drain to a gate of the MOS transistor NM10. This is because the potentials of all terminals of the transistors forming the NAND circuit become high, so that there is no potential difference and the gate-source potential difference in the MOS transistors NM20 and NM21 becomes a small value approximately equal to the threshold voltage. Further, since the MOS transistor PM10 can be designed to have a gate width relatively smaller compared with the other transistors, the gate leakage current is small.

Accordingly, most of the gate leakage current when the circuit control signal EN is low occurs in the MOS transistor MN10, and the gate-drain potential difference in the MOS transistor NM10 is not the power supply voltage VDD but a value smaller than the power supply voltage VDD by the threshold voltage, so that the gate leakage current can be reduced.

As described above, according to the semiconductor integrated circuit device of this embodiment, when the circuit control signal EN is switched from low to high for switching from the sleep mode to the active mode, the combinational logic circuit COM10 can perform the normal operation synchronized with the clock signal CLK from the next clock cycle. Namely, in the example in FIG. 2, in the fourth clock cycle between the time T4 and the time T5, the circuit control signal EN is driven high, and from the next time T5, the combinational logic circuit COM10 can output the normal logic operation result as a logic level. Hence, the time period when the circuit control signal EN can remain low in the sleep mode can be prolonged, which can reduce power consumption due to the leakage current of the combinational logic circuit COM10.

Further, according to the semiconductor integrated circuit device of this embodiment, the gate leakage current during the sleep mode can be reduced. Incidentally, also in embodiments described later, in the logic cell including the pull-up transistor, the same effect can be obtained when the circuit control signal EN is low and the other input signals are high.

Furthermore, according to the semiconductor integrated circuit device of this embodiment, it can be determined that the output signals of the logic cells LC10 to LC13 in the sleep mode are high, so that the operation timings of these logic cells LC10 to LC13 in a shift from the sleep mode to the active mode (after the circuit control signal EN is switched from low to thigh) can be analyzed using an existing analysis tool. If the existing analysis tool is used, the time required before the value of the node E is determined after the circuit control signal EN goes high can be found, and it can be verified whether the value of the node E is determined before the clock signal CLK goes high next time. In other words, in the design phase of the semiconductor integrated circuit device, it can be verified whether the output logic level of the combinational logic circuit COM10 is determined before a clock cycle next to the clock cycle when the circuit control signal EN goes high, which eliminates the need for adjusting the number of delay cycles after product manufacturing as in the related art.

Second Embodiment

In a second embodiment, a gated clock signal CLK is generated by an OR circuit and a flip-flop circuit. Portions different from the above first embodiment will be described below.

Figure 5:
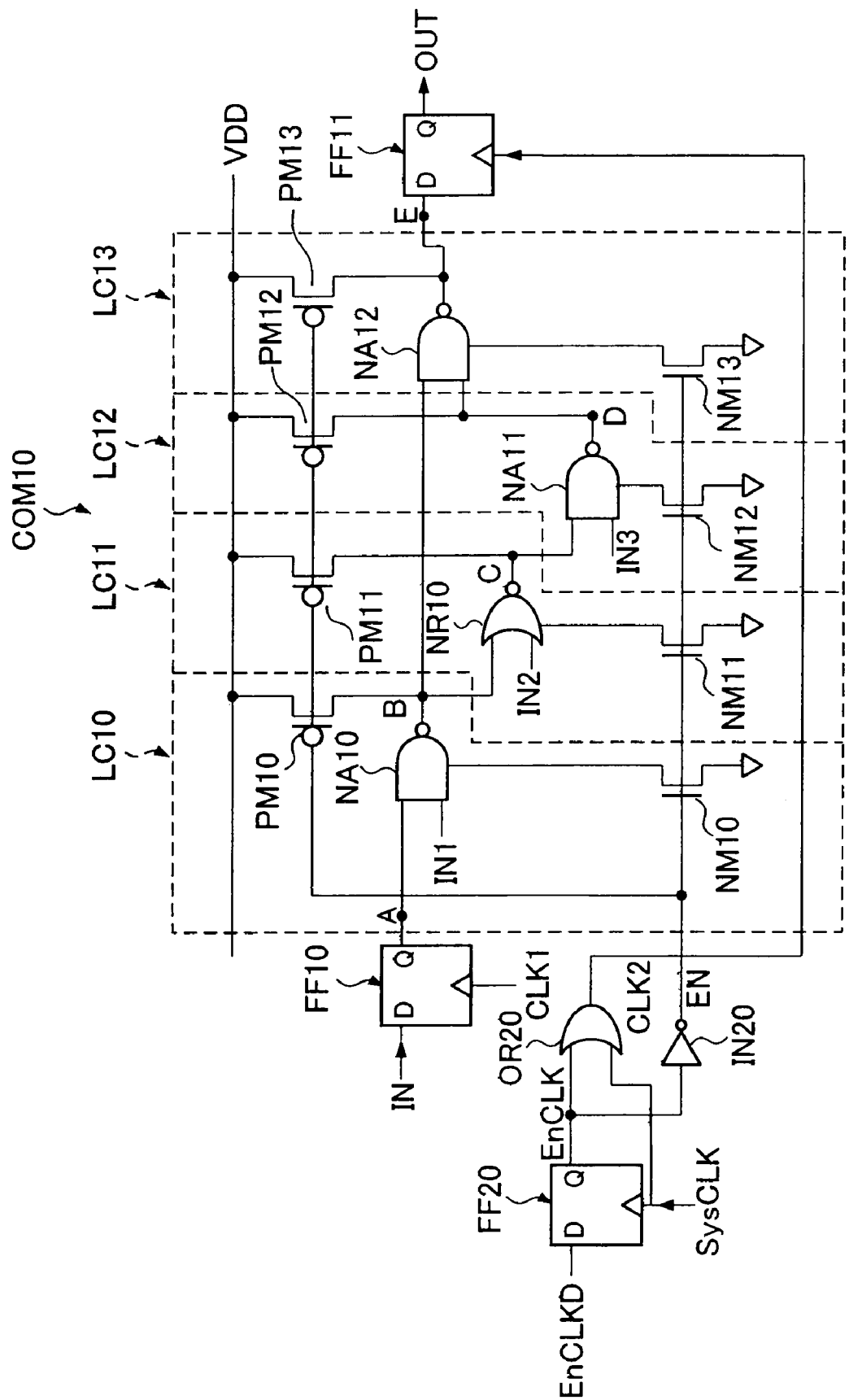
FIG. 5 shows an example of a circuit configuration of a semiconductor integrated circuit device according to a second embodiment.
Figure 6:
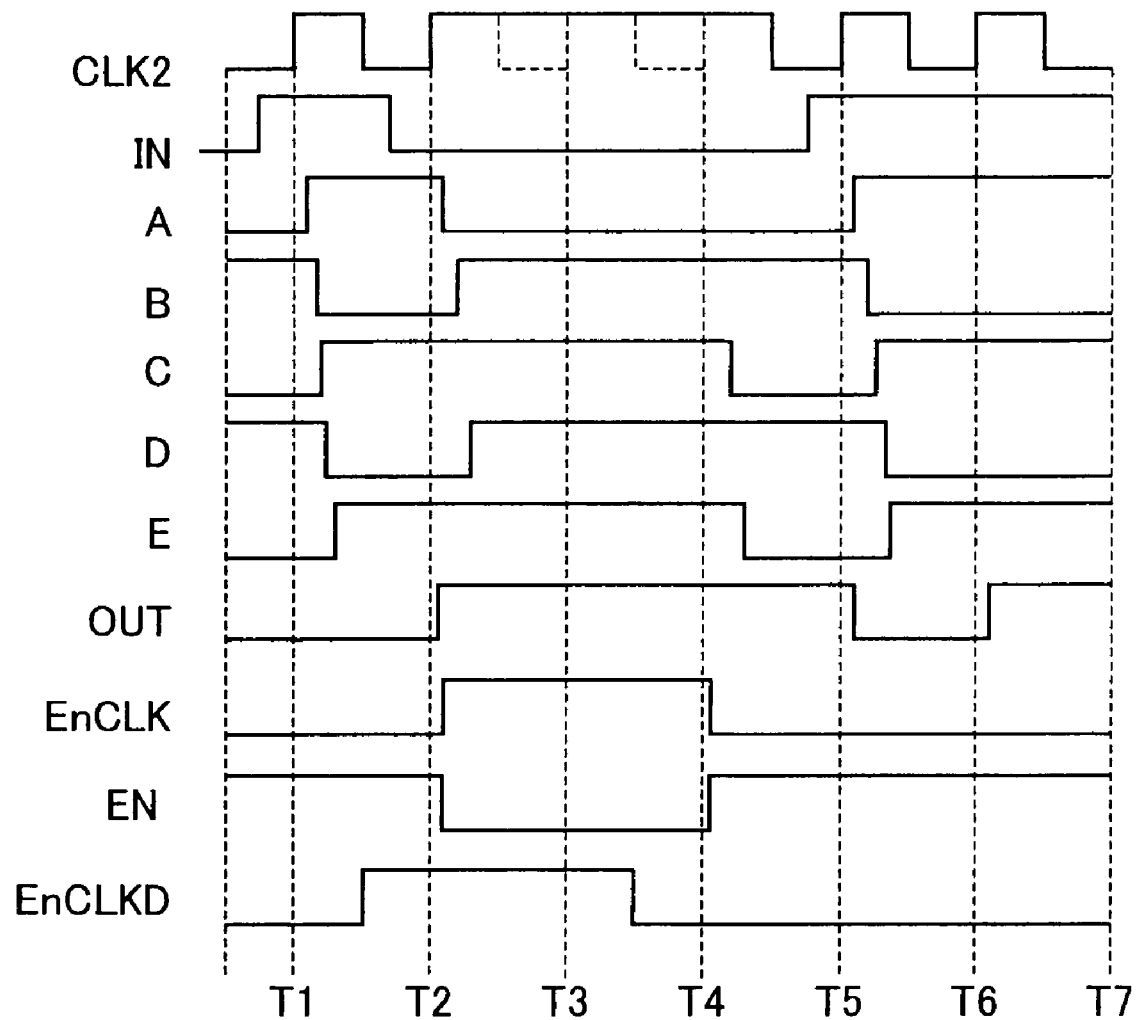
FIG. 6 shows an example of an operation timing chart of the semiconductor integrated circuit device shown in FIG. 5.

FIG. 5 shows an example of a circuit configuration of a semiconductor integrated circuit device according to this embodiment, and FIG. 6 shows an operation timing chart of the semiconductor integrated circuit device in FIG. 5.

As shown in FIG. 5, the semiconductor integrated circuit device according to this embodiment is formed by adding a flip-flop circuit FF20, an OR circuit OR20, and an inverter circuit IN20 to the semiconductor integrated circuit device in the above first embodiment.

A system clock signal SysCLK is inputted to a clock input terminal of the flip-flop circuit FF20, and a clock control data signal EnCLKD is inputted to a data input terminal D thereof. As can be seen from FIG. 6, the flip-flop circuit FF20 outputs the value of the clock control data signal EnCLKD when the system clock signal SysCLK switches from low to high as a clock control signal EnCLK. This flip-flop circuit FF20 makes it possible to change the clock control signal EnCLK only when the system clock signal SysCLK changes from low to high even where the clock control data signal EnCLKD changes in the middle of a clock cycle of the system clock signal SysCLK. The clock control signal EnCLK is a control signal to control whether the clock signal is supplied or stopped.

The clock control signal EnCLK and the system clock signal SysCLK are inputted to the OR circuit OR20, and the OR circuit OR20 outputs the gated clock signal CLK to the flip-flop circuit FF11. Accordingly, this gated clock signal CLK becomes a signal synchronized with the system clock signal SysCLK when the clock control signal EnCLK is low and it is fixed high when the clock control signal EnCLK is high.

The clock control signal EnCLK outputted from the flip-flop circuit FF20 is inverted by the inverter IN20 to become the circuit control signal EN and inputted to the control terminals of the N-type MOS transistors NM10 to NM13 and the P-type MOS transistors PM10 to PM13.

The clock signal CLK1 is inputted to the clock input terminal of the flip-flop circuit FF10, and this clock signal CLK1 may be a clock signal of another system generated from the system clock SysCLK or may be the clock signal CLK2 outputted from the OR circuit OR20. Here, the description will be given assuming that CLK2 is inputted also to the clock signal CLK1.

In an example of the operation timing chart shown in FIG. 6, the clock control data signal EnCLKD changes from low to high in the middle of the first clock cycle between the time T1 and the time T2. Therefore, at the time T2 which is the next rise of the system clock signal SysCLK, the clock control signal EnCLK changes from low to high. Hence, the circuit control signal EN changes from high to low at this time T2. The clock signal CLK2 is maintained high.

On the other hand, when the clock control data signal EnCLKD changes from high to low in the middle of the third clock cycle between the time T3 and the time T4, an operation opposite to the above is performed. The clock signal CLK2 falls between T4 and T5.

The above configuration makes it possible to generate the gated clock signal CLK from the clock control data signal EnCLKD and the system clock signal SysCLK.

Incidentally, if a timing difference exists between the circuit control signal EN and the clock signal CLK2, the flip-flop circuit FF11 may receive erroneous data. In particular, if the circuit control signal EN falls earlier than the rise of the clock signal CLK2 in a shift from the active mode to the sleep mode, the flip-flop circuit FF11 receives the erroneous data. Therefore, in terms of design, it is necessary to give consideration so that the timing difference does not occur between the circuit control signal EN and the clock signal CLK2.

Figure 7:
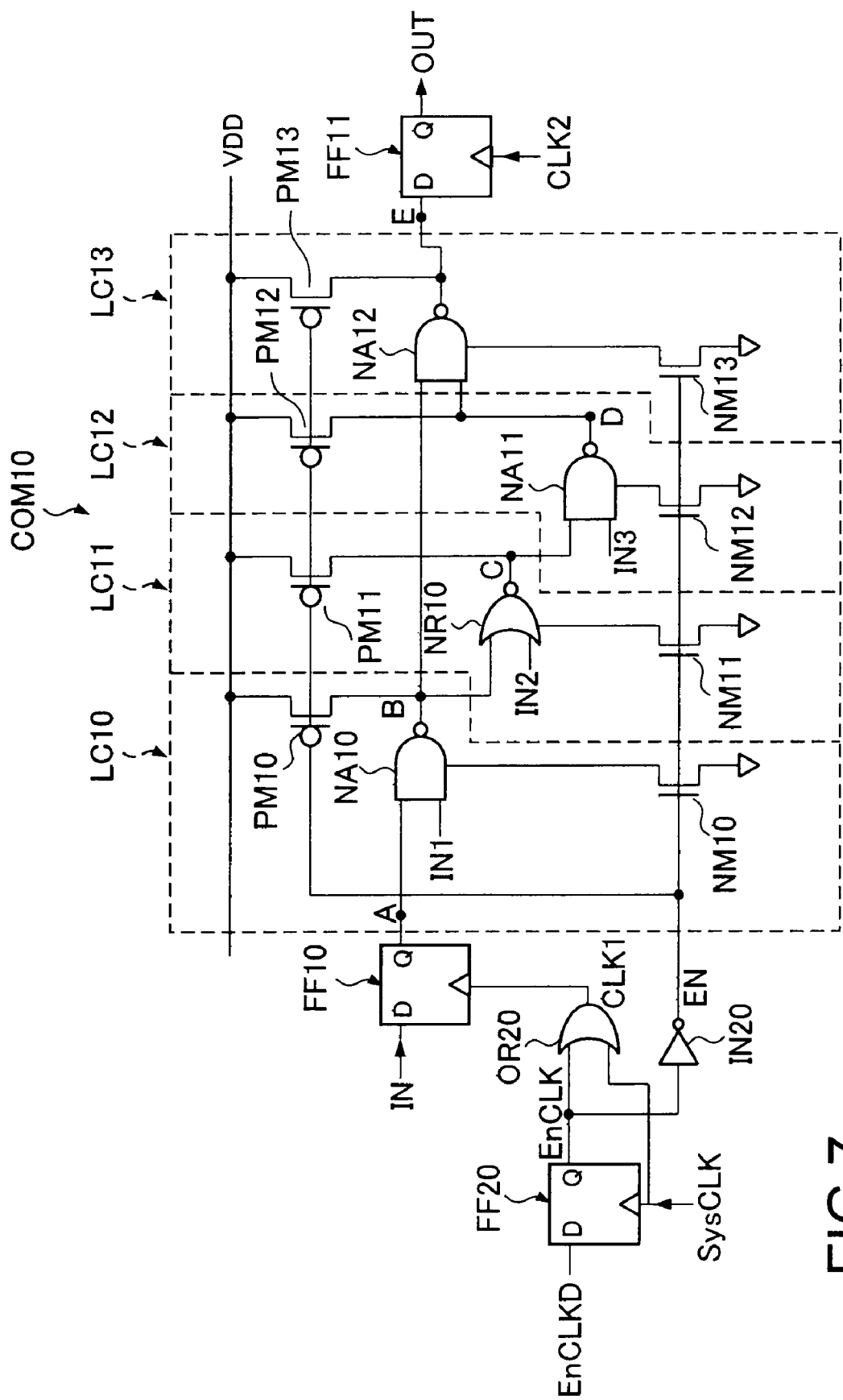
FIG. 7 shows a modified example of the semiconductor integrated circuit device according to the second embodiment.

Moreover, in the semiconductor integrated circuit device according to this embodiment, as shown in FIG. 7, it is possible to input an output of the OR circuit OR20 as the clock signal CLK1 to the flip-flop circuit FF10 and input the clock signal CLK2 of another system to the flip-flop circuit FF11.

Third Embodiment

In a third embodiment, the above second embodiment is modified, and the gated clock signal CLK2 is generated by a flip-flop circuit, a low through latch circuit, and an AND circuit. Portions different from the above second embodiment will be described below.

Figure 8:
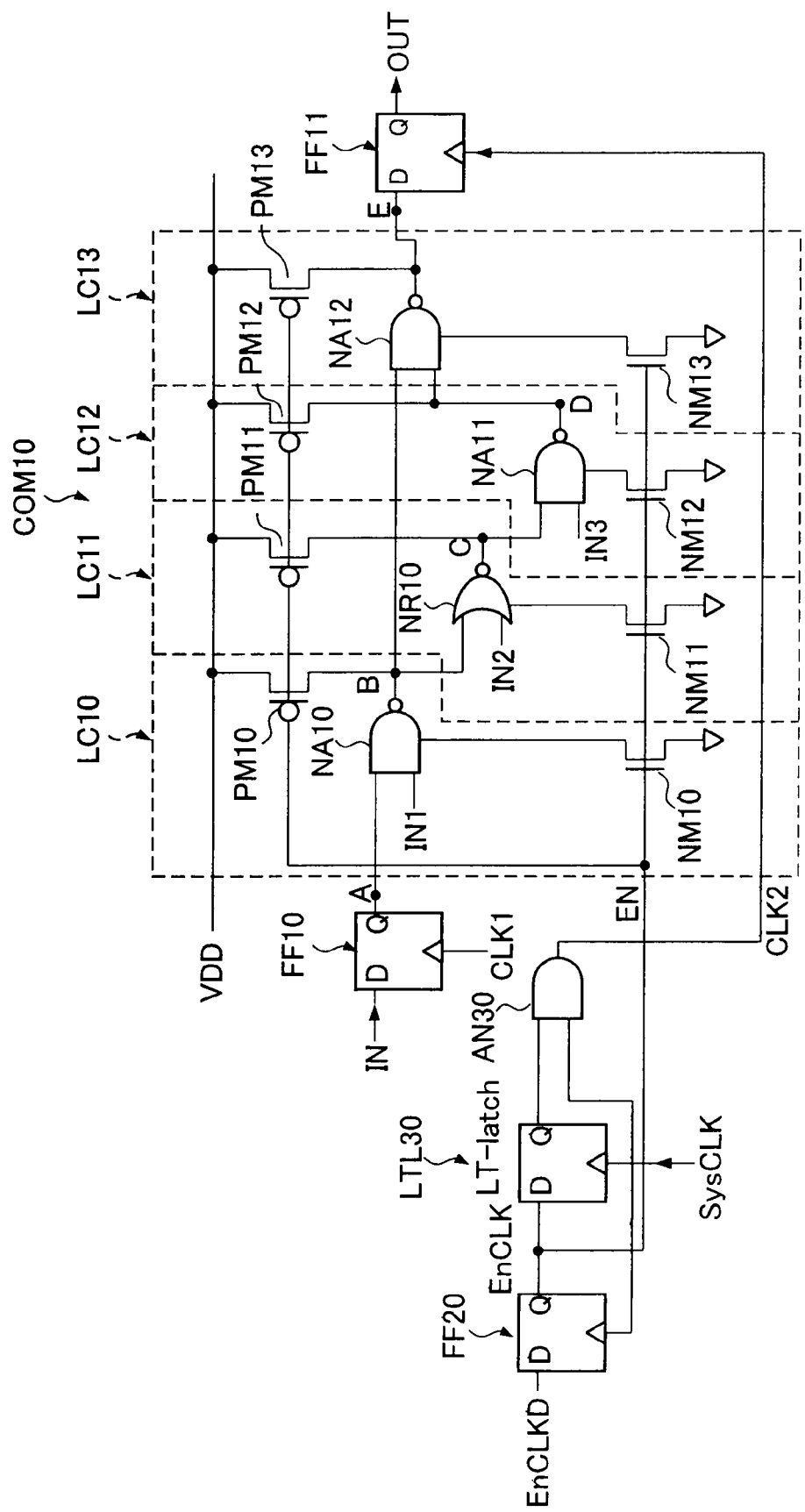
FIG. 8 shows an example of a circuit configuration of a semiconductor integrated circuit device according to a third embodiment.
Figure 9:
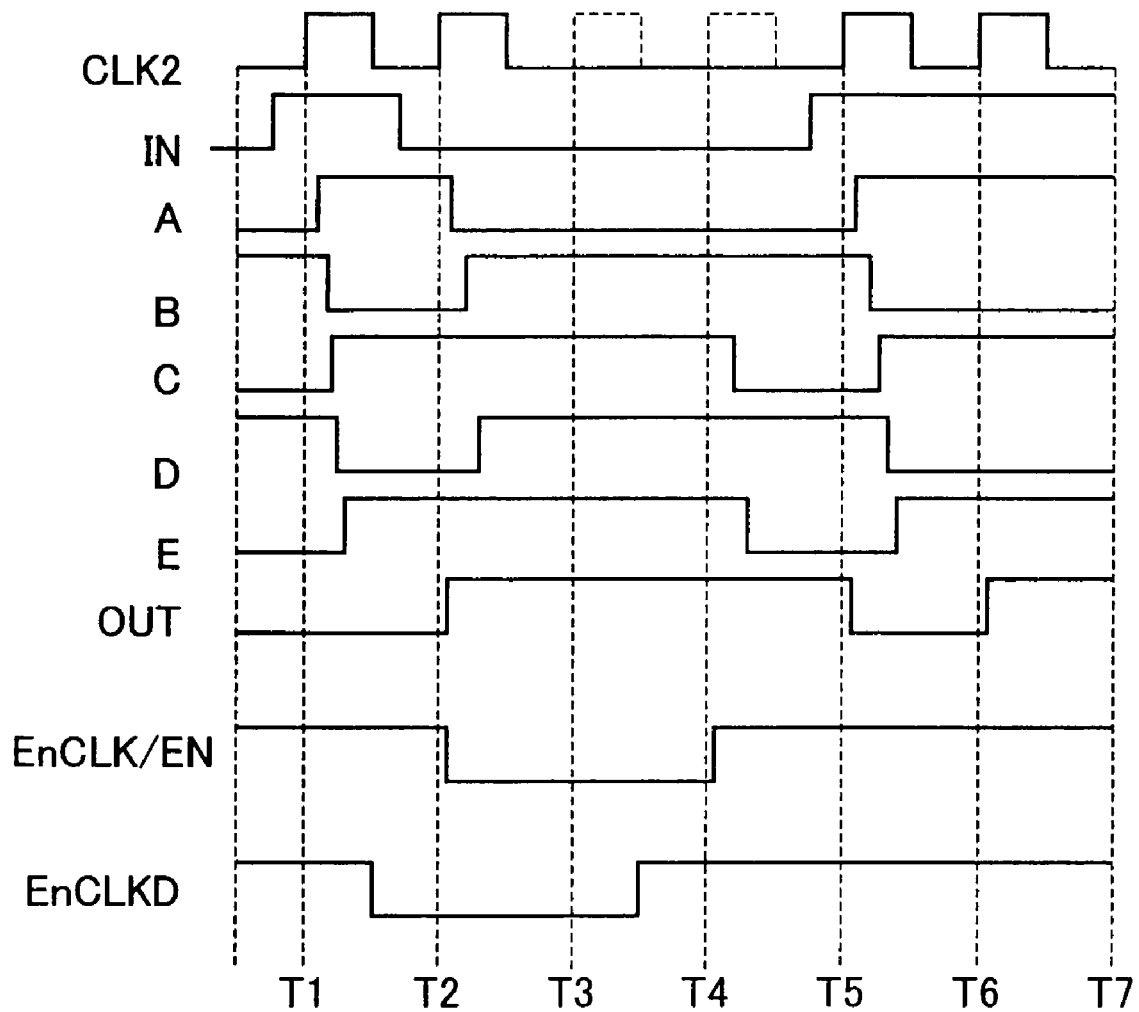
FIG. 9 shows an example of an operation timing chart of the semiconductor integrated circuit device shown in FIG. 8.

FIG. 8 shows an example of a circuit configuration of a semiconductor integrated circuit device according to this embodiment, and FIG. 9 shows an operation timing chart of the semiconductor integrated circuit device in FIG. 8.

As shown in FIG. 8, in the semiconductor integrated circuit device according to this embodiment, a low through latch circuit LTL30 is provided at a stage subsequent to the flip-flop circuit FF20, and an AND circuit AN30 is provided at a stage subsequent to the low through latch circuit LTL30. The low through latch circuit LTL30 is a circuit which outputs an input of a data input terminal D from a data output terminal Q while a signal inputted to a clock input terminal is low and, while the signal inputted to the clock input terminal is high, holds and outputs an immediately preceding state.

The system clock signal SysCLK is inputted to the clock input terminals of the flip-flop circuit FF20 and the low through latch circuit LTL30. The clock control data signal EnCLKD is inputted to the data input terminal D of the flip-flop circuit FF20, and the clock control signal EnCLK outputted from the data output terminal Q of the flip-flop circuit FF20 is inputted to the data input terminal D of the low through latch circuit LTL30. The signal outputted from the data output terminal Q of the low through latch circuit LTL30 is inputted to one input terminal of the AND circuit AN30. The system clock signal SysCLK is inputted to the other input terminal of the AND circuit AN30. Then, the gated clock signal CLK2 is outputted from an output terminal of the AND circuit AN30 and inputted to a clock input terminal of the flip-flop circuit FF11.

Note, however, that in this embodiment, as shown in FIG. 9, the clock control data signal EnCLKD is a signal which switches from high to low in switching from the active mode to the sleep mode and, on the contrary, switches from low to high in switching from the sleep mode to the active mode. Therefore, the clock control signal EnCLK can be used as it is as the circuit control signal EN.

The above configuration makes it possible to generate the gated clock signal CLK2 from the clock control data signal EnCLKD and the system clock signal SysCLK.

Incidentally, if a timing difference exists between the circuit control signal EN and the clock signal CLK2, the flip-flop circuit FF11 may receive erroneous data. In particular, if the circuit control signal EN falls earlier than the rise of the clock signal CLK2 in a shift from the active mode to the sleep mode, the flip-flop circuit FF11 receives the erroneous data. Therefore, in terms of design, it is necessary to give consideration so that the timing difference does not occur between the circuit control signal EN and the clock signal CLK2.

Figure 10:
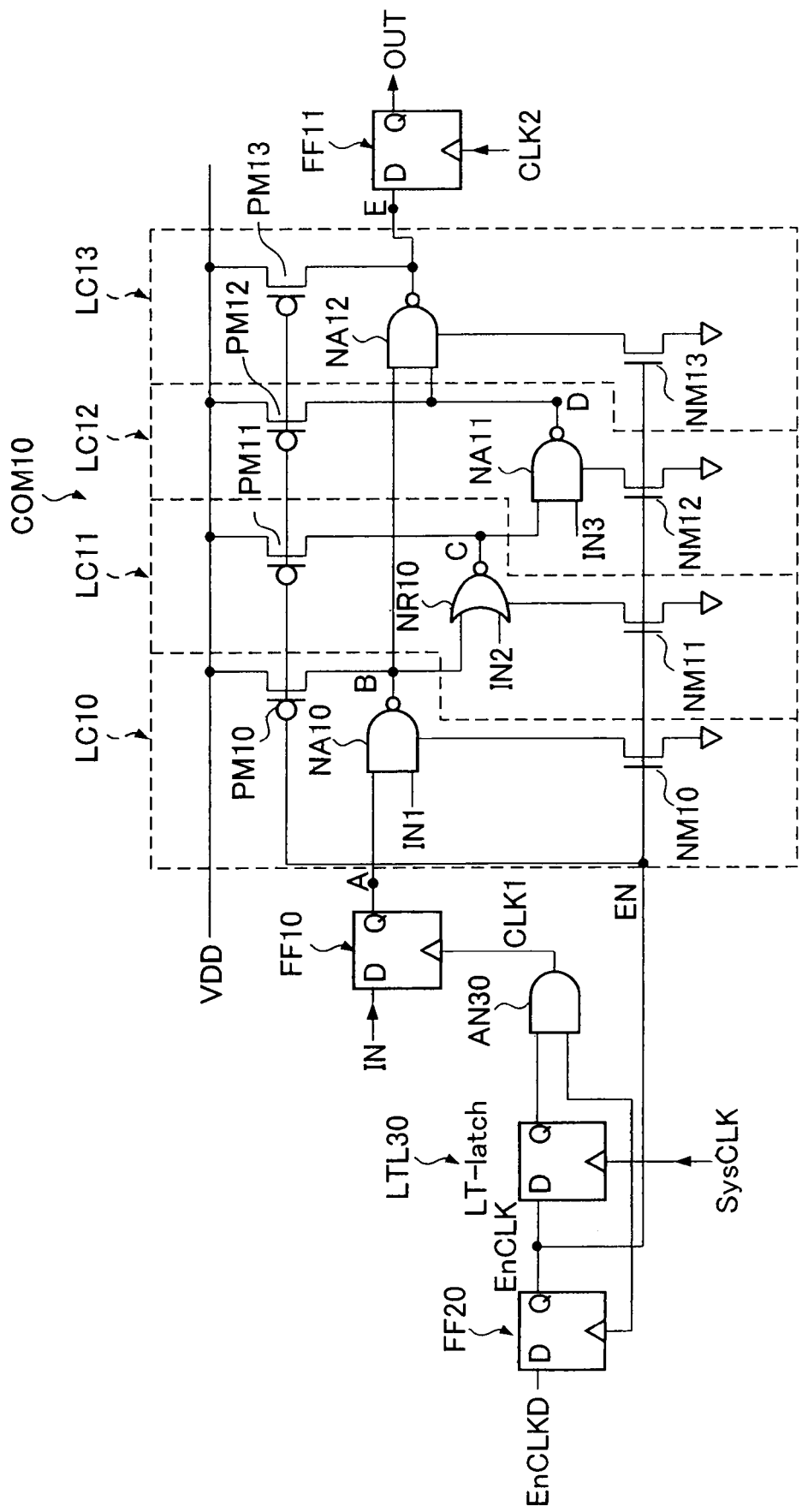
FIG. 10 shows a modified example of the semiconductor integrated circuit device according to the third embodiment.

Moreover, in the semiconductor integrated circuit device according to this embodiment, as shown in FIG. 10, it is possible to input an output of the AND circuit AN30 as the clock signal CLK1 to the flip-flop circuit FF10 and input the clock signal CLK2 of another system to the flip-flop circuit FF11.

Fourth Embodiment

In a fourth embodiment, the above first embodiment is modified, and the logic cell LC13 as part of the logic cells LC10 to LC13 is formed by a normal logic cell instead of the logic cell with the foot switch. More specifically, even when the circuit control signal EN is low, with respect to part of logic cells in which the logic level of the output signal outputted from the previous stage as the input signal is not high-impedance state, the standard cell is provided, but the foot-switch MOS transistor and the pull-up MOS transistor are not provided. Portions different from the above first embodiment will be described below.

Figure 11:
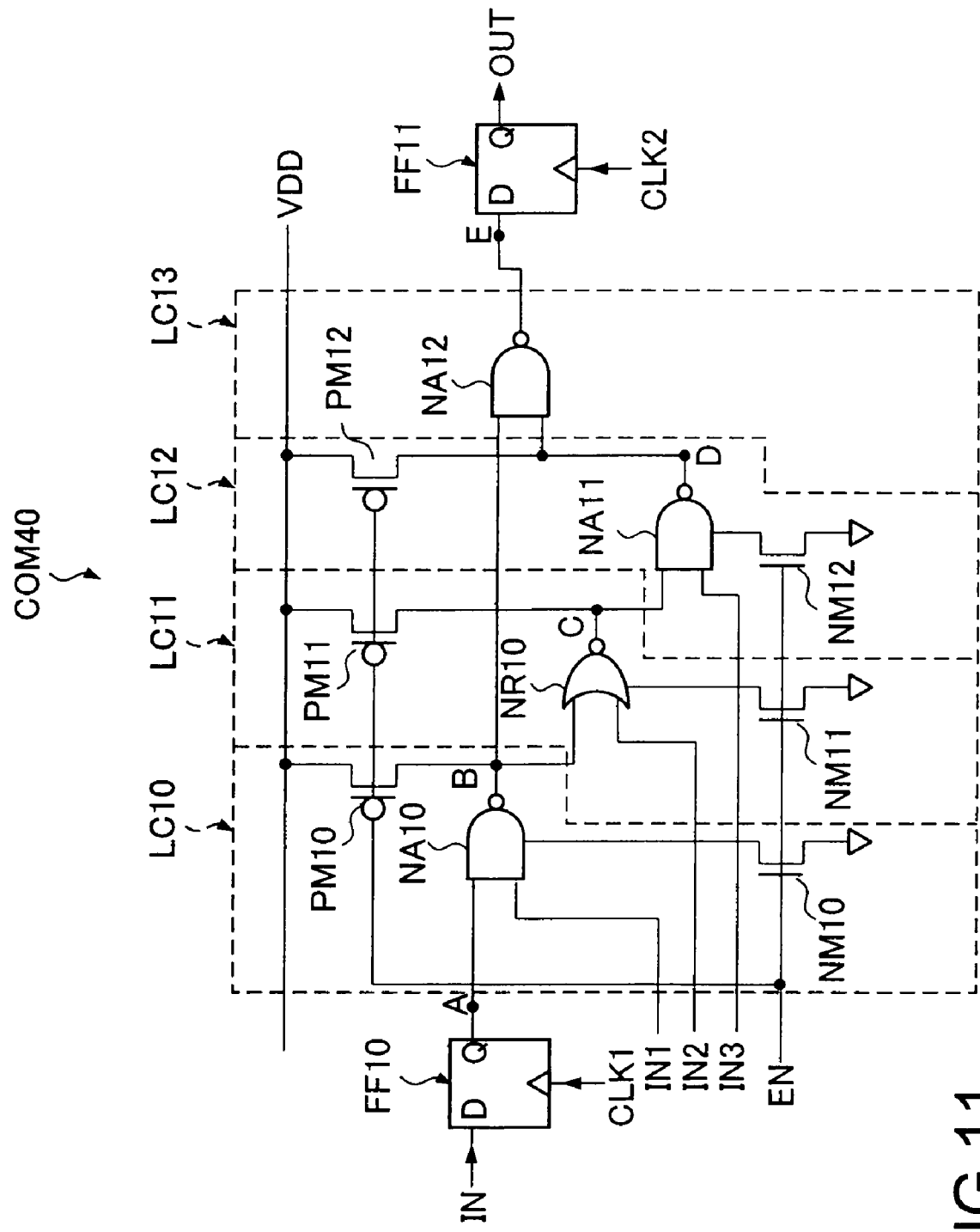
FIG. 11 shows an example of a circuit configuration of a semiconductor integrated circuit device according to a fourth embodiment.
Figure 12:
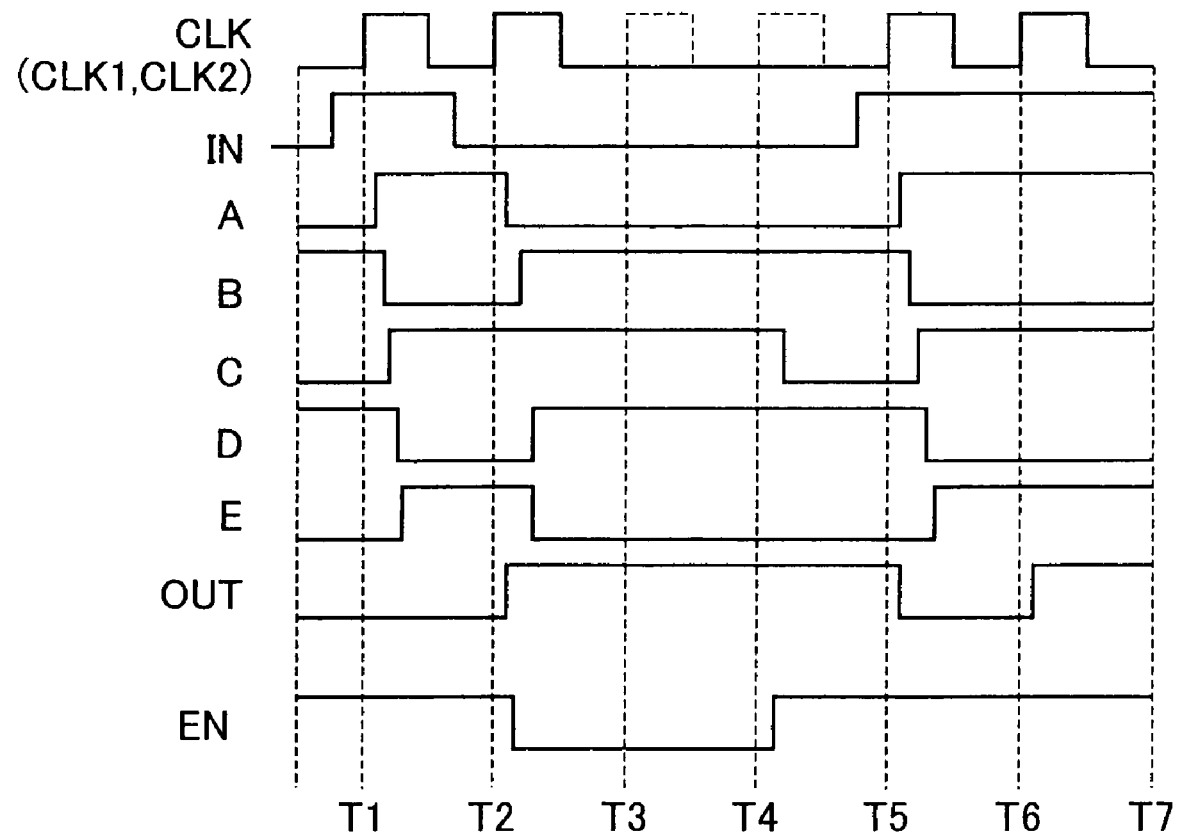
FIG. 12 shows an example of an operation timing chart of the semiconductor integrated circuit device shown in FIG. 11.

FIG. 11 shows an example of a circuit configuration of a semiconductor integrated circuit device according to this embodiment, and FIG. 12 shows an operation timing chart of the semiconductor integrated circuit device in FIG. 11.

As shown in FIG. 11, in a combinational logic circuit COM40 of the semiconductor integrated circuit device according to this embodiment, in the logic cell LC13, the NAND circuit NA12 is provided, but the P-type MOS transistor PM13 and the N-type MOS transistor NM13 are not provided. Therefore, in this embodiment, the logic cell LC13 includes the NAND circuit NA12 as the standard cell.

An output signal of the NAND circuit NA10 and an output signal of the NAND circuit NA11 are inputted to the NAND circuit NA12. Note, however, that in the sleep mode, as shown in FIG. 12, the first reference signal VDD is supplied to one input terminal of the NAND circuit NA12 via the P-type MOS transistor PM10 (node B), and the first reference signal VDD is also supplied to the other input terminal thereof via the P-type MOS transistor PM12 (node D). Hence the input signals of the NAND circuit NA12 are fixed high, which does not cause a state where a large leakage current flows. Viewed in this light, it can be seen that the foot switch of NAND circuit NA12 can be omitted. By omitting the N-type MOS transistor NM13 as the foot switch, the P-type MOS transistor PM13 can also be omitted, which results in a reduction in the number of transistors. If the timing constraint is satisfied, the leakage current of the NAND circuit NA12 can be reduced by forming the NAND circuit NA12 by high threshold transistors.

Incidentally, in the example in FIG. 11, the logic cell from which the foot switch is omitted is the last-stage logic cell, but the logic cell from which the foot switch can be omitted is not limited to the last-stage one, and may be located anywhere as far as the logic cell is formed by the standard cell whose input is fixed in the sleep mode.

Meanwhile, the method of generating the clock signals CLK1 and CLK2 and the circuit control signal EN may be either of the methods in the above second embodiment and third embodiment.

Fifth Embodiment

In a fifth embodiment, the above first embodiment is modified, and with respect to part of the logic cells LC10 to LC13, the output signal is not pulled up in the sleep mode. More specifically, with respect to the logic cell whose output signal is inputted to only the logic cell with the foot switch, the standard cell and the foot switch are provided, but the pull-up MOS transistor is not provided. Portions different from the above first embodiment will be described below.

Figure 13:
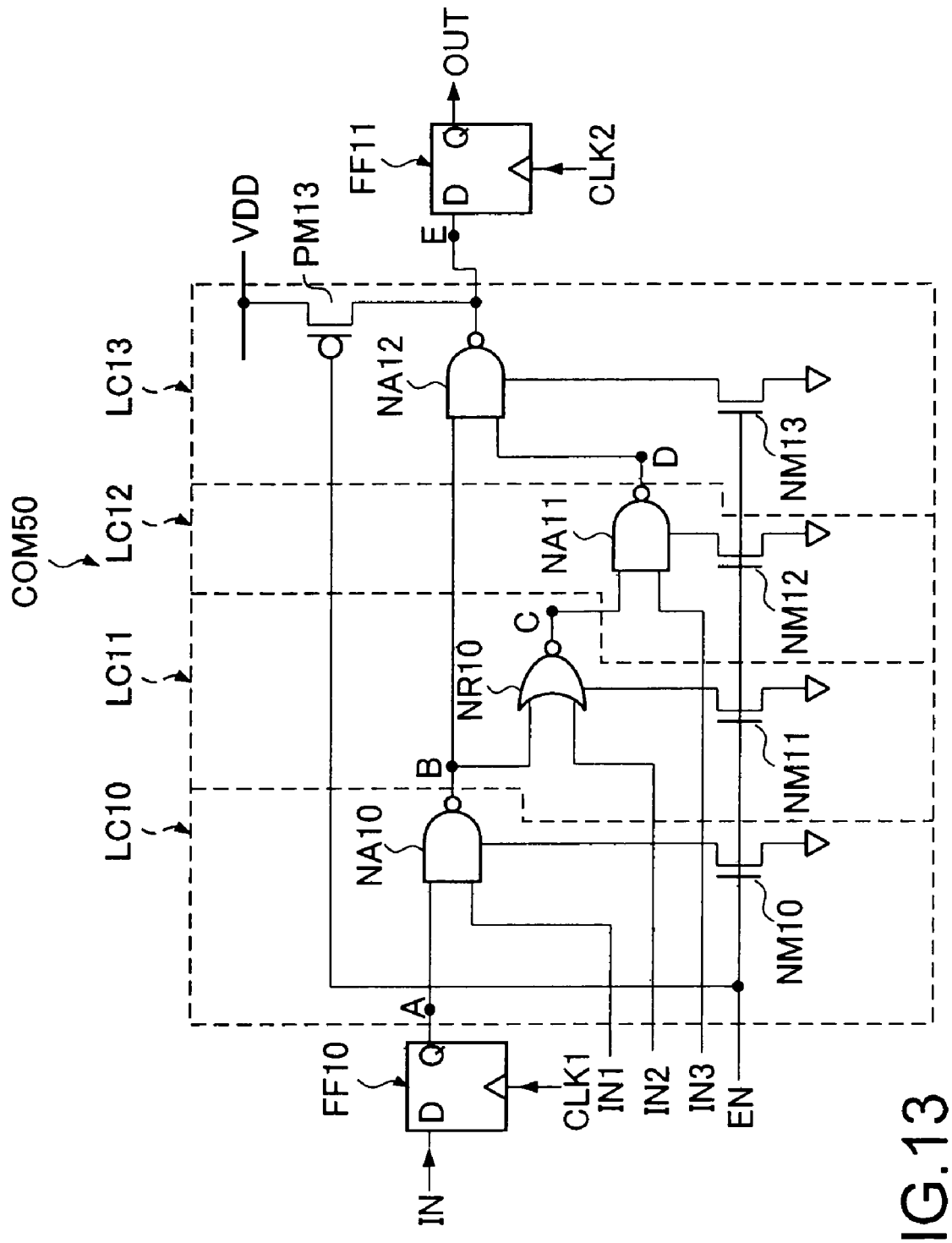
FIG. 13 shows an example of a circuit configuration of a semiconductor integrated circuit device according to a fifth embodiment.
Figure 14:
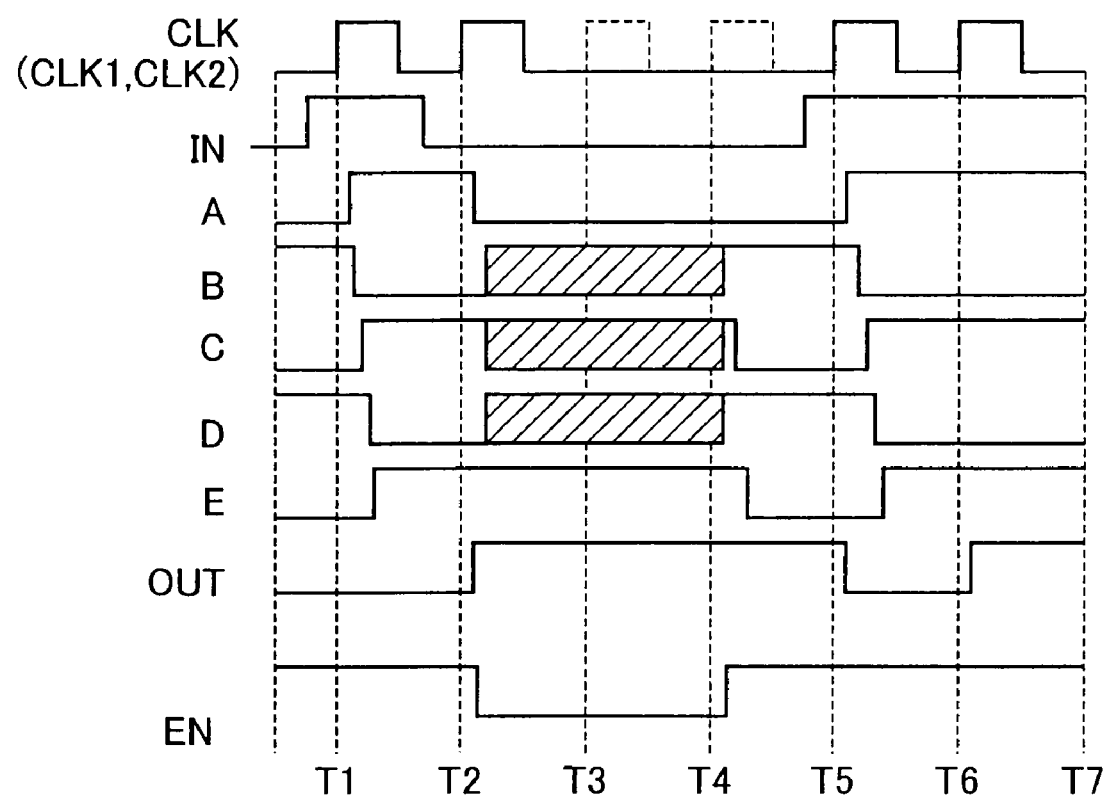
FIG. 14 shows an example of an operation timing chart of the semiconductor integrated circuit device shown in FIG. 13.

FIG. 13 shows an example of a circuit configuration of a semiconductor integrated circuit device according to this embodiment, and FIG. 14 shows an operation timing chart of the semiconductor integrated circuit device in FIG. 13.

As shown in FIG. 13, in a combinational logic circuit COM50 of the semiconductor integrated circuit device according to this embodiment, the N-type MOS transistors NM10 to NM13 as the foot switches are provided in all the logic cells LC10 to LC13, respectively. Namely, the foot switch is provided for each of the standard cells. Therefore, even if inputs to the NAND circuits NA10 to NA12 and the NOR circuit NR10 as the standard cells become inconstant in the sleep mode, a large leakage current does not flow from these standard cells.

On the other hand, only the P-type MOS transistor PM13 is provided as the pull-up transistor, and the MOS transistors PM10 to PM12 are not provided. Hence, in the sleep mode between the time T2 and the time T4, as shown in FIG. 14, the output signal of the NAND circuit NA12 is pulled up high (node E), but the output signals of the NAND circuits NA10 and NA11 and the NOR circuit NR10 as the standard cells become high-impedance (node B, node C, node D).

However, only the output of the NAND circuit NA12 is inputted to the data input terminal D of the subsequent-stage flip-flop circuit FF11, whereby if the output of the NAND circuit NA12 can be pulled up high, the high-impedance state inside the combinational logic circuit COM50 does not influence the flip-flop circuit FF11.

This configuration also can reduce the number of MOS transistors in the combinational logic circuit COM50.

Meanwhile, the method of generating the clock signals CLK1 and CLK2 and the circuit control signal EN may be either of the methods in the above second embodiment and third embodiment.

Sixth Embodiment

In a sixth embodiment, the above fourth embodiment is modified, and with respect to the logic cell whose output signal is inputted to only the logic cell with the foot switch, the output signal is not pulled up in the sleep mode. Portions different from the above fourth embodiment will be described below.

Figure 15:
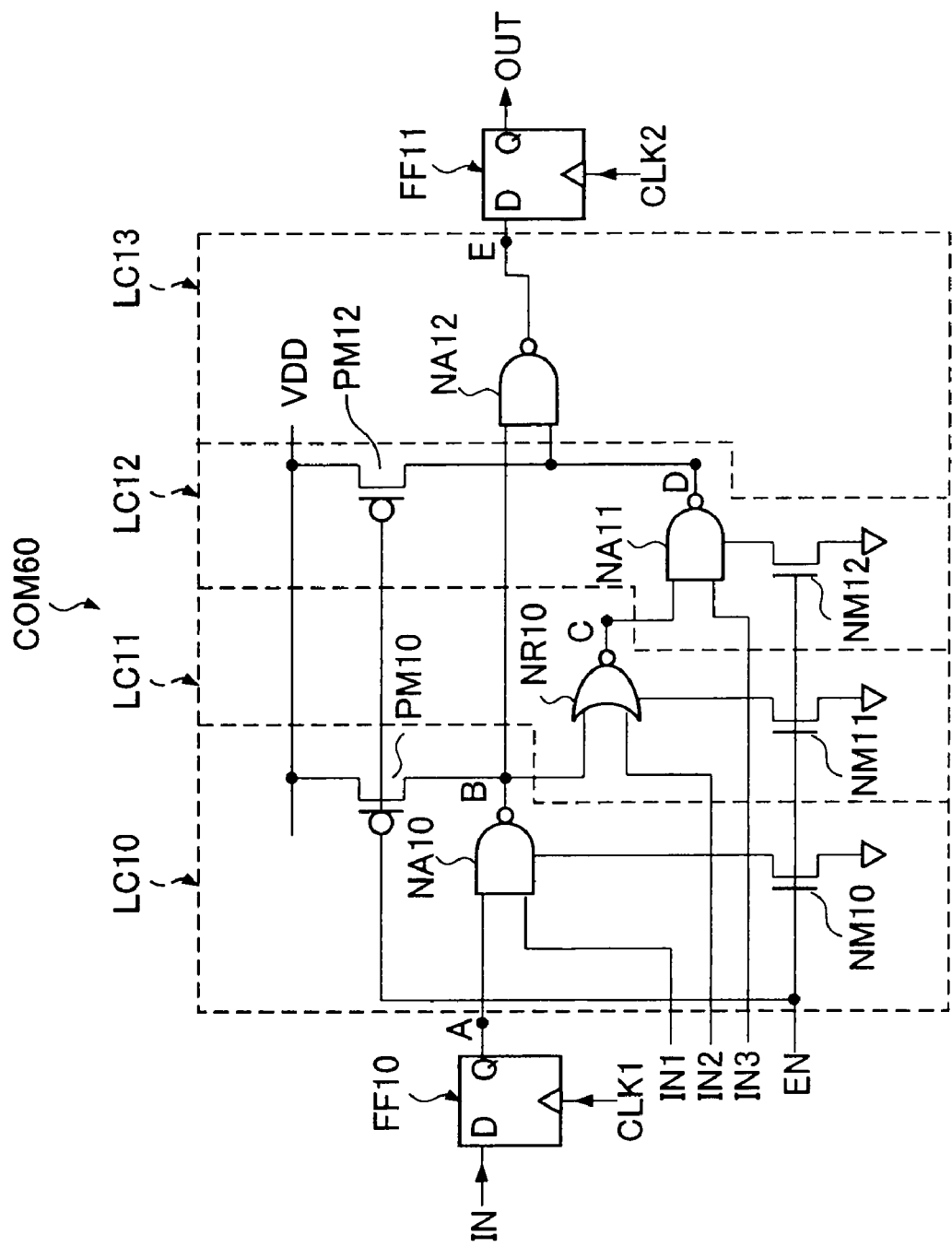
FIG. 15 shows an example of a circuit configuration of a semiconductor integrated circuit device according to a sixth embodiment.
Figure 16:
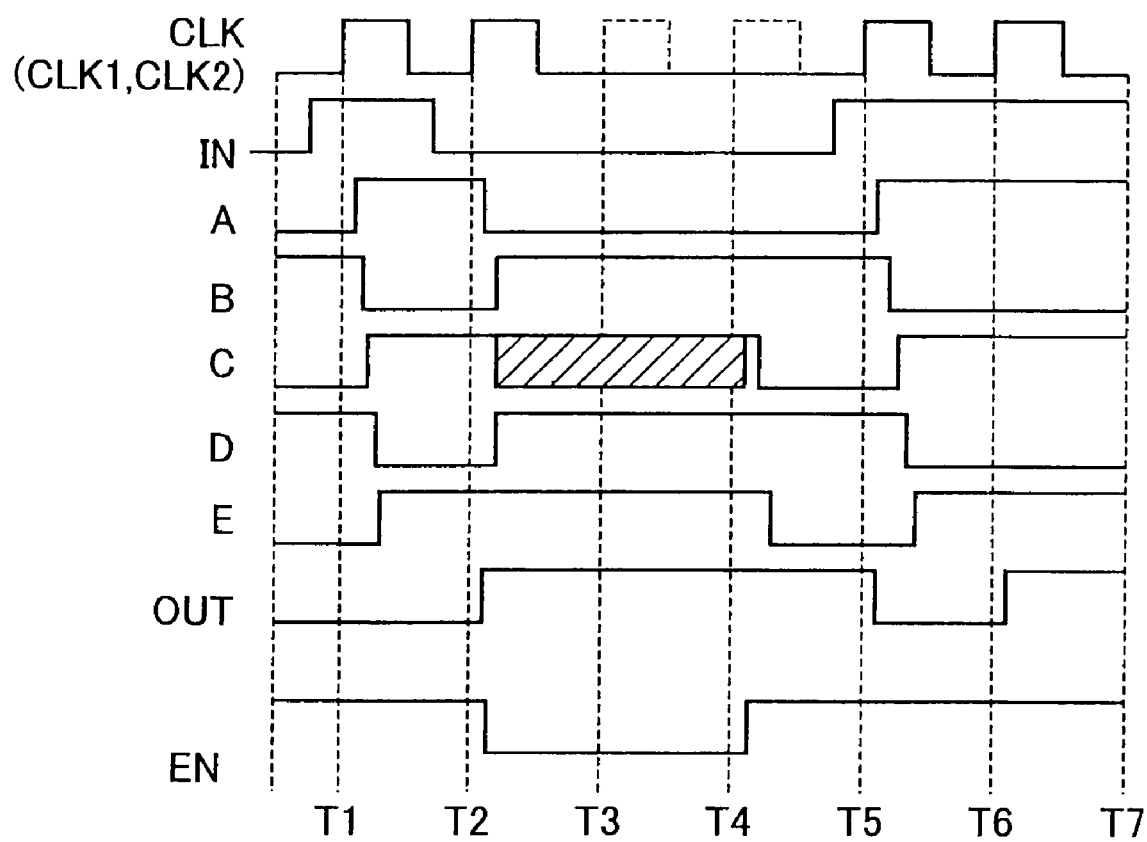
FIG. 16 shows an example of an operation timing chart of the semiconductor integrated circuit device shown in FIG. 15.

FIG. 15 shows an example of a circuit configuration of a semiconductor integrated circuit device according to this embodiment, and FIG. 16 shows an operation timing chart of the semiconductor integrated circuit device in FIG. 15.

As shown in FIG. 15, in a combinational logic circuit COM60 of the semiconductor integrated circuit device according to this embodiment, compared with the combinational logic circuit COM40 according to the above fourth embodiment, the pull-up MOS transistor PM11 in the logic cell LC11 is omitted. The output signal of this logic cell LC11 becomes high-impedance state in the sleep mode (node C in FIG. 16) but it is inputted only to the NAND circuit NA11. Since the NAND circuit NA11 is provided with the MOS transistor NM11 as the foot switch, the leakage current from the NAND circuit NA11 is cut off. Further, the output signal of the NOR circuit NR10 is not outputted to the outside. Accordingly, even if the output signal of the NOR circuit NR10 is high-impedance state, no problem arises.

This configuration also can reduce the number of MOS transistors in the combinational logic circuit COM60.

Meanwhile, the method of generating the clock signals CLK1 and CLK2 and the circuit control signal EN may be either of the methods in the above second embodiment and third embodiment.

Seventh Embodiment

In a seventh embodiment, the above first embodiment is modified, and a semiconductor integrated circuit device includes a scan test mode. Portions different from the above first embodiment will be described below.

Figure 17:
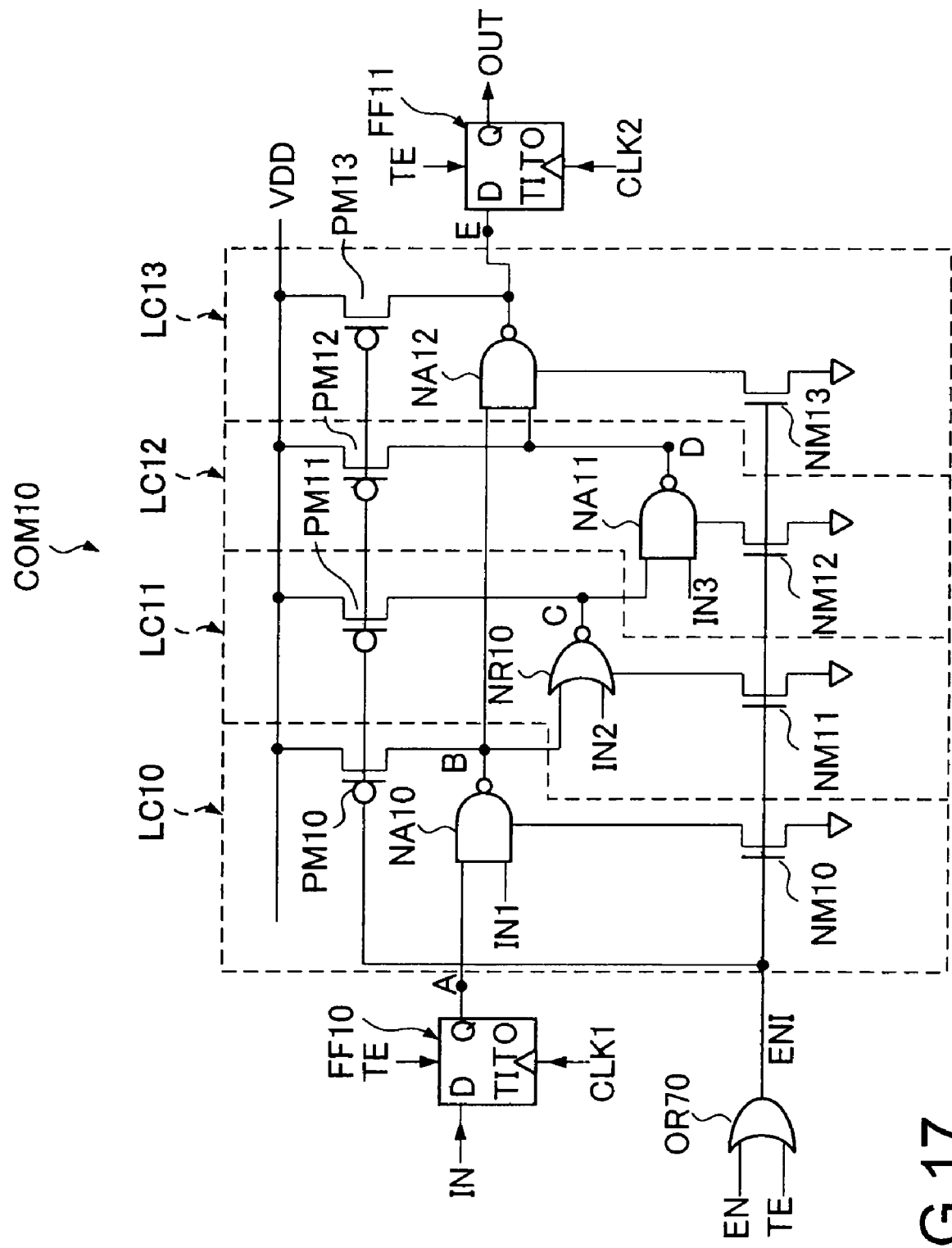
FIG. 17 shows an example of a circuit configuration of a semiconductor integrated circuit device according to a seventh embodiment.

FIG. 17 shows an example of a circuit configuration of the semiconductor integrated circuit device according to this embodiment. As shown in FIG. 17, an OR circuit OR70 is provided in a circuit of the semiconductor integrated circuit device according to this embodiment, and the circuit control signal EN and a test enable signal TE are inputted to the OR circuit OR70. A circuit control internal signal ENI outputted from the OR circuit OR70 is inputted to the control terminals of the MOS transistors NM10 to NM13 and the MOS transistors PM10 to PM13.

Therefore, in the scan test mode, by driving the test enable signal TE high, the MOS transistors NM10 to NM113 as the foot switches can be turned on and the MOS transistors PM10 to PM13 can be turned off. Namely, by driving the test enable signal TE high, the MOS transistors NM10 to NM13 can be turned on and the MOS transistors PM10 to PM13 can be turned off, regardless of the value of the circuit control signal EN.

This configuration makes it possible to test the logic cells LC10 to LC13 as logic cells formed by normal standard cells in the scan test mode.

Eighth Embodiment

In an eighth embodiment, the above first embodiment is modified, and a high through latch circuit is additionally inserted between the combinational logic circuit COM10 and the flip-flop circuit FF11. Portions different from the above first embodiment will be described below.

Figure 18:
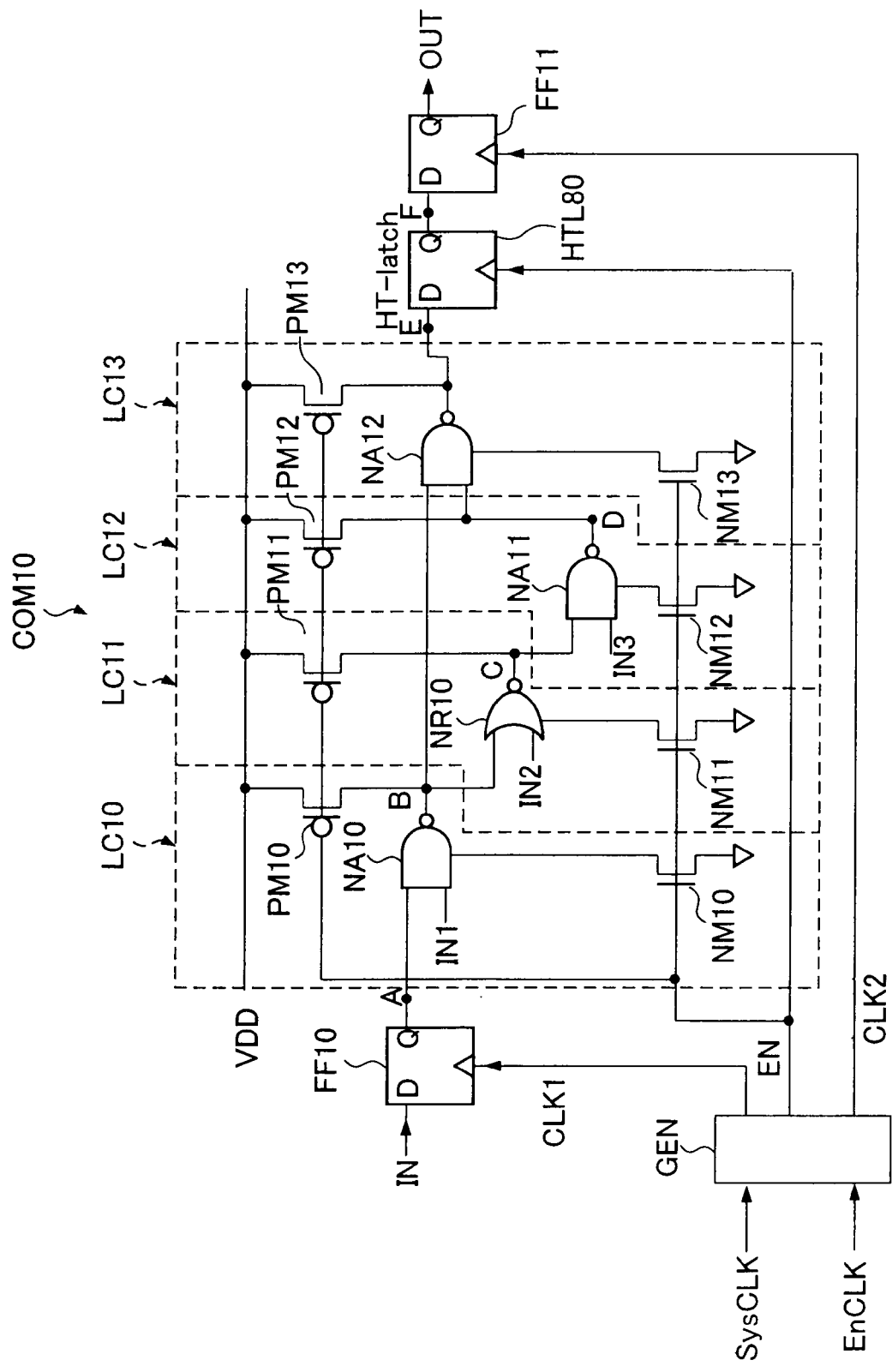
FIG. 18 shows an example of a circuit configuration of a semiconductor integrated circuit device according to an eighth embodiment.
Figure 19:
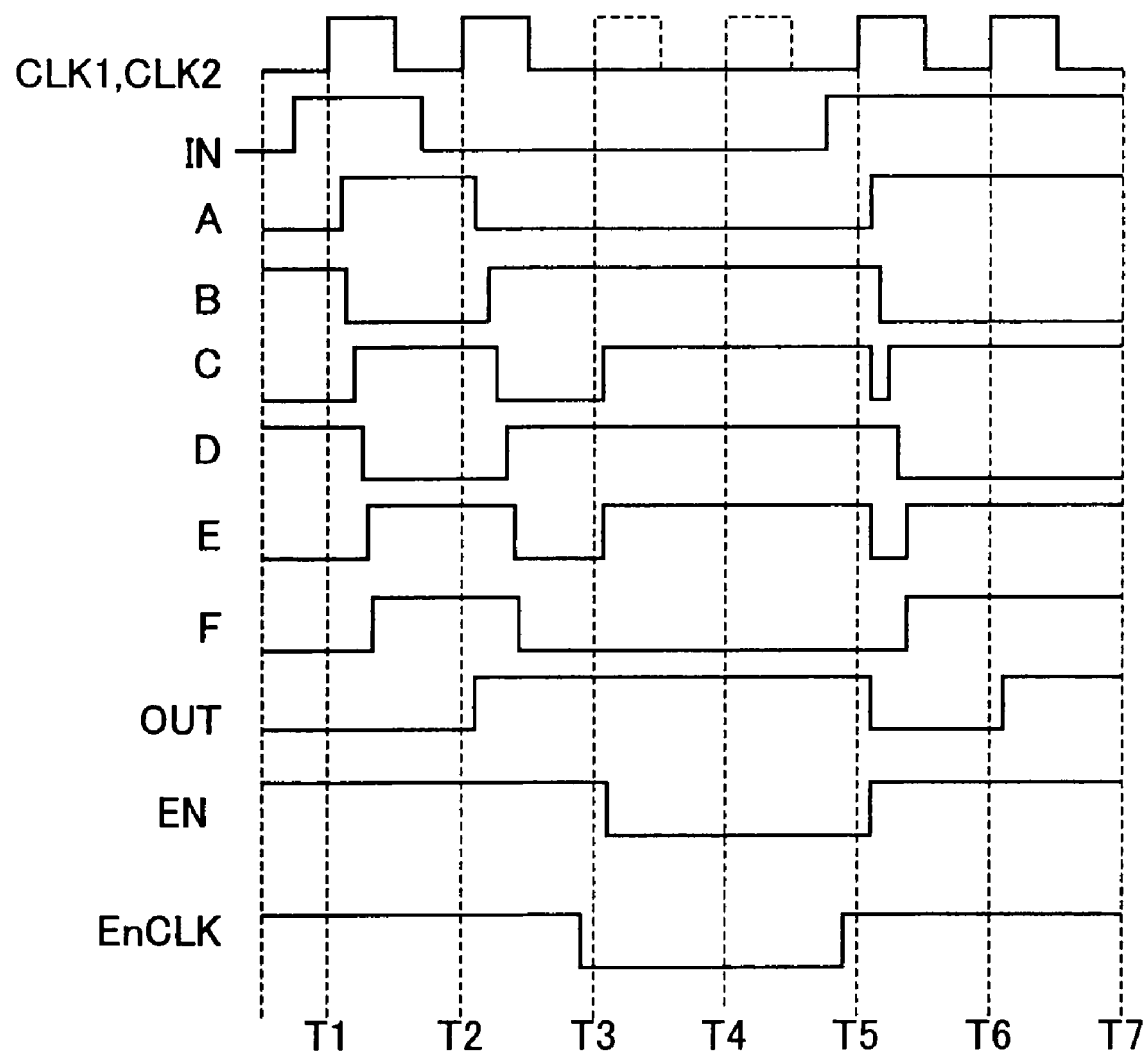
FIG. 19 shows an example of an operation timing chart of the semiconductor integrated circuit device shown in FIG. 18.

FIG. 18 shows an example of a circuit configuration of a semiconductor integrated circuit device according to this embodiment, and FIG. 19 shows an operation timing chart of the semiconductor integrated circuit device in FIG. 18.

As shown in FIG. 18, a control signal generating circuit GEN is provided in a circuit of the semiconductor integrated circuit device according to this embodiment. The system clock signal SysCLK and the clock control signal EnCLK are inputted to the control signal generating circuit GEN. The control signal generating circuit GEN generates the clock signals CLK1 and CLK2 and the circuit control signal EN based on the inputted system clock signal SysCLK and clock control signal EnCLK and outputs them. As can be seen from the above, after a transition of the clock control signal EnCLK occurs, a transition of the circuit control signal EN occurs.

Further, as shown in FIG. 18, in the circuit of the semiconductor integrated circuit device according to this embodiment, a high through latch circuit HTL80 is additionally inserted between the combinational logic circuit COM10 and the flip-flop circuit FF11. This high through latch circuit HTL80 outputs the data signal inputted from a data input terminal D as it is from a data output terminal Q while the input signal to a clock input terminal is high and, while the input signal to the clock input terminal is low, it holds an immediately preceding state and outputs it from the data output terminal Q.

Accordingly, as shown in FIG. 19, the data signal inputted to the data input terminal of the high through latch circuit HTL80 is outputted from the data output terminal while the circuit control signal EN is high, but it is not outputted while the circuit control signal EN is low and the immediately preceding state is held (node E and node F). By inserting such a high through latch circuit HTL80, in a clock cycle next to a clock cycle when the clock control signal EnCLK switches from high to low for a shift from the active mode to the sleep mode, the circuit control signal EN can be switched from high to low. Moreover, in a clock cycle next to a clock cycle when the clock control signal EnCLK switches from low to high for a shift from the sleep mode to the active mode, the circuit control signal EN can be switched from low to high.

This is because since the high through latch circuit HTL80 holds the immediately preceding state and outputs it from the data output terminal Q while the circuit control signal EN is low, so that even if the circuit control signal EN switches at any timing, it does not influence the flip-flop circuit FF11. Therefore, switching between the active mode and the sleep mode can be rapidly performed.

Further, in this embodiment, the timing when the clock control signal EnCLK can be switched is unconstrained in one clock cycle, so that even where the clock control signal EnCLK switches immediately before the end of one clock cycle, active/standby switching becomes possible during the next clock cycle. In other words, although the circuit control signal EN transits after a transition of the clock control signal EnCLK occurs, the circuit control signal EN can be transited in the next clock cycle even if the clock control signal EnCLK transits at any timing.

Furthermore, although the EN signal is inputted to the high through latch in this embodiment, an inverted signal of the EN signal may be inputted to a low through latch.

Ninth Embodiment

In a ninth embodiment, the above second embodiment is applied to the above eighth embodiment, and the gated clock signal CLK2 is generated by an OR circuit. Portions different from the above second embodiment and eighth embodiment will be described below.

Figure 20:
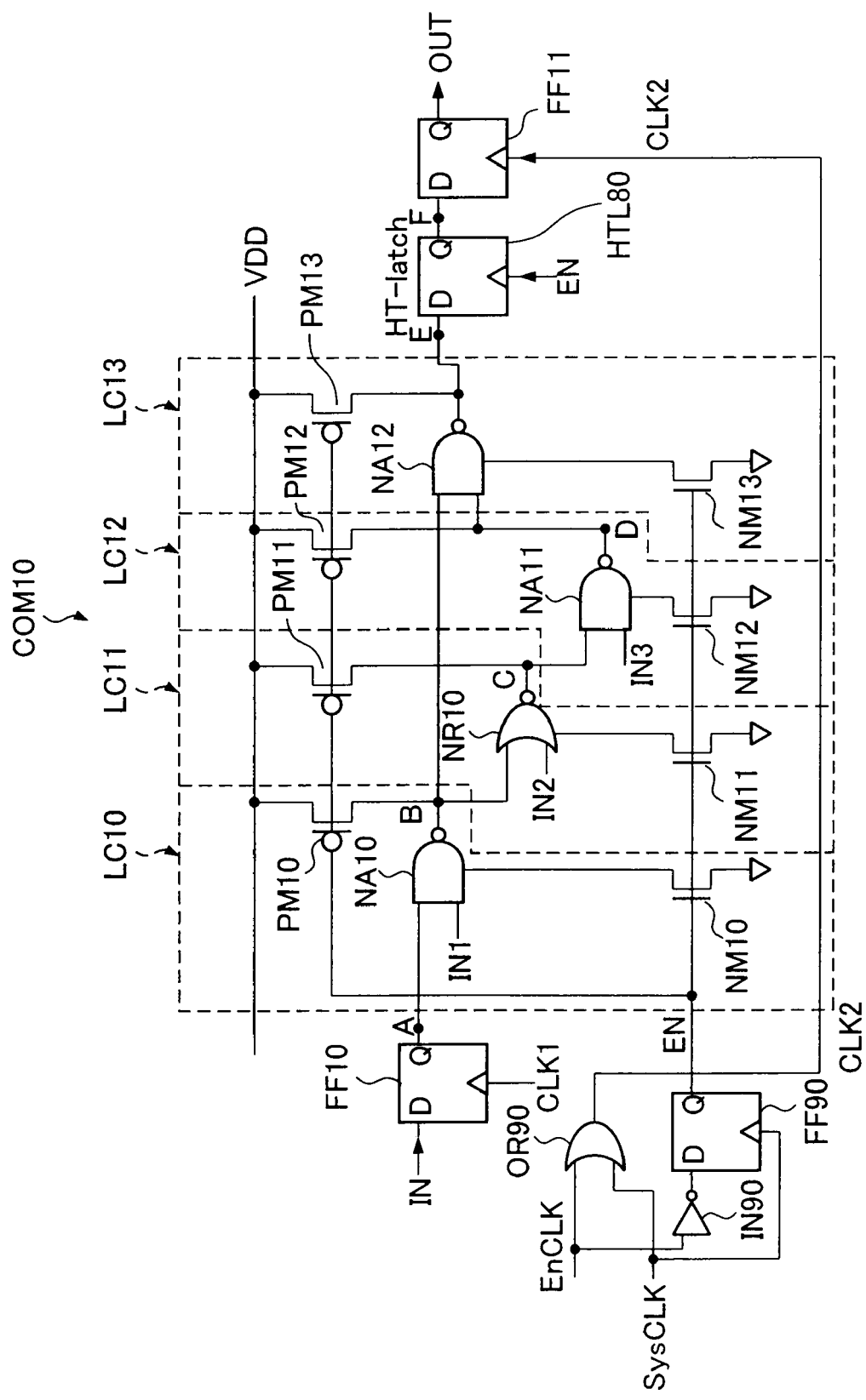
FIG. 20 shows an example of a circuit configuration of a semiconductor integrated circuit device according to a ninth embodiment.
Figure 21:
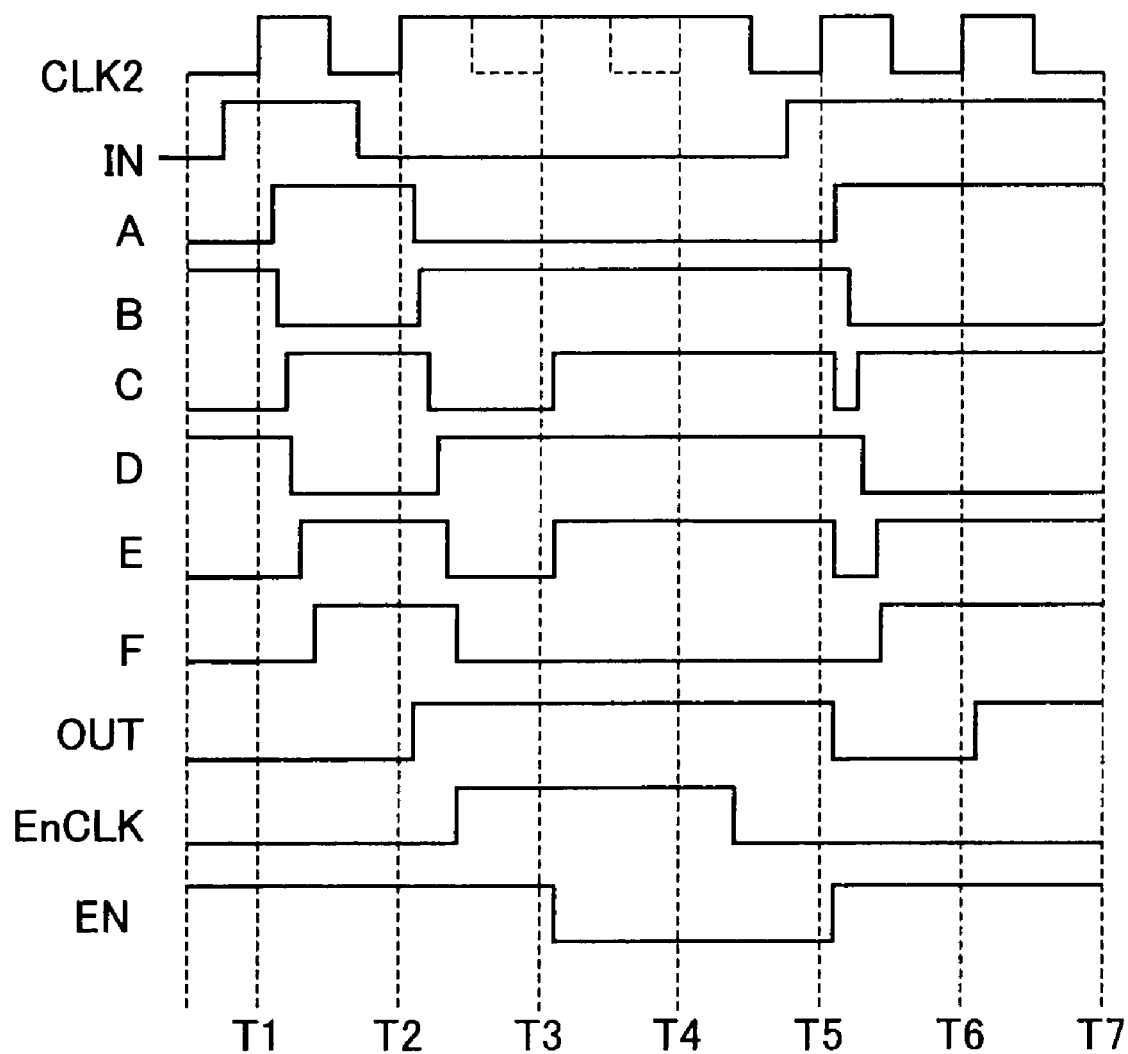
FIG. 21 shows an example of an operation timing chart of the semiconductor integrated circuit device shown in FIG. 20.

FIG. 20 shows an example of a circuit configuration of a semiconductor integrated circuit device according to this embodiment, and FIG. 21 shows an operation timing chart of the semiconductor integrated circuit device in FIG. 20.

As shown in FIG. 20, a circuit of the semiconductor integrated circuit device according to this embodiment is formed by adding an OR circuit OR90, a flip-flop circuit FF90, and an inverter IN90 to the semiconductor integrated circuit device of the above eighth embodiment. The clock control signal EnCLK and the system clock signal SysCLK are inputted to the OR circuit OR90. An output signal of the OR circuit OR90 is inputted as the gated clock signal CLK2 to the flip-flop circuit FF11.

The clock control signal EnCLK is inputted to a data input terminal D of the flip-flop circuit FF90 via the inverter IN90. The system clock signal SysCLK is inputted to a clock input terminal of the flip-flop circuit FF90. Accordingly, as shown in FIG. 21, the circuit control signal EN synchronized with the system clock signal SysCLK and obtained by inverting the clock control signal EnCLK is outputted from a data output terminal Q of the flip-flop circuit FF90. This circuit control signal EN is inputted to the control terminals of the P-type MOS transistors PM10 to PM13, the control terminals of the N-type MOS transistors NM10 to NM13, and the high through latch circuit HTL80.

The clock signal CLK1 is inputted to the flip-flop circuit FF10, and this clock signal CLK1 may be a clock signal of another system generated from the system clock SysCLK or may be the clock signal CLK2 outputted from the OR circuit OR90.

The above configuration makes it possible to generate the gated clock signal CLK2 from the clock control signal EnCLK and the system clock signal SysCLK.

Incidentally, in this embodiment, it is necessary to guarantee that the clock control signal EnCLK changes while the system clock signal SysCLK is high. This is because if the clock control signal EnCLK changes from low to high while the system clock signal SysCLK is low, the clock signal CLK2 changes from low to high at this point in time.

Moreover, if a timing difference exists between the circuit control signal EN inputted to the logic cells LC10 to LC13 and the circuit control signal EN inputted to the high through latch circuit HTL80, the high through latch circuit HTL80 may receive erroneous data. In particular, if the circuit control signal EN inputted to the logic cells LC10 to LC13 falls earlier than the circuit control signal EN inputted to the high through latch circuit HTL80 in a shift from the active mode to the sleep mode, the high through latch circuit HTL80 receives the erroneous data. Therefore, in terms of design, it is necessary to give consideration so that the timing difference does not occur between the circuit control signal EN inputted to the logic cells LC10 to LC13 and the circuit control signal EN inputted to the high through latch circuit HTL80.

Figure 22:
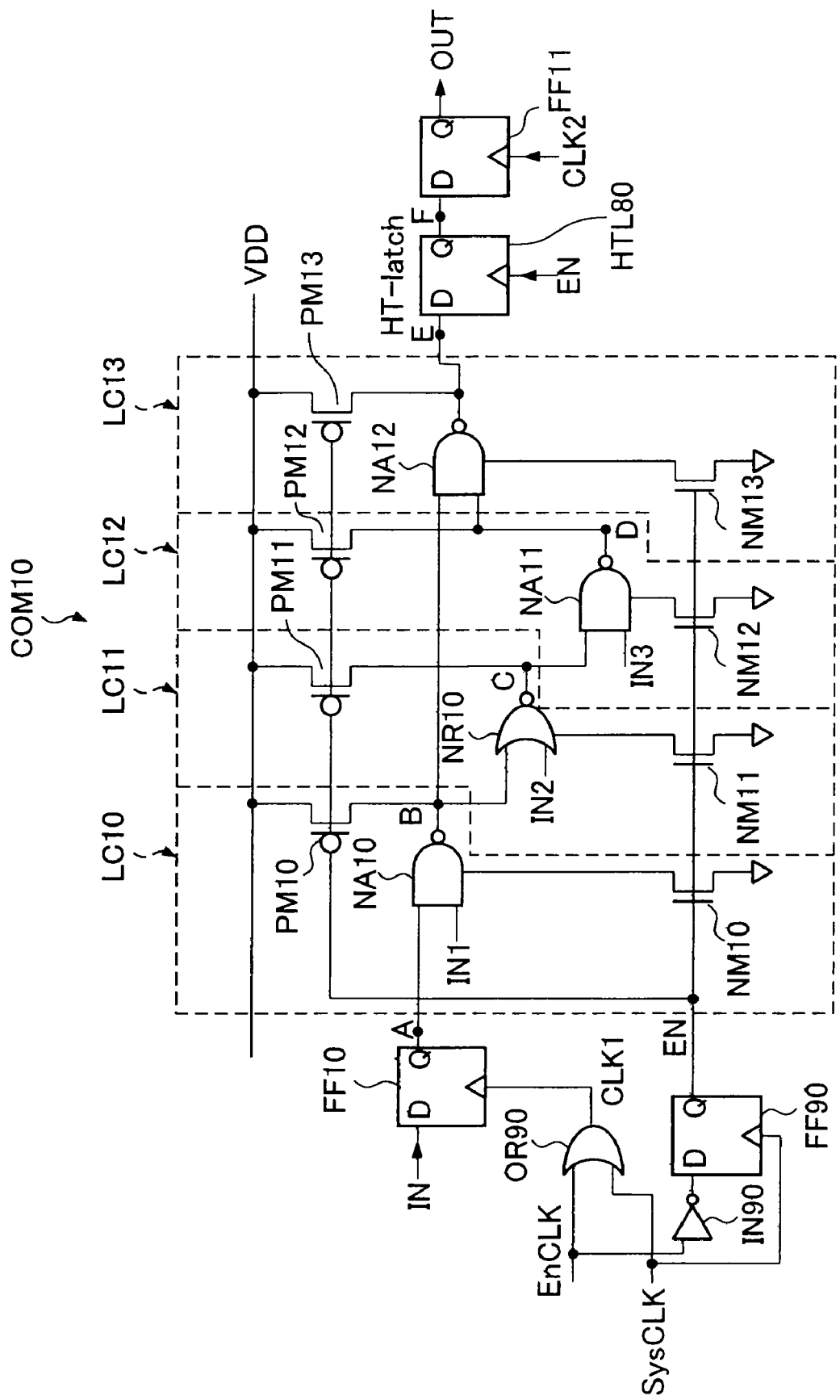
FIG. 22 shows a modified example of the semiconductor integrated circuit device according to the ninth embodiment.

Moreover, in the semiconductor integrated circuit device according to this embodiment, as shown in FIG. 22, it is possible to input an output of the OR circuit OR90 as the clock signal CLK1 to the flip-flop circuit FF10 and input the clock signal CLK2 of another system to the flip-flop circuit FF11.

Tenth Embodiment

In a tenth embodiment, the above third embodiment is applied to the above eighth embodiment, and the gated clock signal CLK2 is generated by a low through latch circuit and an AND circuit. Portions different from the above third embodiment and eighth embodiment will be described below.

Figure 23:
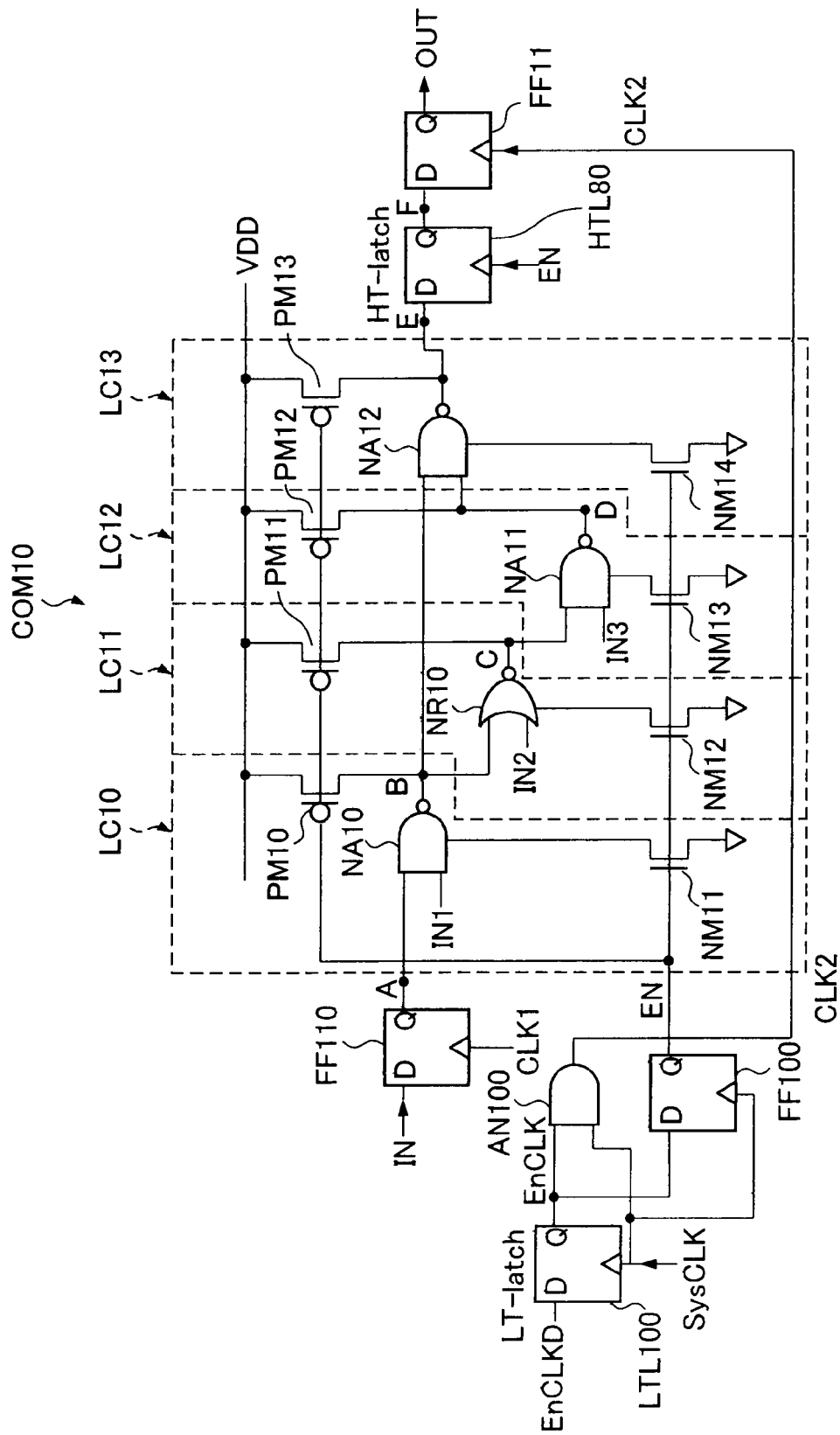
FIG. 23 shows an example of a circuit configuration of a semiconductor integrated circuit device according to a tenth embodiment.
Figure 24:
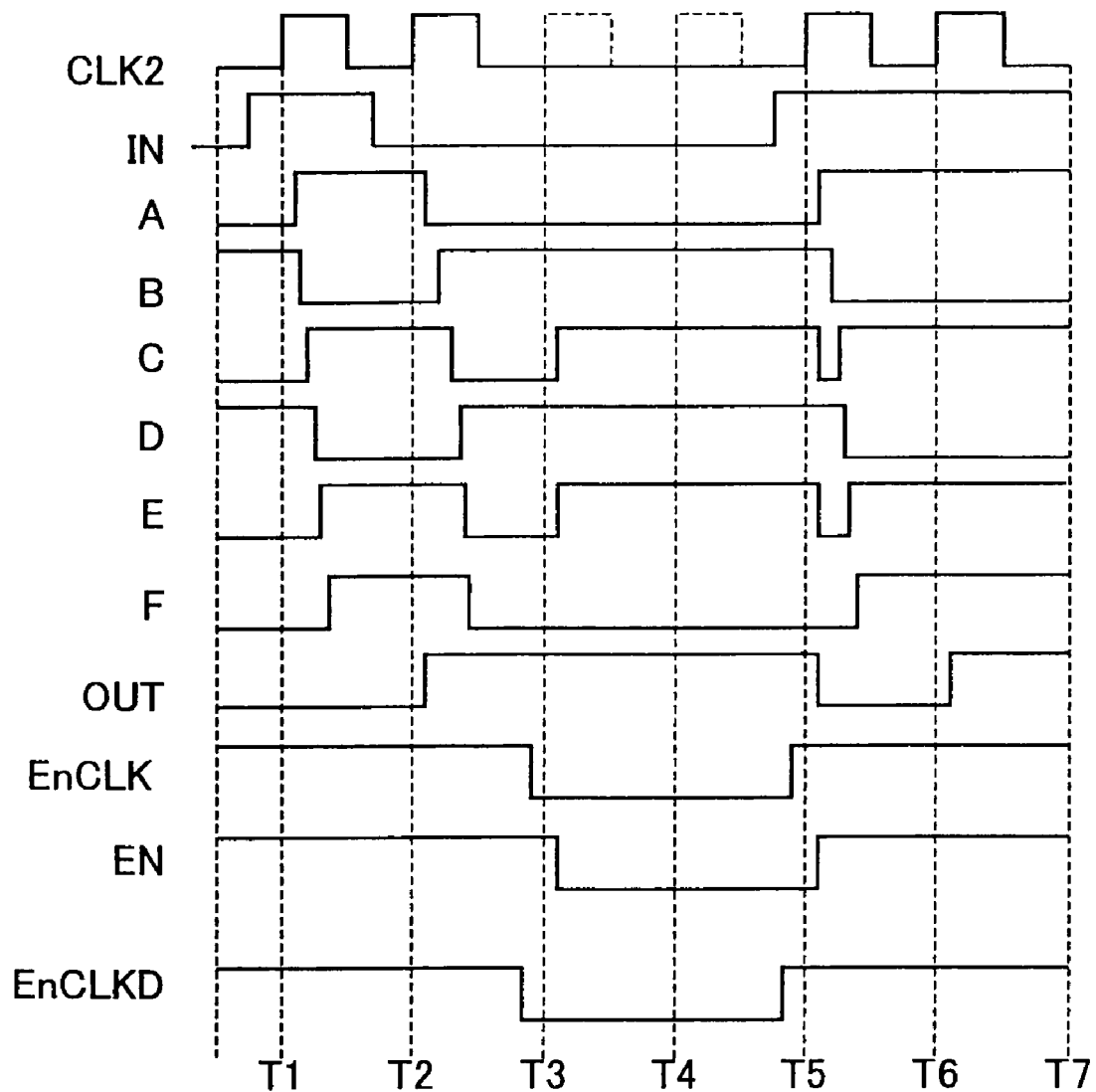
FIG. 24 shows an example of an operation timing chart of the semiconductor integrated circuit device shown in FIG. 23.

FIG. 23 shows an example of a circuit configuration of a semiconductor integrated circuit device according to this embodiment, and FIG. 24 shows an operation timing chart of the semiconductor integrated circuit device in FIG. 23.

As shown in FIG. 23, a circuit of the semiconductor integrated circuit device according to this embodiment is formed by adding a low through latch circuit LTL100, an AND circuit AN100, and a flip-flop circuit FF100 to the semiconductor integrated circuit device of the above eighth embodiment.

The clock control data signal EnCLKD is inputted to a data input terminal D of the low through latch circuit LTL100, and the system clock signal SysCLK is inputted to a clock input terminal thereof. Therefore, as shown in FIG. 24, while the system clock signal SysCLK is low, the low through latch circuit LTL100 outputs the clock control data signal EnCLKD as it is from a data output terminal Q, but while the system clock signal SysCLK is high, it outputs a value of a held immediately preceding state from the data output terminal Q.

The clock control signal EnCLK outputted from the low through latch circuit LTL100 is inputted to one input terminal of the AND circuit AN100. The system clock signal SysCLK is inputted to the other input terminal of the AND circuit AN100. Hence, as shown in FIG. 24, while the clock control signal EnCLK is low, the clock signal CLK2 outputted from the AND circuit AN100 is stopped.

Figure 25:
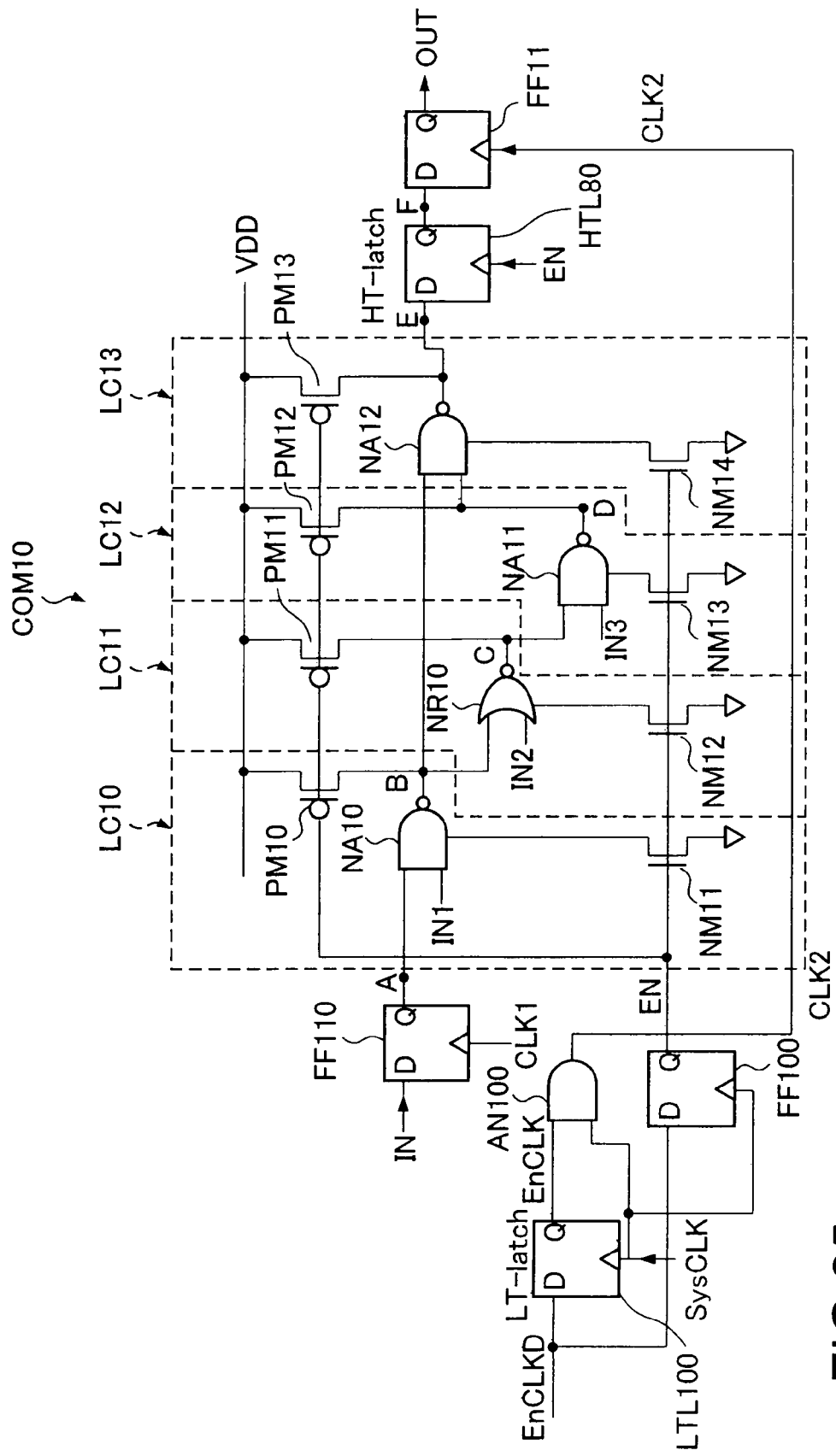
FIG. 25 shows a modified example of the semiconductor integrated circuit device according to the tenth embodiment.

The clock control signal EnCLK is inputted to a data input terminal of the flip-flop circuit FF100 and the system clock signal SysCLK is inputted to a clock input terminal thereof. Hence, as shown in FIG. 24, the flip-flop circuit FF100 outputs the circuit control signal EN synchronized with the system clock signal SysCLK. Incidentally, as shown in FIG. 25, the clock control data signal EnCLKD may be inputted to the data input terminal of the flip-flop circuit FF100.

In this embodiment, the clock control data signal EnCLKD may change both when the system clock signal SysCLK is high and when it is low, which makes it possible to generate the clock control data signal EnCLKD by a complicated combinational logic circuit.

Incidentally, if a timing difference exists between the circuit control signal EN inputted to the logic cells LC10 to LC13 and the circuit control signal EN inputted to the high through latch circuit HTL80, the high through latch circuit HTL80 may receive erroneous data. In particular, if the circuit control signal EN inputted to the logic cells LC10 to LC13 falls earlier than the circuit control signal EN inputted to the high through latch circuit HTL80 in a shift from the active mode to the sleep mode, the high through latch circuit HTL80 receives the erroneous data. Therefore, in terms of design, it is necessary to give consideration so that the timing difference does not occur between the circuit control signal EN inputted to the logic cells LC10 to LC13 and the circuit control signal EN inputted to the high through latch circuit HTL80.

Figure 26:
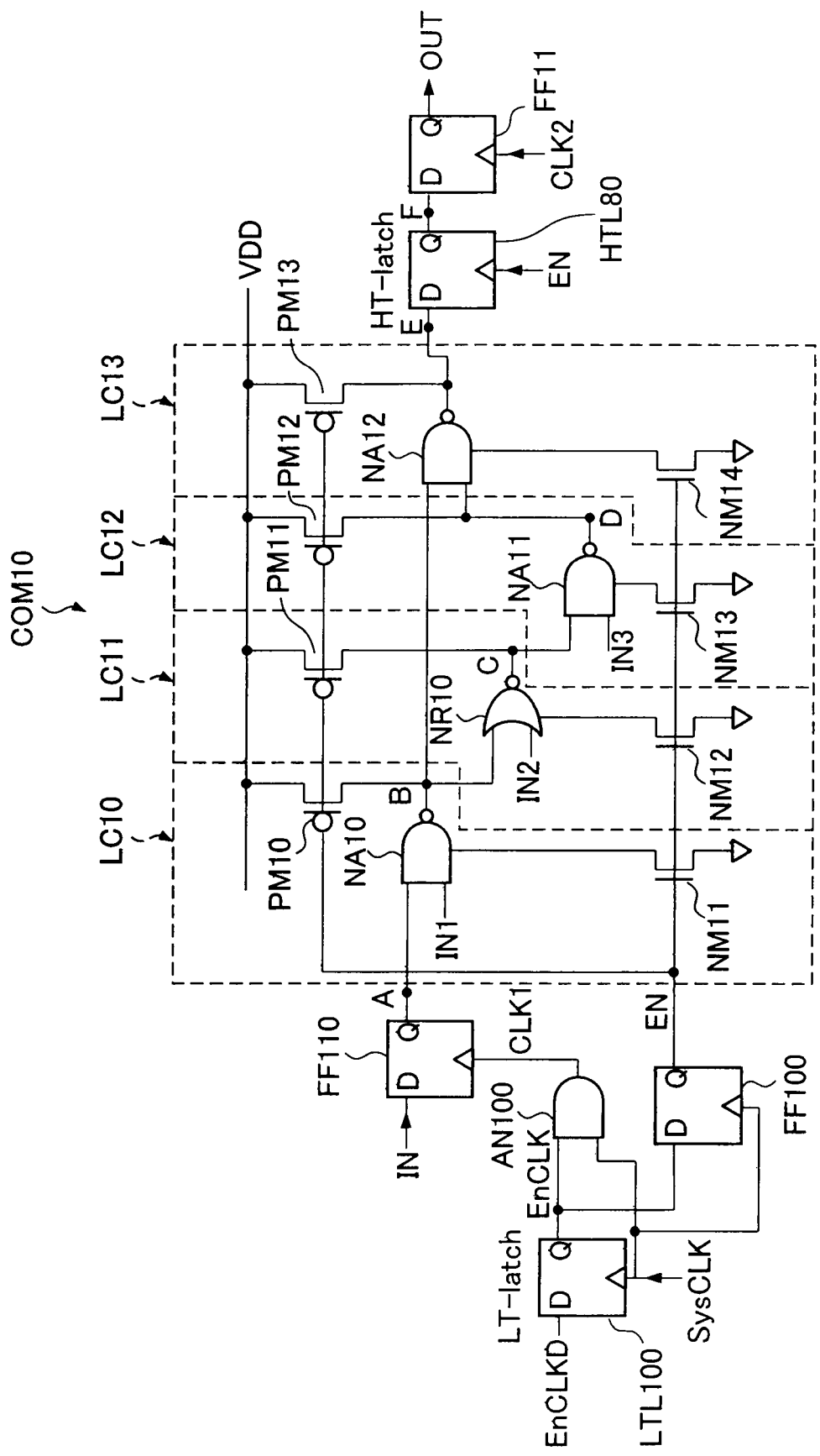
FIG. 26 shows another modified example of the semiconductor integrated circuit device according to the tenth embodiment.

Moreover, in the semiconductor integrated circuit device according to this embodiment, as shown in FIG. 26, it is also possible to input an output of the AND circuit AN100 as the clock signal CLK1 to the flip-flop circuit FF110 and input the clock signal CLK2 of another system to the flip-flop FF11.

Eleventh Embodiment

In an eleventh embodiment, the above fourth embodiment is applied to the above eighth embodiment, and the logic cell LC13 being part of the logic cells LC10 to LC13 is formed by a normal logic cell instead of the logic cell with the foot switch. More specifically, even when the circuit control signal EN is low, with respect to part of logic cells in which the logic level of the output signal outputted from the previous stage as the input signal is not high-impedance state, the standard cell is provided, but the foot-switch MOS transistor and the pull-up MOS transistor are not provided. Portions different from the above fourth embodiment and eighth embodiment will be described below.

Figure 27:
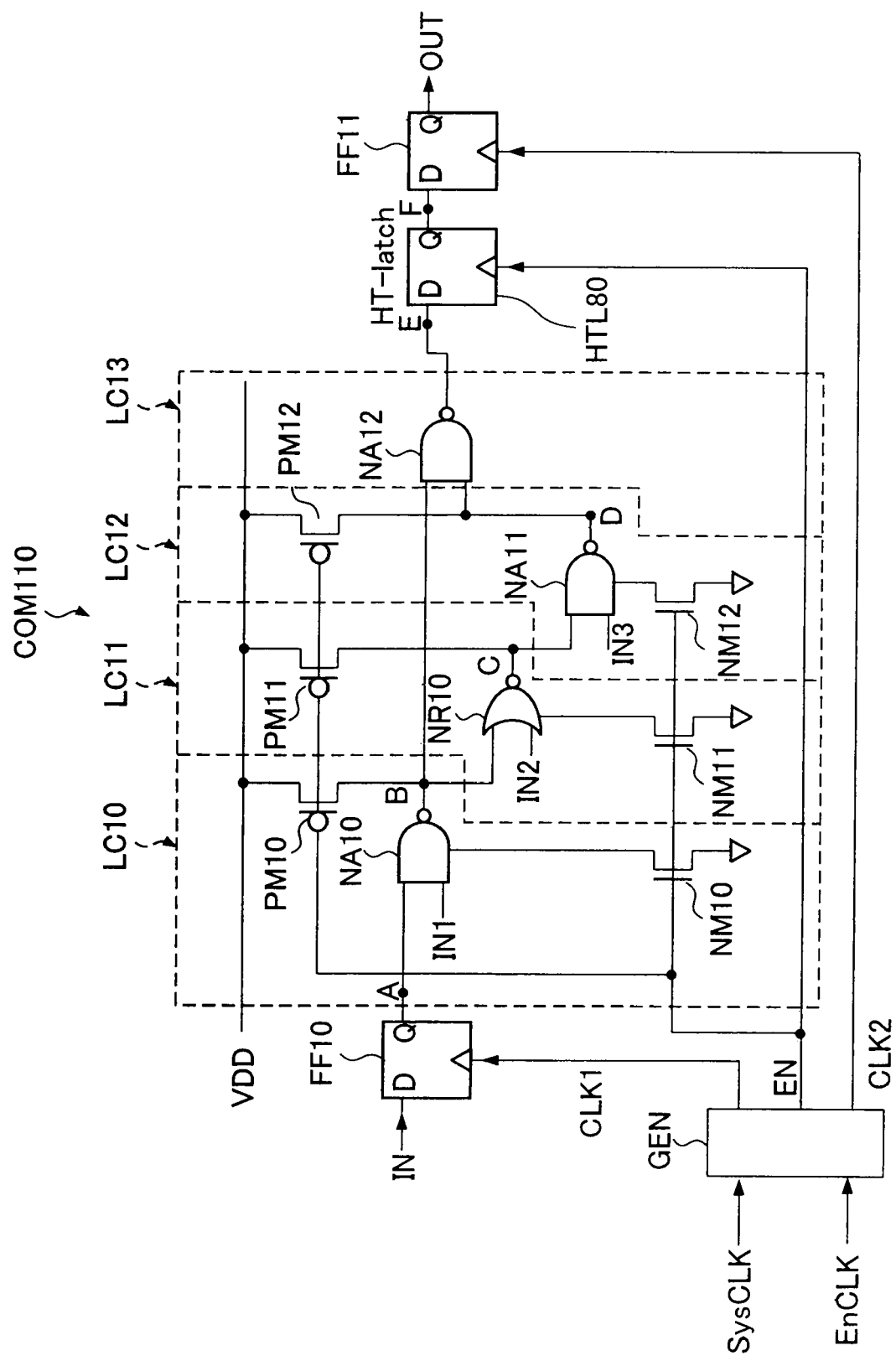
FIG. 27 shows an example of a circuit configuration of a semiconductor integrated circuit device according to an eleventh embodiment.
Figure 28:
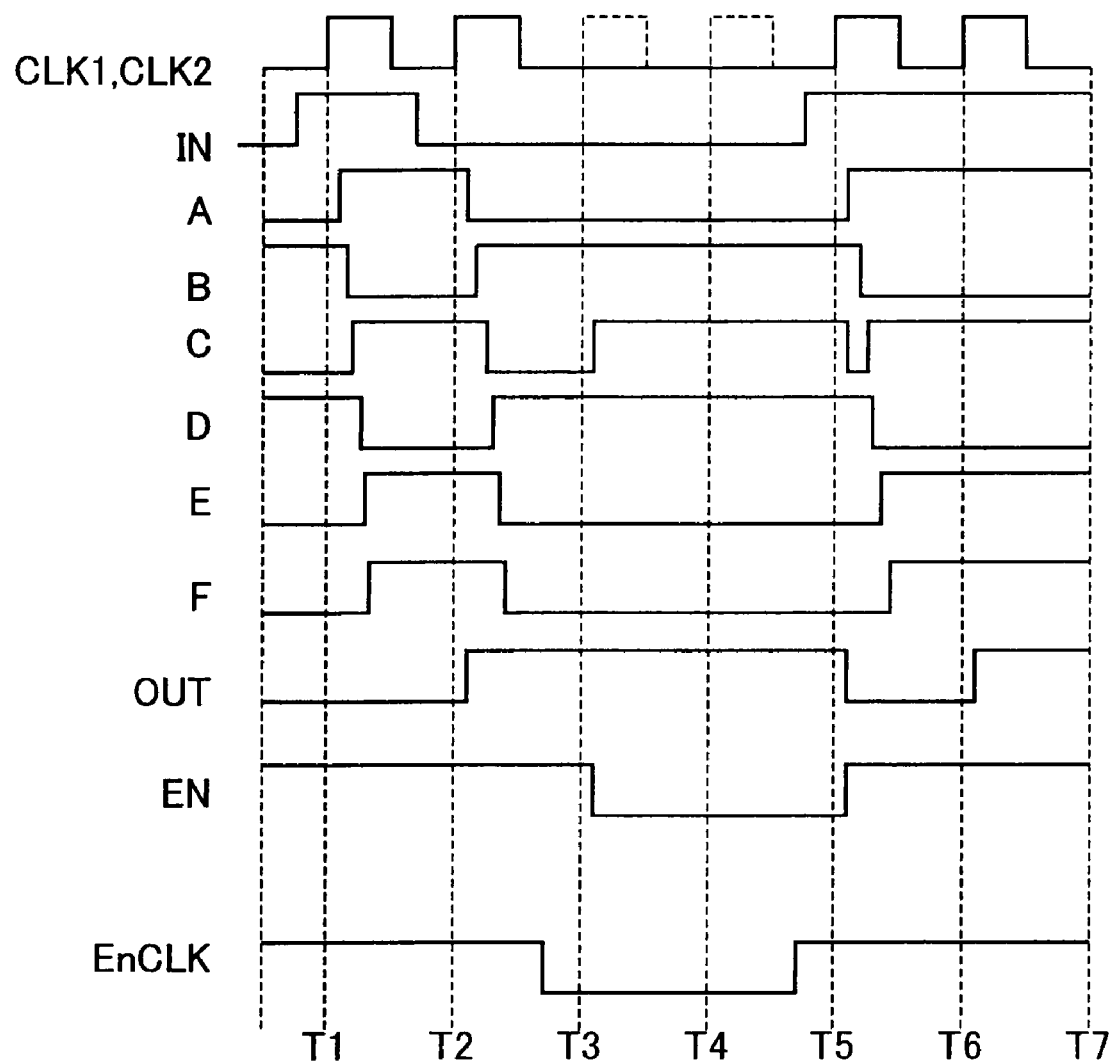
FIG. 28 shows an example of an operation timing chart of the semiconductor integrated circuit device shown in FIG. 27.

FIG. 27 shows an example of a circuit configuration of a semiconductor integrated circuit device according to this embodiment, and FIG. 28 shows an operation timing chart of the semiconductor integrated circuit device in FIG. 27.

As shown in FIG. 27, the control signal generating circuit GEN is provided in a circuit of the semiconductor integrated circuit device according to this embodiment. The system clock signal SysCLK and the clock control signal EnCLK are inputted to the control signal generating circuit GEN. The control signal generating circuit GEN generates the clock signals CLK1 and CLK2 and the circuit control signal EN based on the inputted system clock signal SysCLK and clock control signal EnCLK and outputs them. As can be seen from the above, after a transition of the clock control signal EnCLK occurs, a transition of the circuit control signal EN occurs.

Further, as shown in FIG. 27, in the circuit of the semiconductor integrated circuit device according to this embodiment, the high through latch circuit HTL80 is provided between the logic cell LC13 and the flip-flop circuit FF11 in the semiconductor integrated circuit device of the above fourth embodiment. Namely, the output signal of the NAND circuit NA12 is inputted to the data input terminal D of the high through latch circuit HTL80. The circuit control signal EN is inputted to the clock input terminal of the high through latch circuit HTL80.

Therefore, as shown in FIG. 28, while the circuit control signal EN is high, the output signal of the NAND circuit NA12 is outputted from the high through latch circuit HTL80, but while the circuit control signal EN is low, the high through latch circuit HTL80 holds an immediately preceding state and outputs it from the data output terminal Q (node E and node F).

As in the above fourth embodiment, in the sleep mode, the input signals of the NAND circuit NA12 are fixed high, which does not cause a state where a large leakage current flows. Consequently, the foot switch of NAND circuit NA12 can be omitted. By omitting the N-type MOS transistor NM13 as the foot switch, the P-type MOS transistor PM13 can also be omitted, which results in a reduction in the number of transistors.

Moreover, as in the above eighth embodiment, in a clock cycle next to a clock cycle when the clock control signal EnCLK is switched, the circuit control signal EN can be also switched, so that switching between the active mode and the sleep mode can be rapidly performed.

Incidentally, in the example in FIG. 27, the logic cell from which the foot switch is omitted is the last-stage logic cell, but the logic cell from which the foot switch can be omitted is not limited to the last-stage one, and may be located anywhere as far as the logic cell is formed by the standard cell whose input is fixed in the sleep mode.

Meanwhile, the method of generating the clock signals CLK1 and CLK2 and the circuit control signal EN may be either of the methods in the above ninth embodiment and tenth embodiment.

Twelfth Embodiment

In a twelfth embodiment, the above fifth embodiment is applied to the above eighth embodiment, and with respect to part of the logic cells LC10 to LC13, the output signal is not pulled up in the sleep mode. More specifically, with respect to the logic cell whose output signal is inputted to only the logic cell with the foot switch, the standard cell and the foot switch are provided, but the pull-up MOS transistor is not provided. Portions different from the above fifth embodiment and eighth embodiment will be described below.

Figure 29:
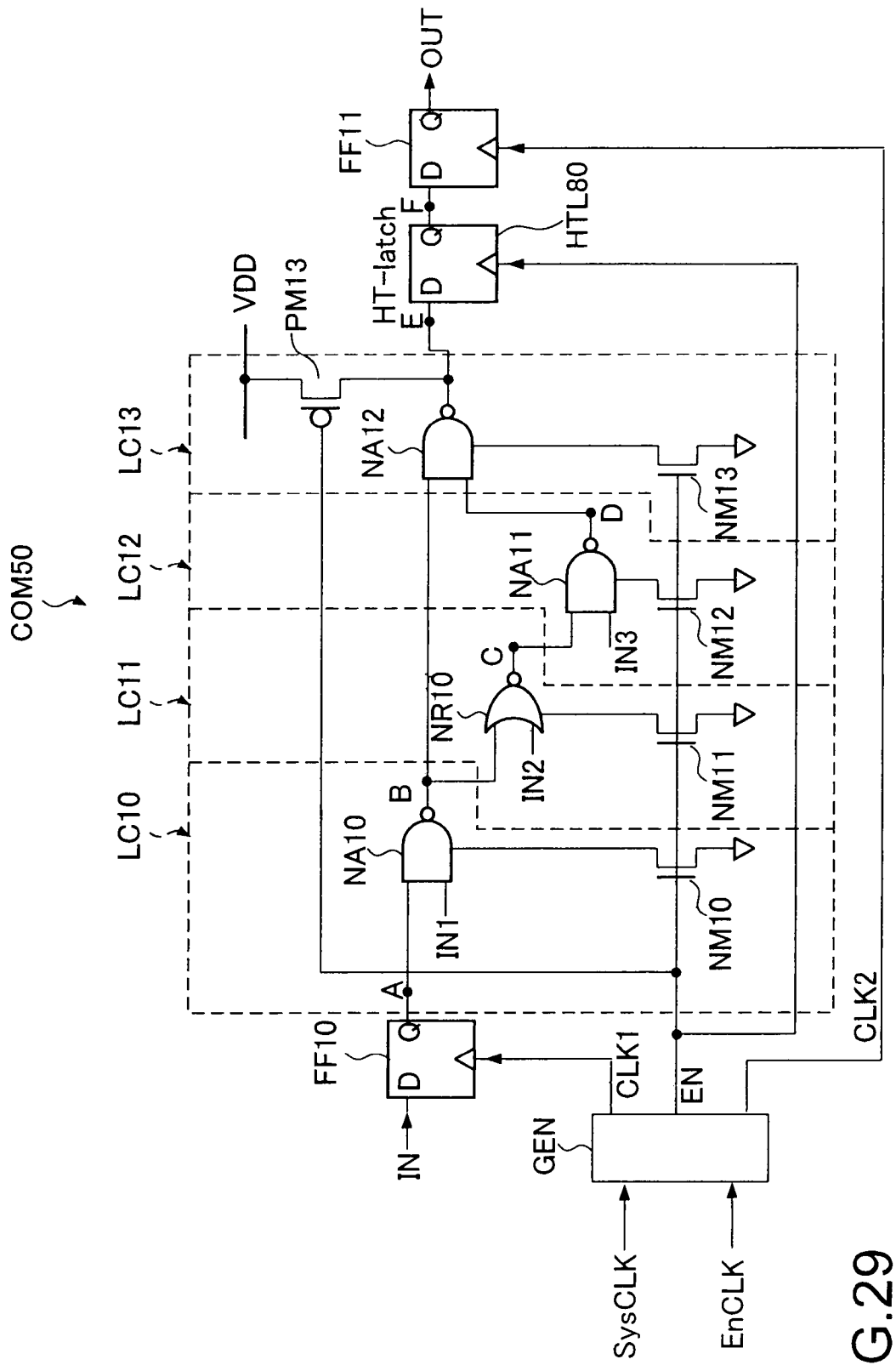
FIG. 29 shows an example of a circuit configuration of a semiconductor integrated circuit device according to a twelfth embodiment.
Figure 30:
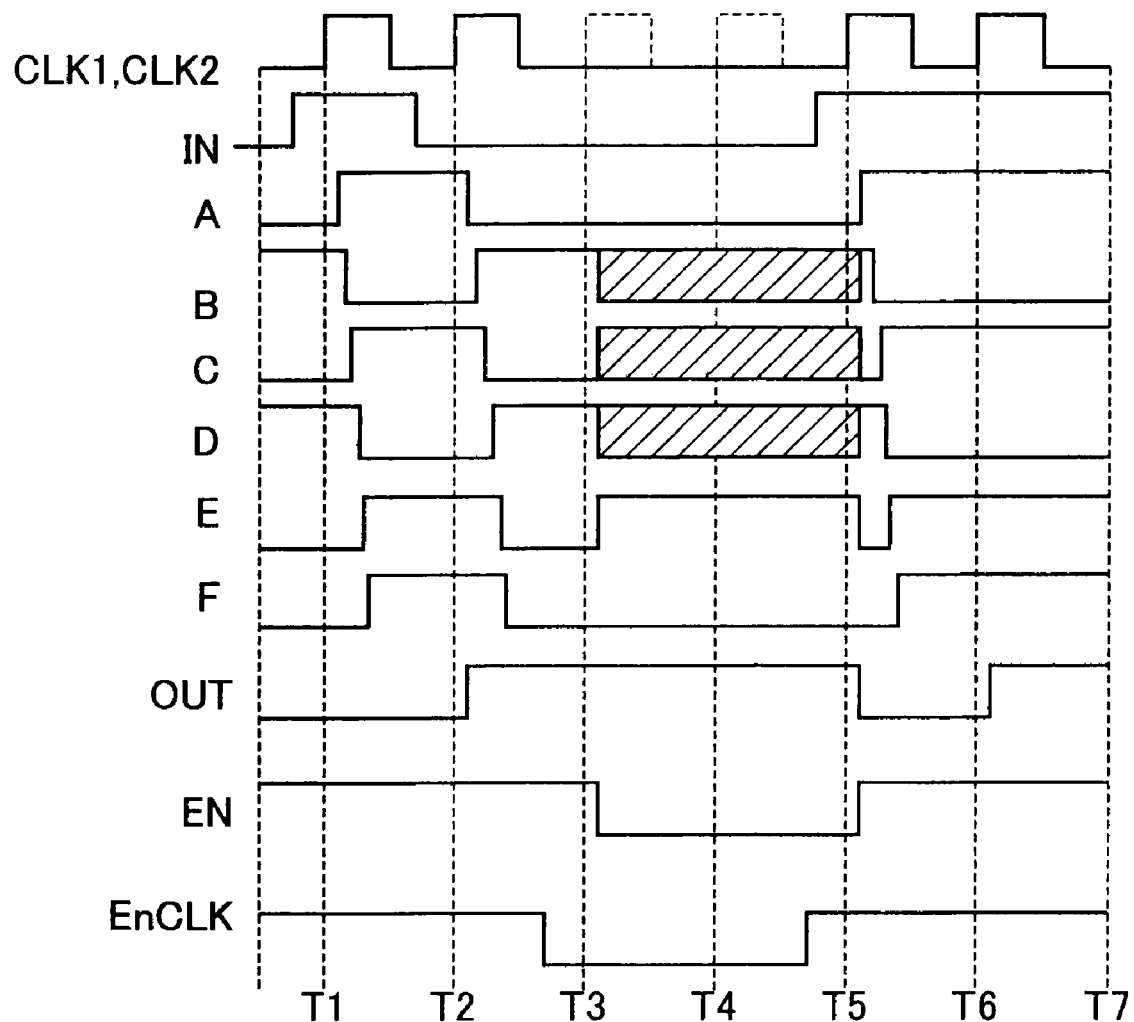
FIG. 30 shows an example of an operation timing chart of the semiconductor integrated circuit device shown in FIG. 29.

FIG. 29 shows an example of a circuit configuration of a semiconductor integrated circuit device according to this embodiment, and FIG. 30 shows an operation timing chart of the semiconductor integrated circuit device in FIG. 29.

As shown in FIG. 29, the control signal generating circuit GEN is provided in a circuit of the semiconductor integrated circuit device according to this embodiment. The system clock signal SysCLK and the clock control signal EnCLK are inputted to the control signal generating circuit GEN. The control signal generating circuit GEN generates the clock signals CLK1 and CLK2 and the circuit control signal EN based on the inputted system clock signal SysCLK and clock control signal EnCLK and outputs them. As can be seen from the above, after a transition of the clock control signal EnCLK occurs, a transition of the circuit control signal EN occurs.

Further, as shown in FIG. 29, in the circuit of the semiconductor integrated circuit device according to this embodiment, the high through latch circuit HTL80 is provided between the logic cell LC13 and the flip-flop circuit FF11 in the semiconductor integrated circuit device of the above fifth embodiment. Namely, the output signal of the NAND circuit NA12 is inputted to the data input terminal D of the high through latch circuit HTL80. The circuit control signal EN is inputted to the clock input terminal of the high through latch circuit HTL80.

Therefore, as shown in FIG. 29, while the circuit control signal EN is high, the output signal of the NAND circuit NA12 is outputted from the high through latch circuit HTL80, but while the circuit control signal EN is low, the high through latch circuit HTL80 holds an immediately preceding state and outputs it from the data output terminal Q (node E and node F).

As in the above fifth embodiment, in the sleep mode, the circuit control signal EN goes low and the MOS transistors NM10 to NM13 are turned off, whereby a large leakage current does not flow from the NAND circuits NA10 to NA12 and the NOR circuit NR10 as the standard cells forming the logic cells LC10 to LC13.

Further, as shown in FIG. 30, since the pull-up MOS transistors PM10 to PM12 are omitted, the node B to the node D as the outputs of the logic cells LC10 to LC12 become high-impedance, but the output of the logic cell LC13 as the output of the combinational logic circuit COM10 is pulled up high because the MOS transistor PM13 is turned on. This can avoid an input to the data input terminal D of the high through latch circuit HTL80 from becoming inconstant even if the pull-up MOS transistors PM10 to PM12 of the NAND circuits NA10 and NA11 and the NOR circuit NR10 which do not influence the output of the combinational logic circuit COM10 are omitted.

Incidentally, when, in place of the high through latch circuit HTL80, a latch circuit in which the leakage current does not flow even if the data input terminal D goes into a floating (high-impedance) state is used, the P-type MOS transistor PM13 can also be omitted.

Meanwhile, the method of generating the clock signals CLK1 and CLK2 and the circuit control signal EN may be either of the methods in the above ninth embodiment and tenth embodiment.

Thirteenth Embodiment

In a thirteenth embodiment, the above sixth embodiment is applied to the above eighth embodiment, and with respect to the logic cell whose output signal is inputted to only the logic cell with the foot switch, the output signal is not pulled up in the sleep mode. In other words, the above eleventh embodiment is further modified. Portions different from the above sixth embodiment, eighth embodiment, and eleventh embodiments will be described below.

Figure 31:
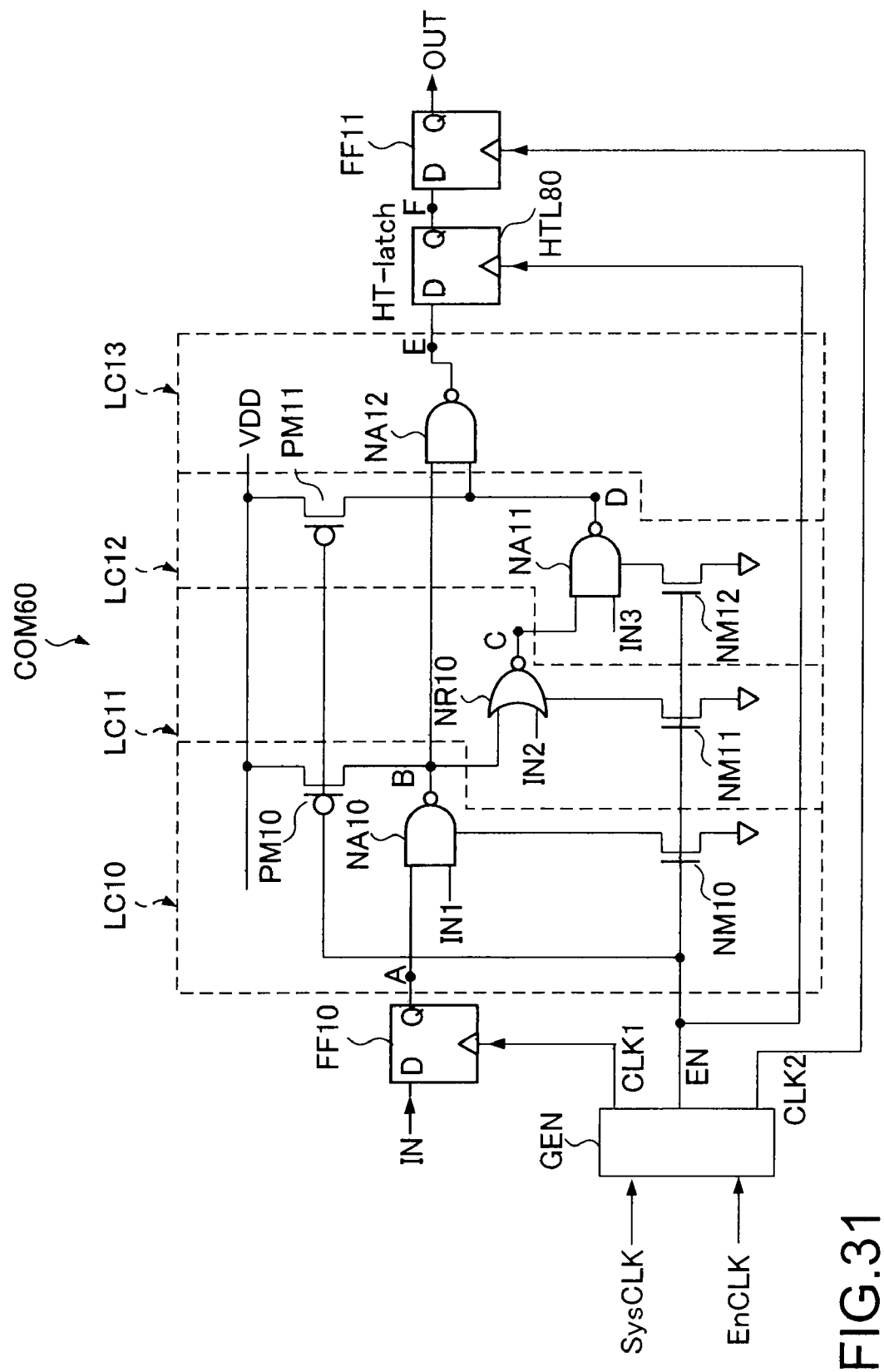
FIG. 31 shows an example of a circuit configuration of a semiconductor integrated circuit device according to a thirteenth embodiment.
Figure 32:
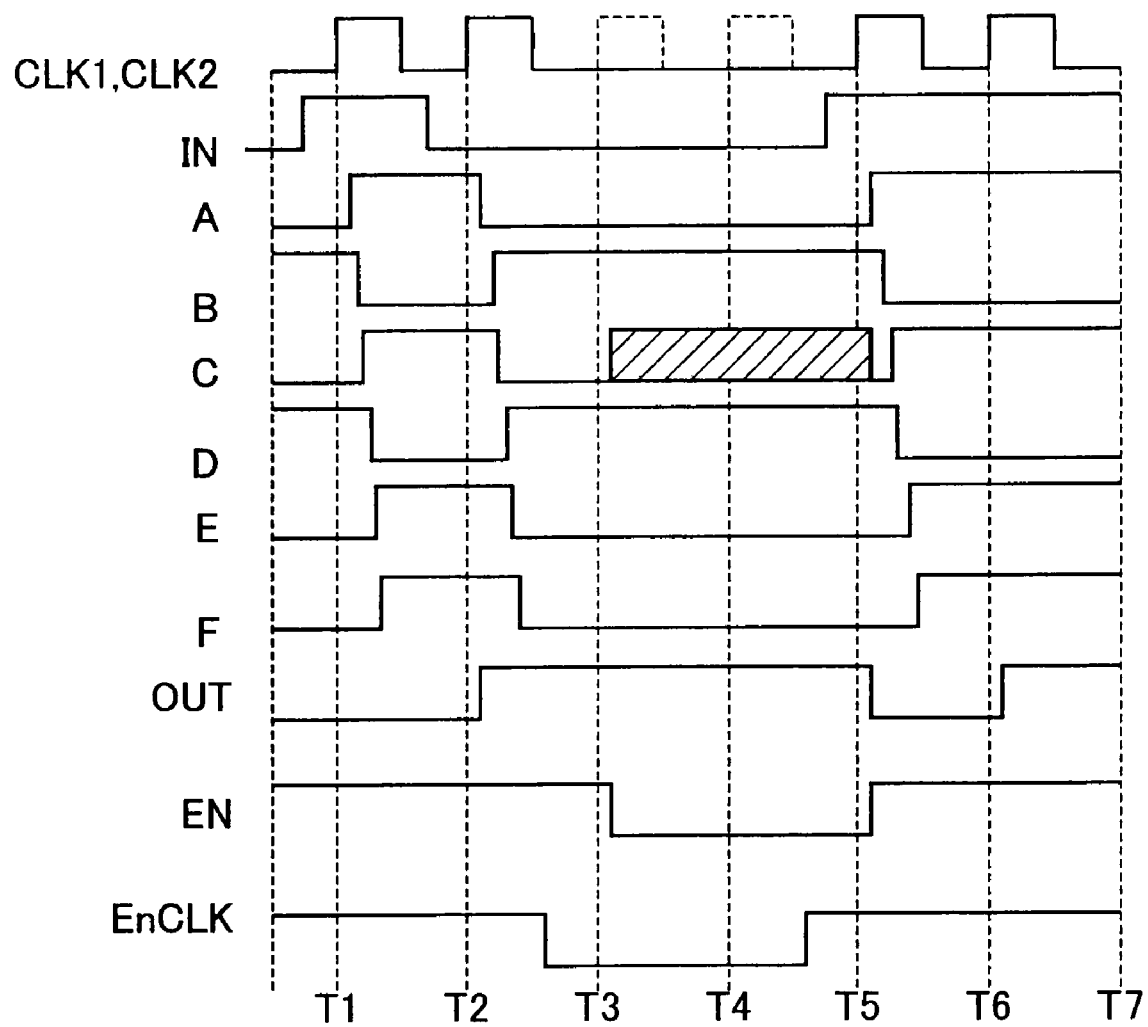
FIG. 32 shows an example of an operation timing chart of the semiconductor integrated circuit device shown in FIG. 31.

FIG. 31 shows an example of a circuit configuration of a semiconductor integrated circuit device according to this embodiment, and FIG. 32 shows an operation timing chart of the semiconductor integrated circuit device in FIG. 31.

As shown in FIG. 31, the control signal generating circuit GEN is provided in a circuit of the semiconductor integrated circuit device according to this embodiment. The system clock signal SysCLK and the clock control signal EnCLK are inputted to the control signal generating circuit GEN. The control signal generating circuit GEN generates the clock signals CLK1 and CLK2 and the circuit control signal EN based on the inputted system clock signal SysCLK and clock control signal EnCLK and outputs them. As can be seen from the above, after a transition of the clock control signal EnCLK occurs, a transition of the circuit control signal EN occurs.

Further, as shown in FIG. 31, in the circuit of the semiconductor integrated circuit device according to this embodiment, the high through latch circuit HTL80 is provided between the logic cell LC13 and the flip-flop circuit FF11 in the semiconductor integrated circuit device of the above sixth embodiment. Namely, the output signal of the NAND circuit NA12 is inputted to the data input terminal D of the high through latch circuit HTL80. The circuit control signal EN is inputted to the clock input terminal of the high through latch circuit HTL80.

Therefore, as shown in FIG. 32, while the circuit control signal EN is high, the output signal of the NAND circuit NA12 is outputted from the high through latch circuit HTL80, but while the circuit control signal EN is low, the high through latch circuit HTL80 holds an immediately preceding state and outputs it from the data output terminal Q (node E and node F).

Further, as shown in FIG. 32, the node C as the output of the logic cell LC11 becomes high-impedance in the sleep mode, but the output of the logic cell LC11 is inputted to only the logic cell LC12 with the foot switch. Accordingly, even if the output of the logic cell LC11 becomes high-impedance, a large leakage current does not flow.

This configuration also can reduce the number of MOS transistors in the combinational logic circuit COM60.

Meanwhile, the method of generating the clock signals CLK1 and CLK2 and the circuit control signal EN may be either of the methods in the above ninth embodiment and tenth embodiment.

Fourteenth Embodiment

In a fourteenth embodiment, the above seventh embodiment is applied to the above eighth embodiment, and a semiconductor integrated circuit device includes a scan test mode. Portions different from the above seventh embodiment and eighth embodiment will be described below.

Figure 33:
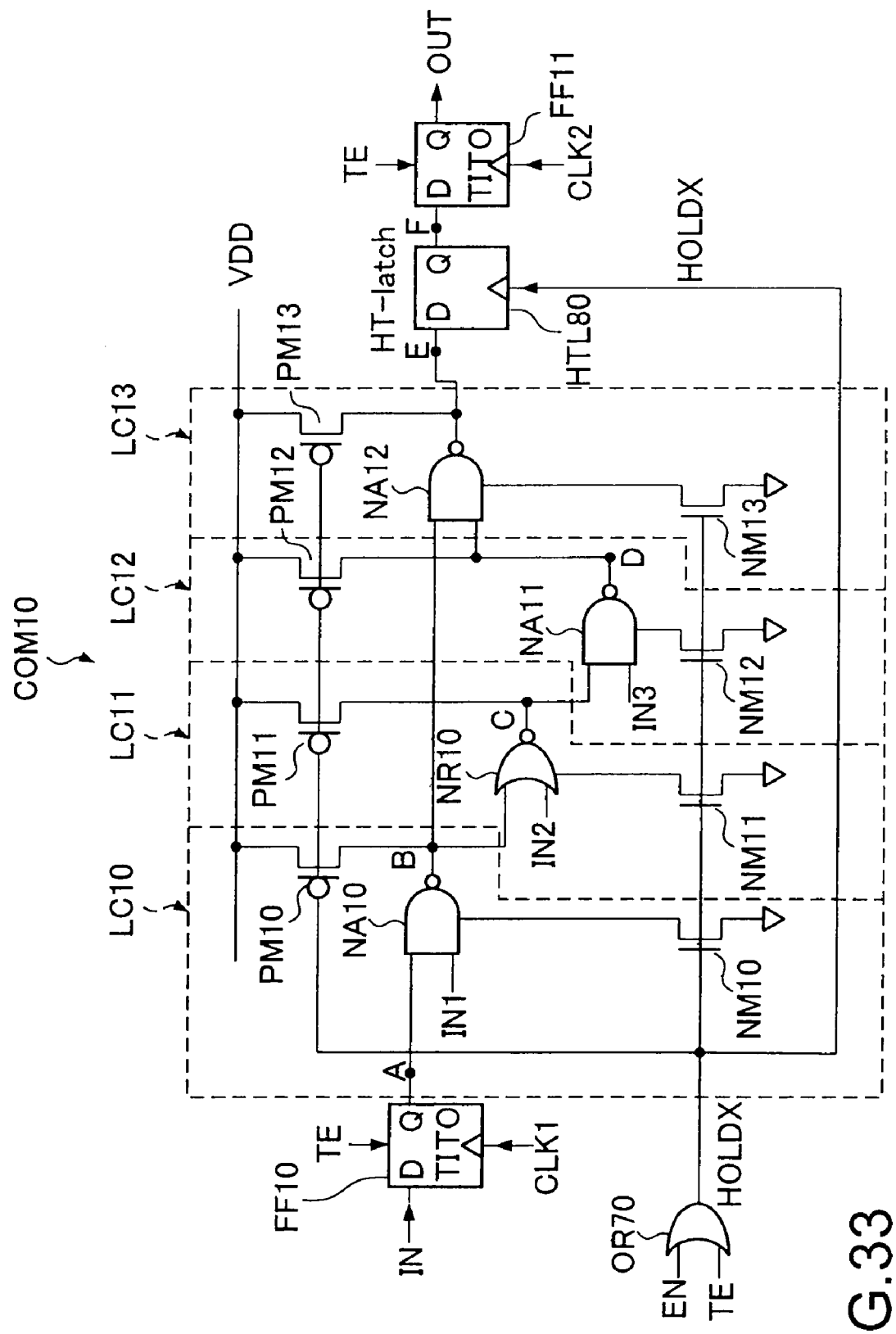
FIG. 33 shows an example of a circuit configuration of a semiconductor integrated circuit device according to a fourteenth embodiment.

FIG. 33 shows an example of a circuit configuration of the semiconductor integrated circuit device according to this embodiment. As shown in FIG. 33, in a circuit of the semiconductor integrated circuit device according to this embodiment, the high through latch circuit HTL80 is provided between the logic cell LC13 and the flip-flop circuit FF11 in the semiconductor integrated circuit device of the above seventh embodiment. Namely, the output signal of the NAND circuit NA12 is inputted to the data input terminal D of the high through latch circuit HTL80. The flip-flop is a so-called scan flip-flop. When TE goes high, the flip-flop goes into a test mode.

Moreover, as in the seventh embodiment, the OR circuit OR70 is provided in the circuit of the semiconductor integrated circuit device according to this embodiment, and the circuit control signal EN and the test enable signal TE are inputted to the OR circuit OR70, and the OR circuit OR70 outputs an inverted hold signal HOLDX. The inverted hold signal HOLDX is inputted to the control terminals of the MOS transistors NM10 to NM13 and the MOS transistors PM10 to PM13 and the clock input terminal of the high through latch circuit HTL80.

Therefore, in the scan test mode, by driving the test enable signal TE high, the MOS transistors NM10 to NM13 as the foot switches can be turned on and the MOS transistors PM10 to PM13 can be turned off. Namely, by driving the test enable signal TE high, the MOS transistors NM10 to NM13 can be turned on and the MOS transistors PM10 to PM13 can be turned off, regardless of the value of the circuit control signal EN. Further, by driving the test enable signal TE high in the scan test mode, the high through latch circuit HTL80 outputs data inputted to the data input terminal D as it is from the data output terminal Q.

This configuration makes it possible to test the logic cells LC10 to LC13 as logic cells formed by normal standard cells in the scan test mode.

Fifteenth Embodiment

The configurations of the high through latch circuit HTL80 and the flip-flop circuit FF11 of the above fourteenth embodiment will be described in detail.

Figure 34:
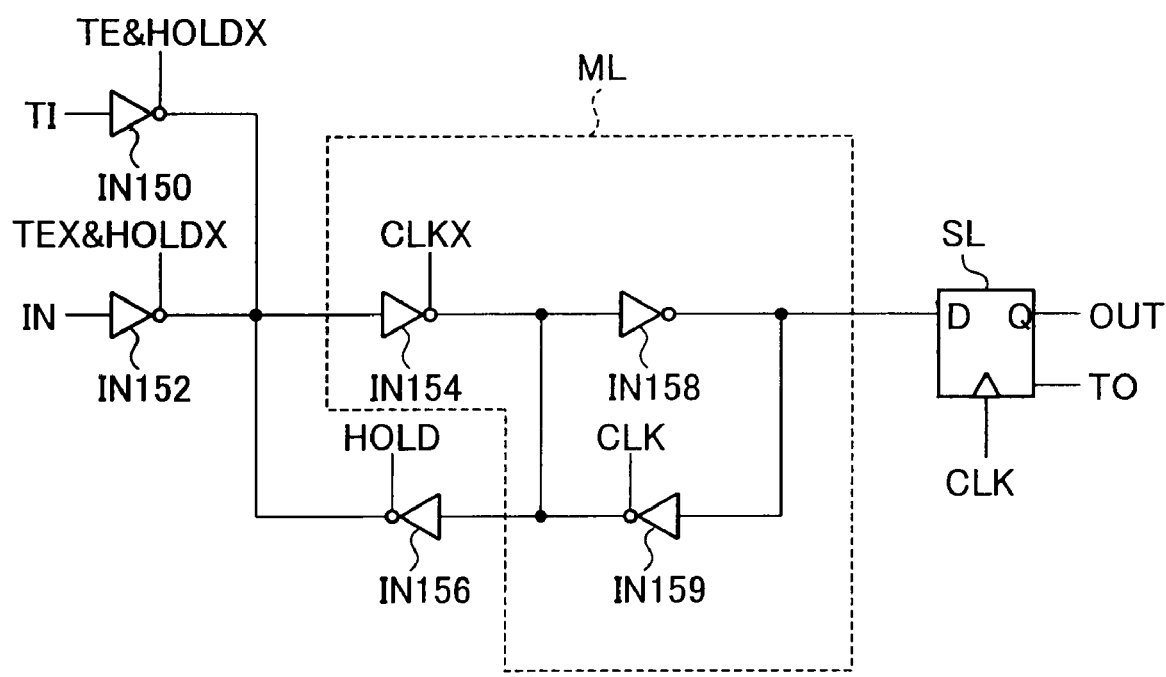
FIG. 34 shows an example of a circuit configuration of a low through latch circuit.

FIG. 34 shows circuit configurations of a latch circuit with a test function and a flip-flop circuit to which an output of the latch circuit is inputted according to this embodiment. As shown in FIG. 34, the latch circuit according to this embodiment includes inverter circuits IN150, IN152, IN154, IN156, IN158, and IN159 and a slave latch circuit SL. Out of these inverter circuits, the inverter circuits IN150, IN152, IN154, IN156, and IN159 are each formed by a clocked inverter having a gate function. The inverter IN154, the inverter IN158, and the inverter IN159 form a master latch circuit ML in this embodiment. The inverter circuits IN150, IN152, and IN156, the mater latch circuit ML, and the slave latch circuit SL form the high through latch circuit HTL80 and the flip-flop circuit FF11 in the fourteenth embodiment.

A test signal TI is inputted to the inverter circuit IN150 and gated by a logical AND between the test enable signal TE and the inverted hold signal HOLDX. A data signal IN is inputted to the inverter circuit IN152 and gated by a logical AND between an inverted test enable signal TEX and the inverted hold signal HOLDX.

Accordingly, if the test enable signal TE is low, the data signal IN is selected by the inverter circuit IN152, and if the test enable signal TE is high, the test signal TI is selected by the inverter circuit IN150. In either case, if the inverted hold signal HOLDX is high (namely, if a hold signal HOLD is low), the signal inputted to the inverter circuit IN150 or IN152 passes after being inverted, and if the inverted hold signal HOLDX is low (namely, if the hold signal HOLD is high), the signal is cut off.

If the inverted hold signal HOLDX is low (namely, if the hold signal HOLD is high), the inverter circuit IN156 operates, and inverts and outputs the inputted signal. Hence, in this embodiment, the inverter circuits IN150, IN152, and IN156 form a multiplexer.

Moreover, in the latch circuit according to this embodiment, the inverter circuit IN154 and the inverter circuit IN156 form one latch circuit, and the inverter circuit IN158 and the inverter circuit IN159 form one latch circuit.

This configuration makes it possible to realize the high through latch circuit HTL80 which holds data by only adding three inverter circuits IN150, IN152, and IN156 to the configuration of the normal master latch ML. Furthermore, the number of stages of the inverter circuit from IN to OUT in the normal operation becomes the same as that of a normal scan input/output flip-flop circuit, so that it can be thought that a reduction in operation speed due to the addition of a holding function hardly occurs.

Sixteenth Embodiment

The latch circuit of the above fifteenth embodiment is configured on the assumption that it is guaranteed that the clock signal CLK goes low when a hold state is entered, but in this embodiment, the latch circuit operates normally even when this guarantee is not given. Portions different from the above fifteenth embodiment will be described below.

Figure 35:
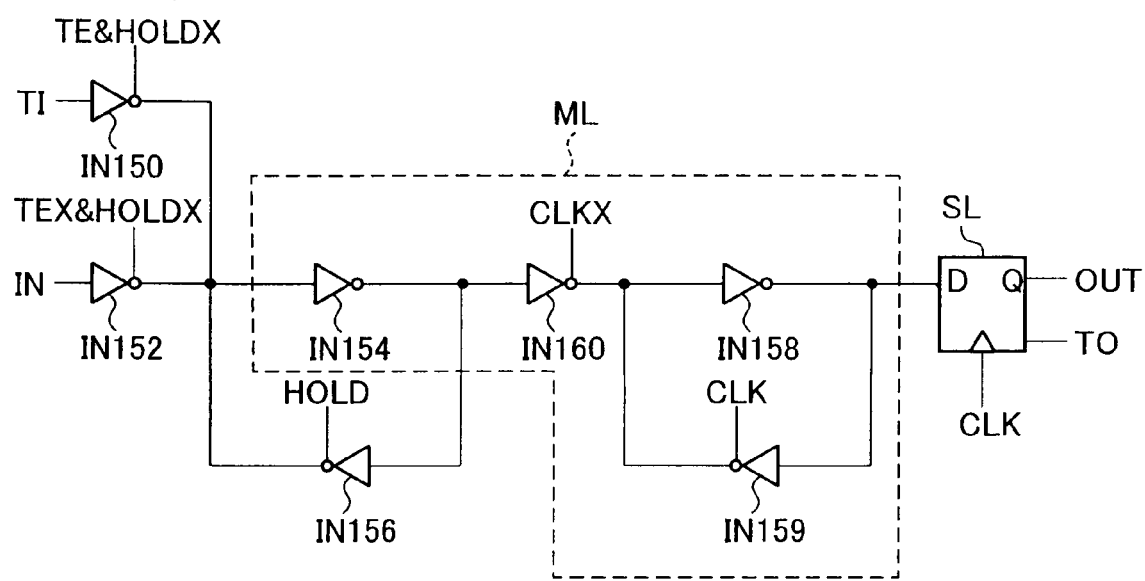
FIG. 35 shows another example of the circuit configuration of the low through latch circuit.

FIG. 35 shows a circuit configuration of a latch circuit according to this embodiment. As shown in FIG. 35, in the latch circuit according to this embodiment, the inverter circuit IN154 is formed by a normal inverter, and an inverter circuit IN160 is additionally inserted between the inverter circuit IN154 and the inverter circuit IN158.

This inverter circuit IN160 is a clocked inverter to which an inverted clock signal CLKX is inputted.

This configuration allows the inverter circuit IN160 to go into an cut-off state and a latch function by the inverter circuits 158 and 159 to run if the clock signal CLK is high when the hold state is entered. Therefore, even if the clock signal CLK when the hold state is entered is high or low, the latch circuit functions normally.

Seventeenth Embodiment

In the latch circuit according to the above fifteenth embodiment, the data signal can be held even during the scan test, but in this embodiment, it is assumed that the data signal need not be held during the scan test. Portions different from the above fifteenth embodiment will be described below.

Figure 36:
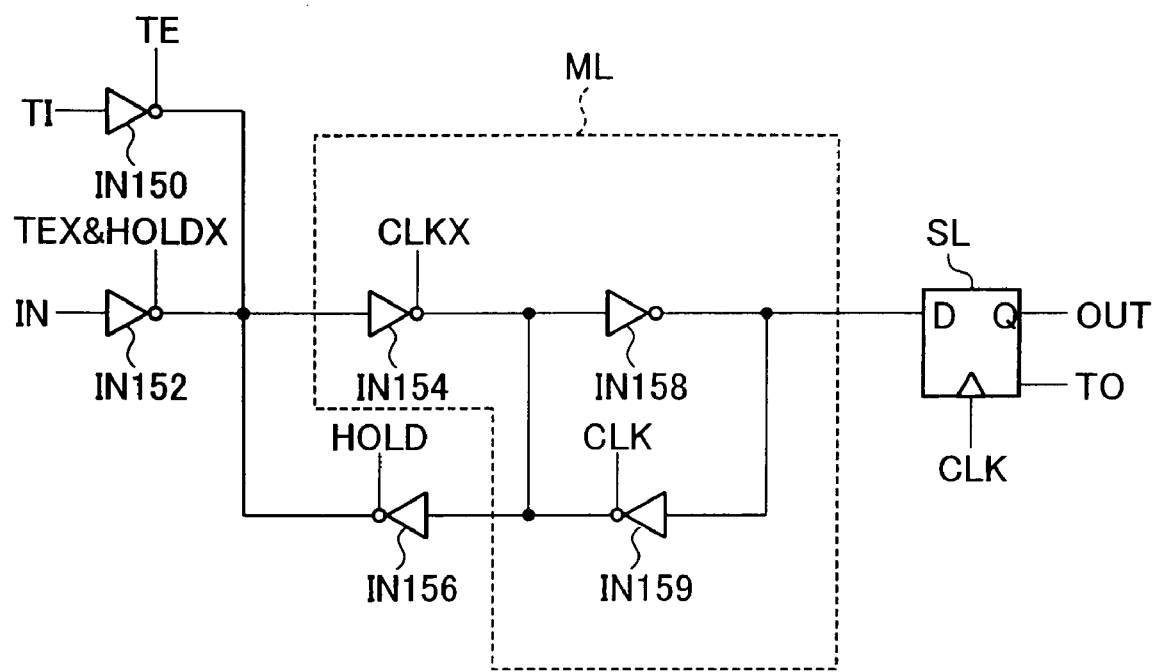
FIG. 36 shows still another example of the circuit configuration of the low through latch circuit.

FIG. 36 shows a circuit configuration of a latch circuit according to this embodiment. As shown in FIG. 36, in the latch circuit according to this embodiment, the inverter circuit IN150 is gated by the test enable signal TE. This makes it possible to simplify a control signal of the multiplexer as an input.

Figure 37:
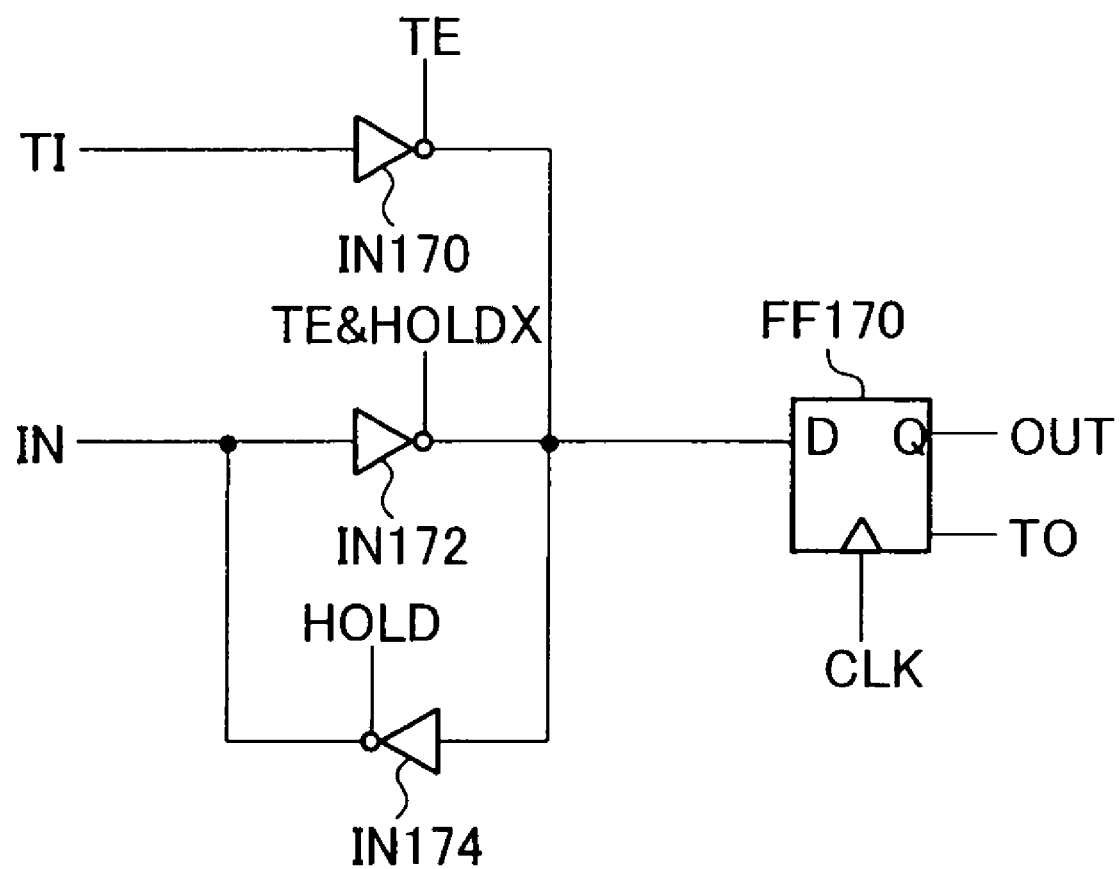
FIG. 37 shows yet another example of the circuit configuration of the low through latch circuit.

Incidentally, as shown in FIG. 37, in the case of a flip-flop circuit FF170, the latch circuit of this embodiment can be formed by three inverter circuits IN170, IN172, and IN174. These inverter circuits IN170, IN172, and IN174 are each formed by a clocked inverter.

The test signal TI is inputted to the inverter circuit IN170, which is gated by the test enable signal TE. The data signal IN is inputted to the inverter circuit IN172, which is gated by a logical AND of the test enable signal TE and the inverted hold signal HOLDX. The inverter circuits IN172 and IN174 form a latch circuit, whose output is inputted to a data input terminal D of the flip-flop circuit FF170. This configuration also makes it possible to simplify the control signal of the multiplexer as the input.

Eighteenth Embodiment

Figure 38:
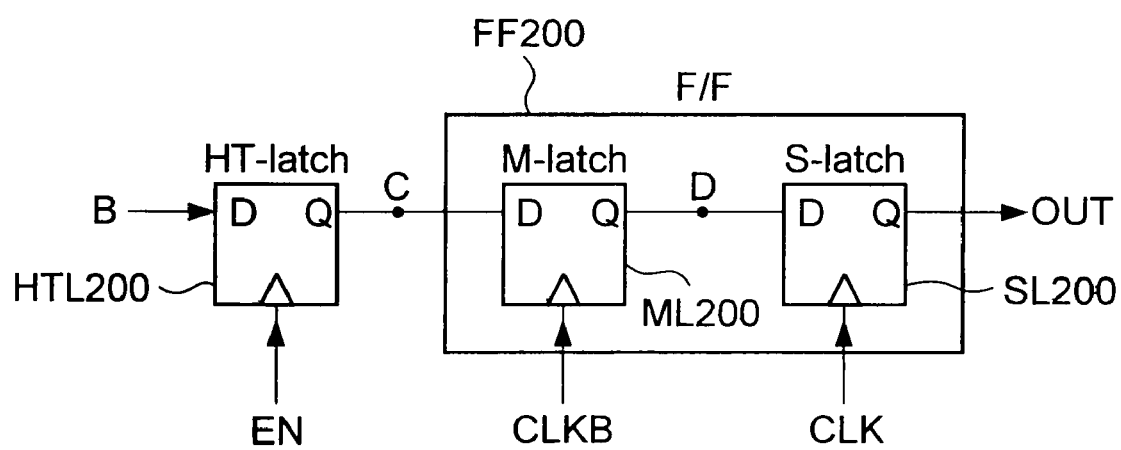
FIG. 38 shows a high through latch circuit provided in a semiconductor integrated circuit and a flip-flop circuit connected to the high through latch circuit.

In an eighteenth embodiment, from a different point of view from the above embodiments, a method of simplifying the high through latch circuit and the flip-flop circuit will be described. FIG. 38 shows a high through latch circuit HTL200 to which the output of the combinational logic circuit is inputted and a flip-flop circuit FF200. The flip-flop circuit FF200 further includes a master latch circuit ML200 and a slave latch circuit SL200.

As shown in FIG. 38, a node on the side of a data input terminal D of the high through latch circuit HTL200 is taken as a node B and a node on the side of a data output terminal Q thereof is taken as a node C. A node on the side of a data output terminal Q of the master latch circuit ML200 having a data input terminal D connected to the node C is taken as a node D. A signal outputted from a data output terminal Q of the slave latch circuit SL200 having a data input terminal D connected to the node D is taken as an output signal OUT.

Further, as shown in FIG. 38, the circuit control signal EN is inputted to a control terminal of the high through latch circuit HTL200, and the clock signal CLK is inputted to a control terminal of the slave latch circuit SL200. An inverted clock signal CLKB obtained by inverting the clock signal CLK is inputted to a control terminal of the master latch circuit ML200.

FIG. 39 shows logic levels of the circuit control signal EN and the clock signal CLK and logic levels of the nodes B, C, and D and the output signal OUT in tabular form. As shown in FIG. 39, the following is known.

(1) When the circuit control signal EN is high and the clock signal CLK is also high, the high through latch circuit HTL200 goes into a through state, the master latch circuit ML200 goes into a hold state, and the slave latch circuit SL200 goes into the through state. Therefore, if the logic level of the node B is Q, the logic level of the node C is also Q. Note, however, that the logic level of the node D is a logic level R which is unrelated to the logic level Q of the node C. The logic level of the output signal OUT is R.

(2) When the circuit control signal EN is high and the clock signal CLK is low, the high through latch circuit HTL200 goes into the through state, the master latch circuit ML200 goes into the through state, and the slave latch circuit SL200 goes into the hold state. Therefore, if the logic level of the node B is Q, the logic level of the node C is also Q, and the logic level of the node D is also Q. Note, however, that the logic level of the output signal OUT is the logic level R which is unrelated to the logic level Q of the node D.

(3) When the circuit control signal EN is low and the clock signal CLK is high, the high through latch circuit HTL200 goes into the hold state, the master latch circuit ML200 goes into the hold state, and the slave latch circuit SL200 goes into the through state. Therefore, if the logic level of the node B is Q, the logic level of the node C is the logic level R which is unrelated to the logic level Q. The logic level of the node D is a logic level S which is related to the logic level R of the node C. The logic level of the output signal OUT is S.

(4) When the circuit control signal EN is low and the clock signal CLK is also low, the high through latch circuit HTL200 goes into the hold state, the master latch circuit ML200 goes into the through state, and the slave latch circuit SL200 goes into the hold state. Therefore, if the logic level of the node B is Q, the logic level of the node C is the logic level R which is unrelated to the logic level Q. The logic level of the node D is also R. Note, however, that the logic level of the output signal OUT is the logic level S which is unrelated to the logic level R of the node D.

Figure 40:
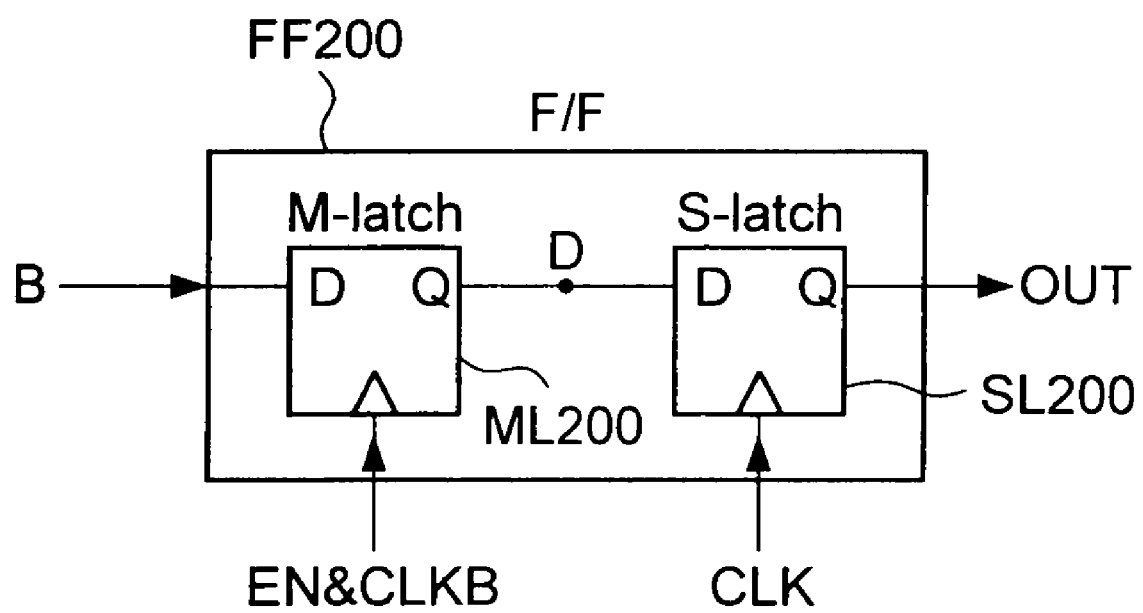
FIG. 40 shows a circuit configuration in which the high through latch circuit is omitted from the circuit in FIG. 38.

If the high through latch circuit HTL200 is omitted based on the table in FIG. 39, such a circuit configuration as shown in FIG. 40 is obtained. Namely, the output from the combinational logic circuit is inputted to the mater latch circuit ML200, and a signal obtained by performing a logical AND between the circuit control signal EN and the inverted clock signal CLKB is inputted to the control terminal of the master latch circuit ML200.

FIG. 41 shows the relation between logic levels of the circuit control signal EN and the clock signal CLK and logic levels of the nodes B and D and the output signal OUT in the flip-flop circuit FF200 in FIG. 39 in tabular form. As can be seen from a comparison between FIG. 41 and FIG. 39, the logic levels of the nodes B and C and the output signal OUT with respect to the logic levels of the circuit control signal EN and the clock signal CLK are the same in these two figures. From this, it is found that by inputting the signal obtained by performing the logical AND between the circuit control signal EN and the inverted clock signal CLKB to the control terminal of the master latch circuit ML200, the high through latch circuit HTL200 can be omitted.

Figure 42:
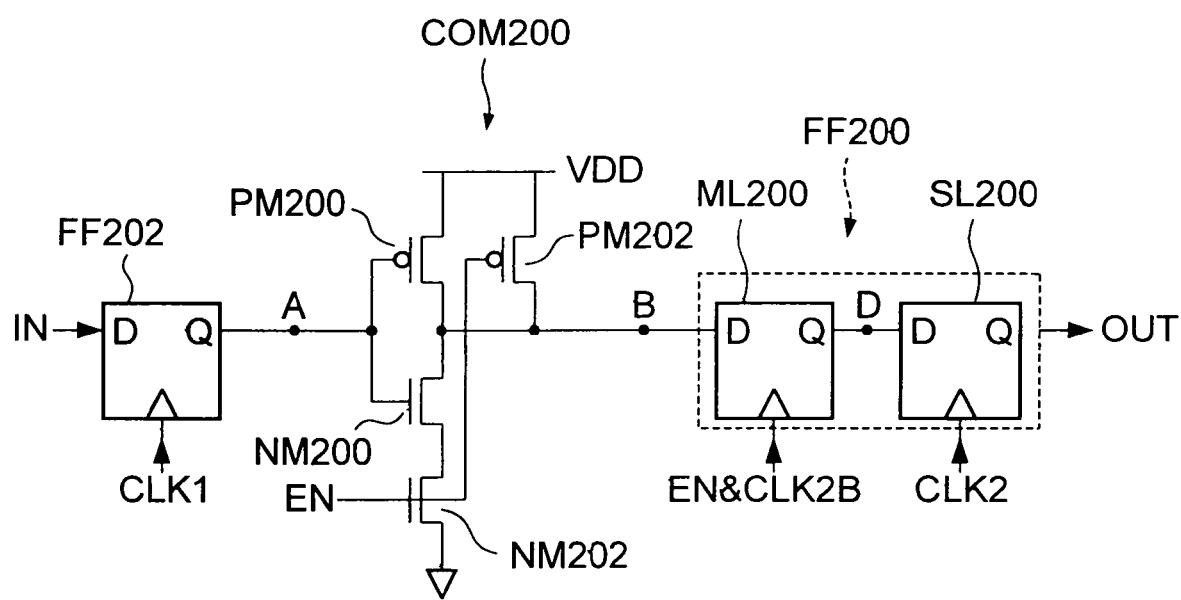
FIG. 42 shows a circuit configuration of a semiconductor integrated circuit in which a flip-flop circuit in FIG. 40 is used at a stage subsequent to a combinational logic circuit.

FIG. 42 shows a circuit diagram in which an output signal of a combinational logic circuit COM200 is inputted to the flip-flop circuit FF200 shown in FIG. 40. The configuration of a logic cell of the combinational logic circuit COM200 is arbitrary, and FIG. 42 shows an example in which it is configured by N-type MOS transistors NM200 and NM202 and P-type MOS transistors PM200 and PM202. The N-type MOS transistor NM202 forms a foot switch, and the P-type MOS transistor PM202 forms a pull-up transistor.

A flip-flop circuit FF202 is provided at a stage previous to the combinational logic circuit COM200. The input signal IN is inputted to a data input terminal D of the flip-flop circuit 202. The clock signal CLK1 is inputted to a control terminal thereof, and the input signal IN is outputted from a data output terminal Q in synchronization with this clock signal CLK1 and inputted to the combinational logic circuit COM200.

Figure 43:
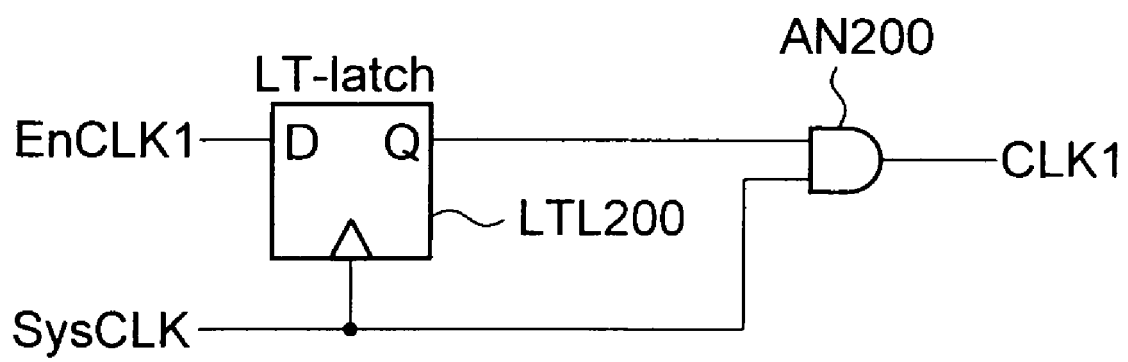
FIG. 43 shows an example of a circuit configuration of a clock gating circuit which generates a clock signal in the semiconductor integrated circuit in FIG. 42.

The clock signal CLK1 is generated by a clock gating circuit such as shown in FIG. 43. Namely, it is generated by the clock gating circuit including a low through latch circuit LTL200 to which a clock control signal EnCLK1 and the system clock signal SysCLK are inputted and an AND circuit AN200 to which an output signal of the low through latch circuit LTL200 and the system clock signal SysCLK are inputted.

In the combinational logic circuit COM200 in FIG. 42, an operation of inverting an input signal is performed as a predetermined operation, and an output signal is inputted to the flip-flop circuit FF200. In the flip-flop circuit FF200, the clock signal CLK2 is inputted to the control terminal of the slave latch circuit SL200. A signal obtained by performing a logical AND between the circuit control signal EN and an inverted clock signal CLK2B obtained by inverting the clock signal CLK2 is inputted to the control terminal of the master latch circuit ML200.

Figure 44:
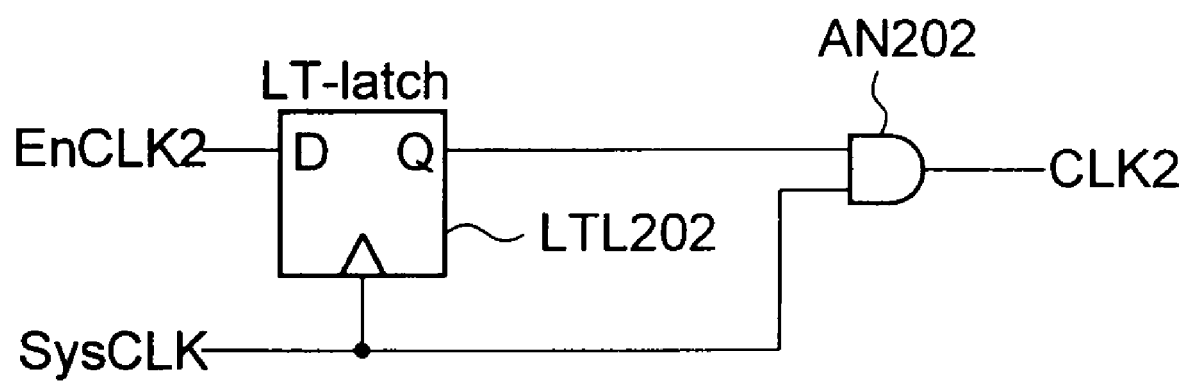
FIG. 44 shows an example of a circuit configuration of a clock gating circuit which generates a clock signal in the semiconductor integrated circuit in FIG. 42.

The clock signal CLK2 is generated by a clock gating circuit such as shown in FIG. 44. Namely, it is generated by the clock gating circuit including a low through latch circuit LTL202 to which a clock control signal EnCLK2 and the system clock signal SysCLK are inputted and an AND circuit AN202 to which an output signal of the low through latch circuit LTL202 and the system clock signal SysCLK are inputted. Here it is assumed that the clock control signal EnCLK1 and the clock control signal EnCLK2 are separate control signals.

Figure 45:
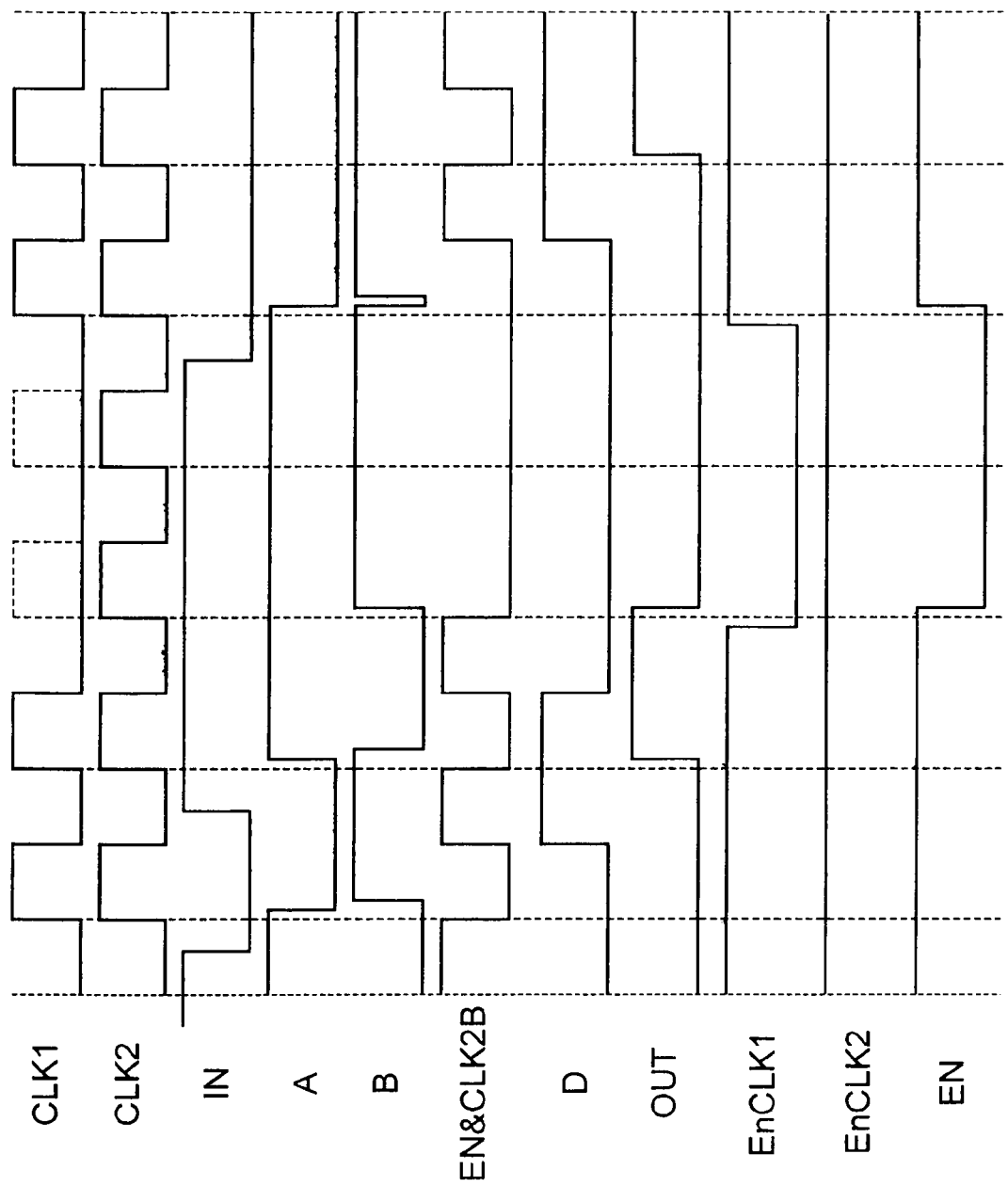
FIG. 45 shows an example of an operation timing chart of the semiconductor integrated circuit in FIG. 42.

FIG. 45 shows an operation timing chart of a semiconductor integrated circuit shown in FIG. 42. As shown in FIG. 45, the correct output signal OUT is outputted from the flip-flop circuit FF200 although the high through latch circuit HTL200 is omitted. More specifically, if the logic level of the node B changes, the logic level of the output signal OUT changes in the next clock cycle. If the circuit control signal EN goes low and enters the sleep mode, the output signal of the flip-flop circuit FF200 is fixed low.

Figure 46:
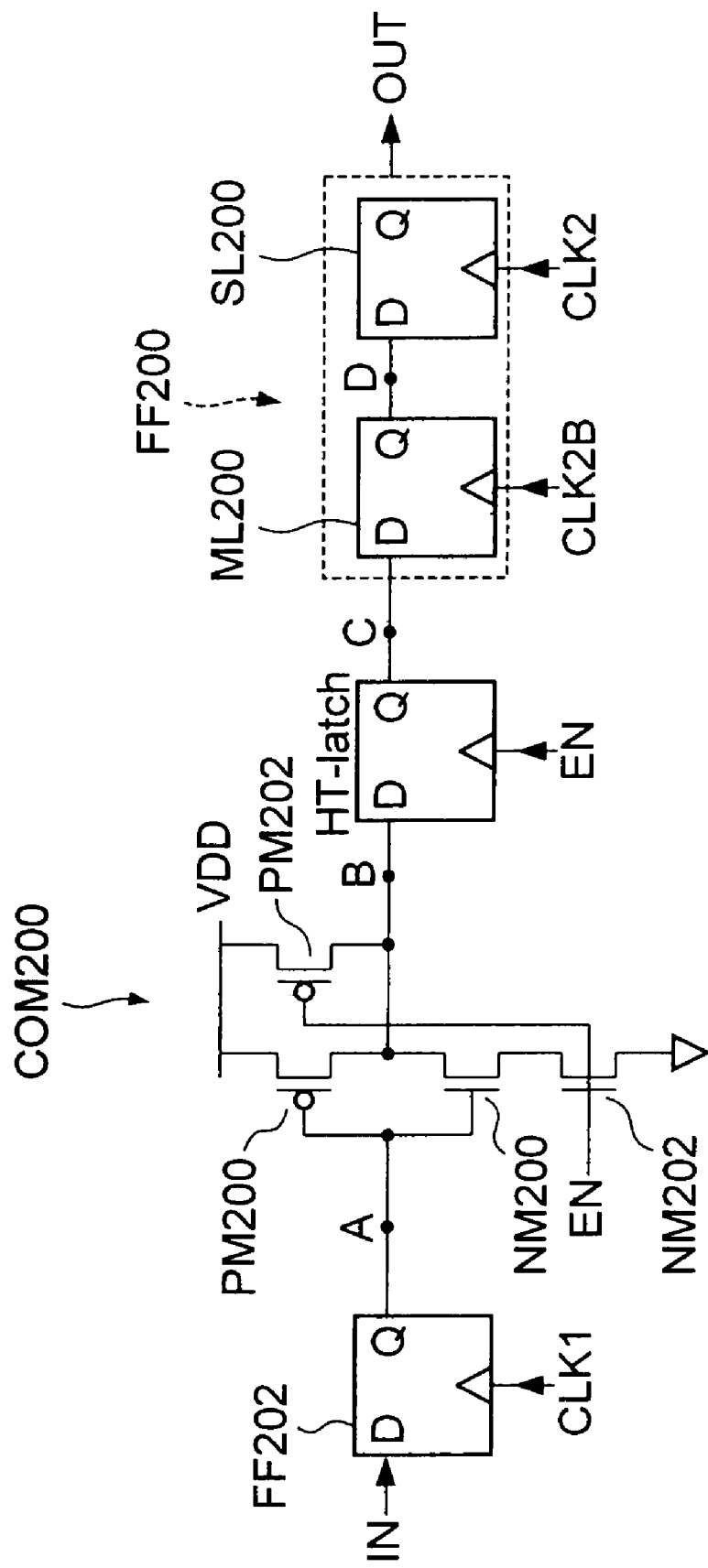
FIG. 46 shows a circuit configuration of a semiconductor integrated circuit in which the high through latch circuit and the flip-flop circuit in FIG. 38 are used at a stage subsequent to the combinational logic circuit.
Figure 47:
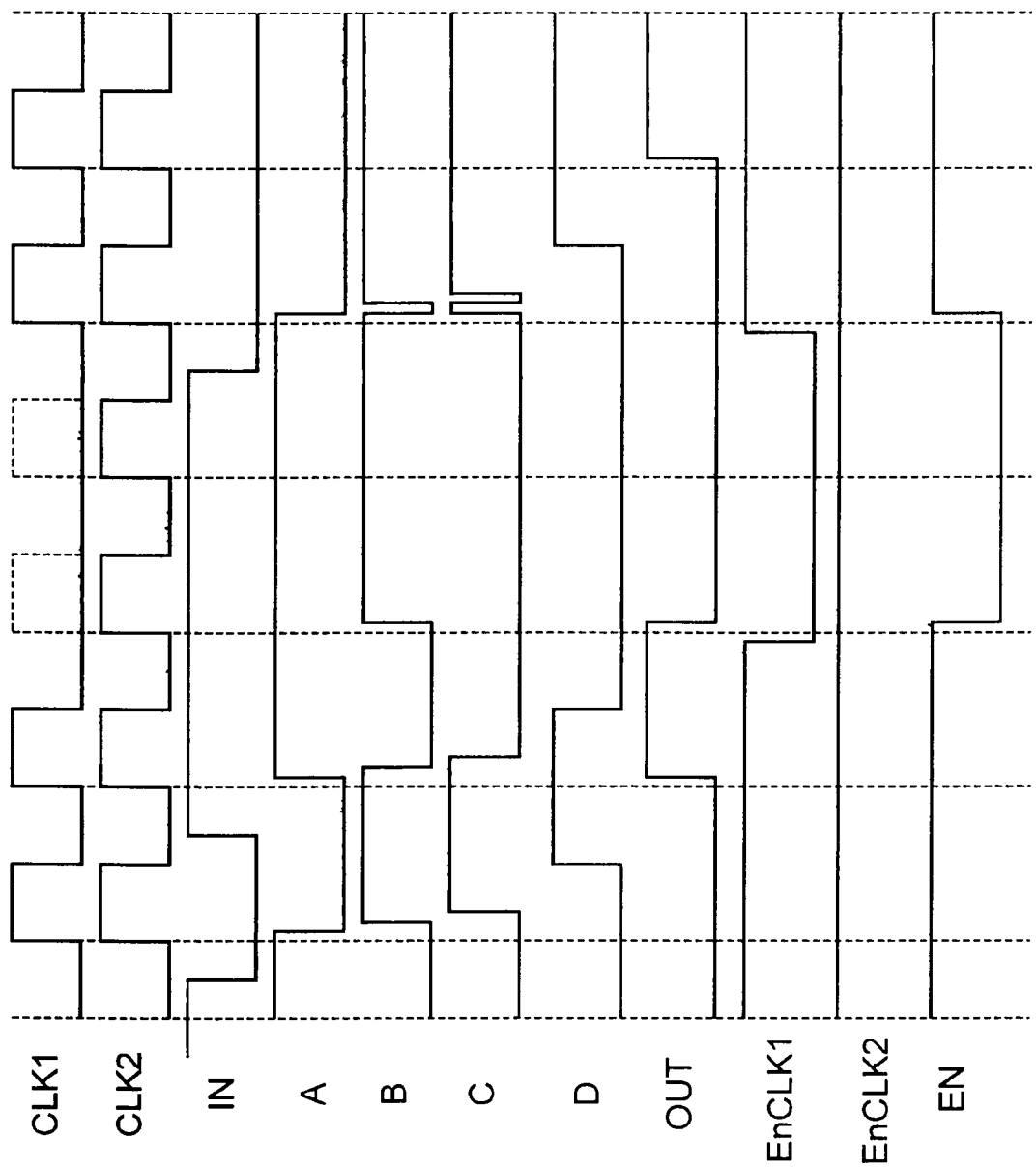
FIG. 47 shows an example of an operation timing chart of the semiconductor integrated circuit in FIG. 46.

FIG. 46 shows a circuit diagram in which the high through latch circuit HTL200 is not omitted in the semiconductor integrated circuit shown in FIG. 42, and FIG. 47 shows an operation timing chart of a semiconductor integrated circuit shown in FIG. 46. As shown in these figures, the output signal OUT of the semiconductor integrated circuit from which the high through latch circuit HTL200 is not omitted and the output signal OUT of the semiconductor integrated circuit from which the high through latch circuit HTL200 is omitted become the same. Accordingly, it is known that even if the high through latch circuit HTL200 is omitted, there is no problem in terms of circuit operation.

Here, in the operation timing chart in FIG. 45, an explanation is given with the case where the clock signal CLK1 and the clock signal CLK2 are separate signals and their waveforms are different in the semiconductor integrated circuit in FIG. 42 as an example, but a case where these clock signal CLK1 and clock signal CLK2 have the same waveform is also conceivable. More specifically, a case where the clock signal CLK2 is a signal which enters the sleep mode similarly to the clock signal CLK1 is also conceivable. Accordingly, the operation when these clock signal CLK1 and clock signal CLK2 are the same will be verified next.

Figure 48:
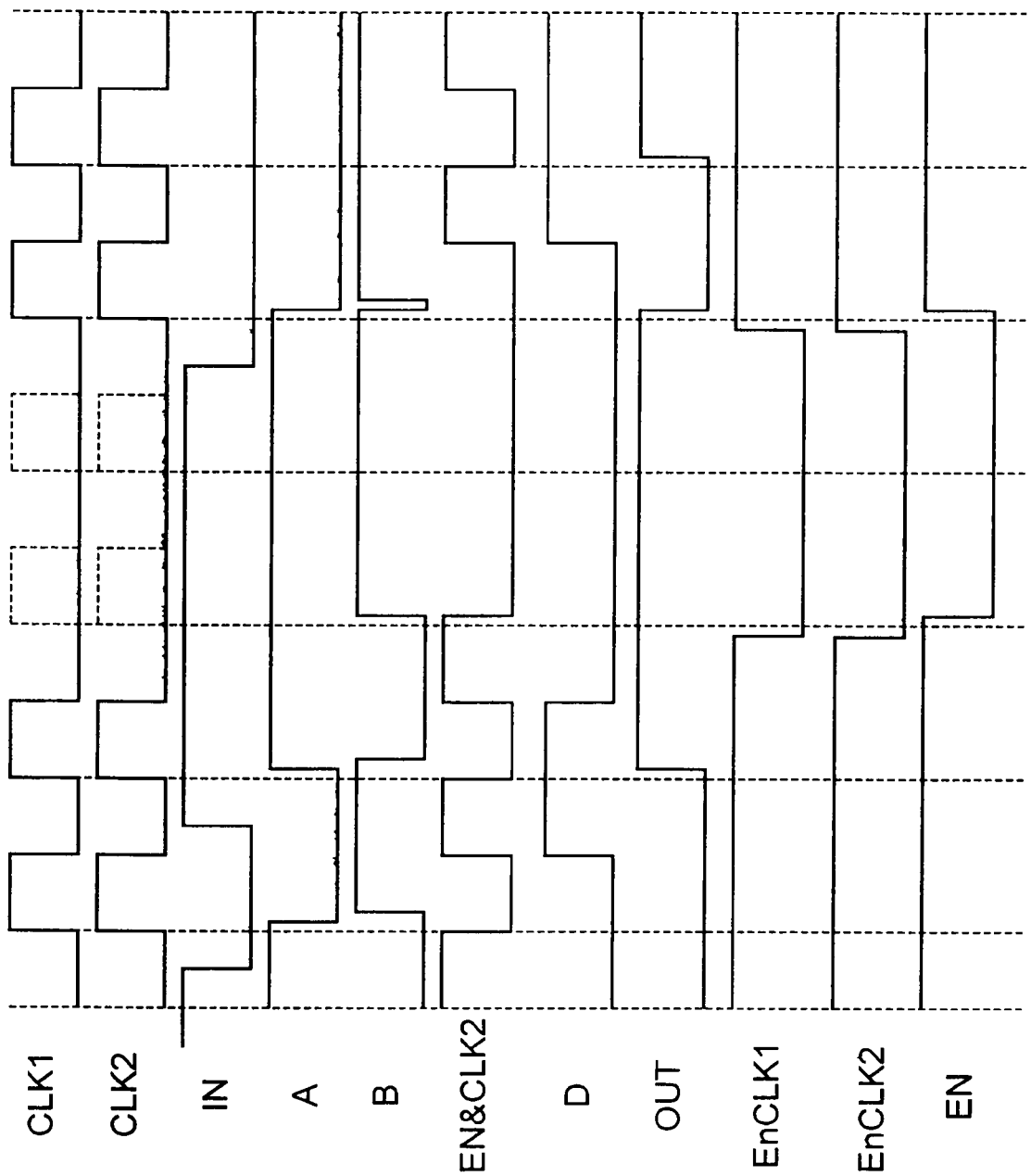
FIG. 48 shows an example of an operation timing chart when clock signals with the same waveform are used in the semiconductor integrated circuit in FIG. 42.
Figure 49:
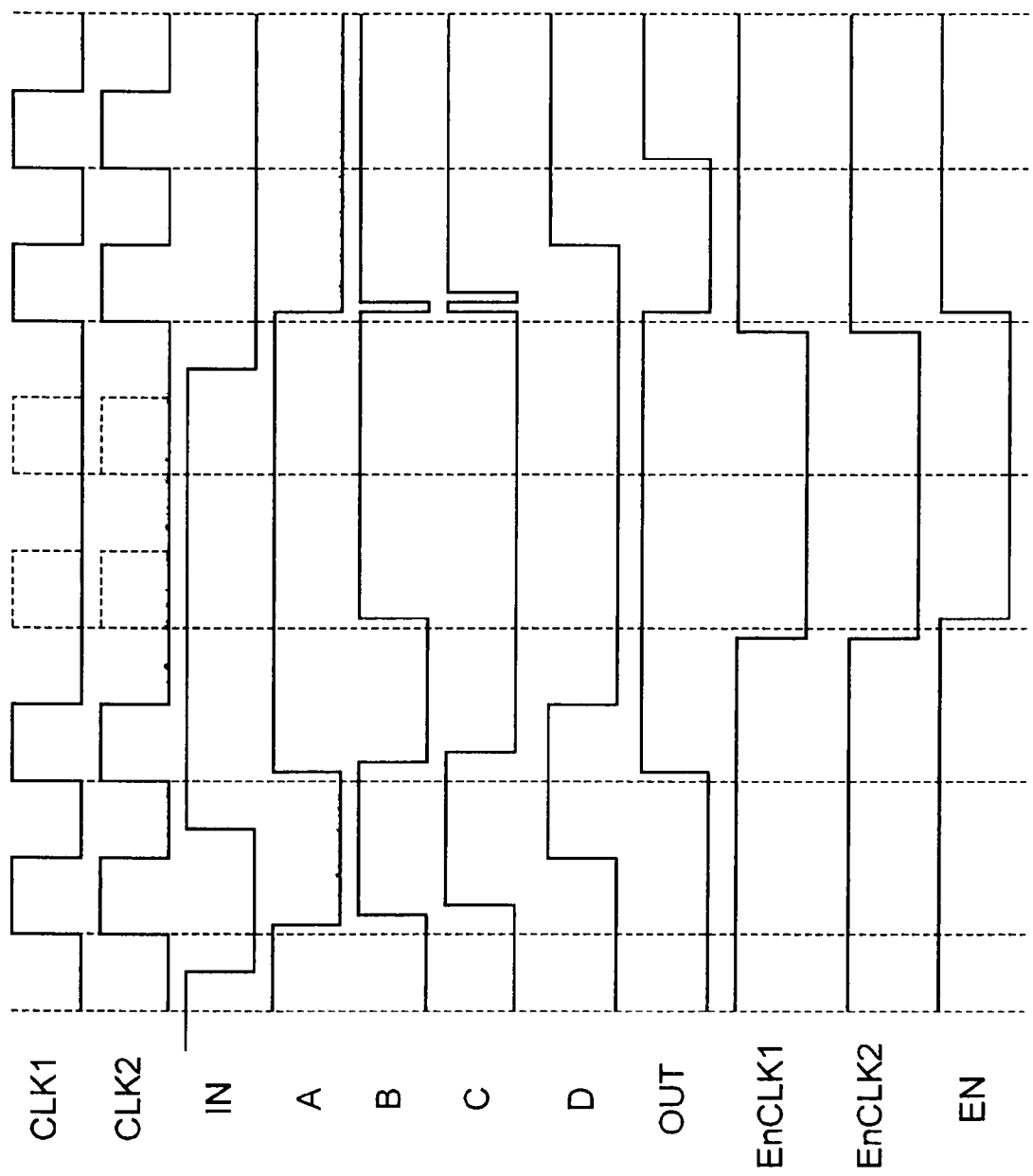
FIG. 49 shows an example of an operation timing chart when clock signals with the same waveform are used in the semiconductor integrated circuit in FIG. 46.

FIG. 48 shows an operation timing chart when the clock signal CLK1 and the clock signal CLK2 having the same waveform are used in the semiconductor integrated circuit in FIG. 42. FIG. 49 shows an operation timing chart when the clock signal CLK1 and the clock signal CLK2 having the same waveform are used in the semiconductor integrated circuit in FIG. 46.

As is clear from a comparison between FIG. 48 and FIG. 49, also when the clock signal CLK1 and the clock signal CLK2 having the same waveform are used, the output signal OUT of the semiconductor integrated circuit in FIG. 42 becomes the same as the output signal OUT of the semiconductor integrated circuit in FIG. 46. Accordingly, it is known that also in the case of the clock signal CLK1 and the clock signal CLK2 having the same waveform, even if the high through latch circuit HTL200 is omitted, there is no problem in terms of circuit operation.

Figure 50:
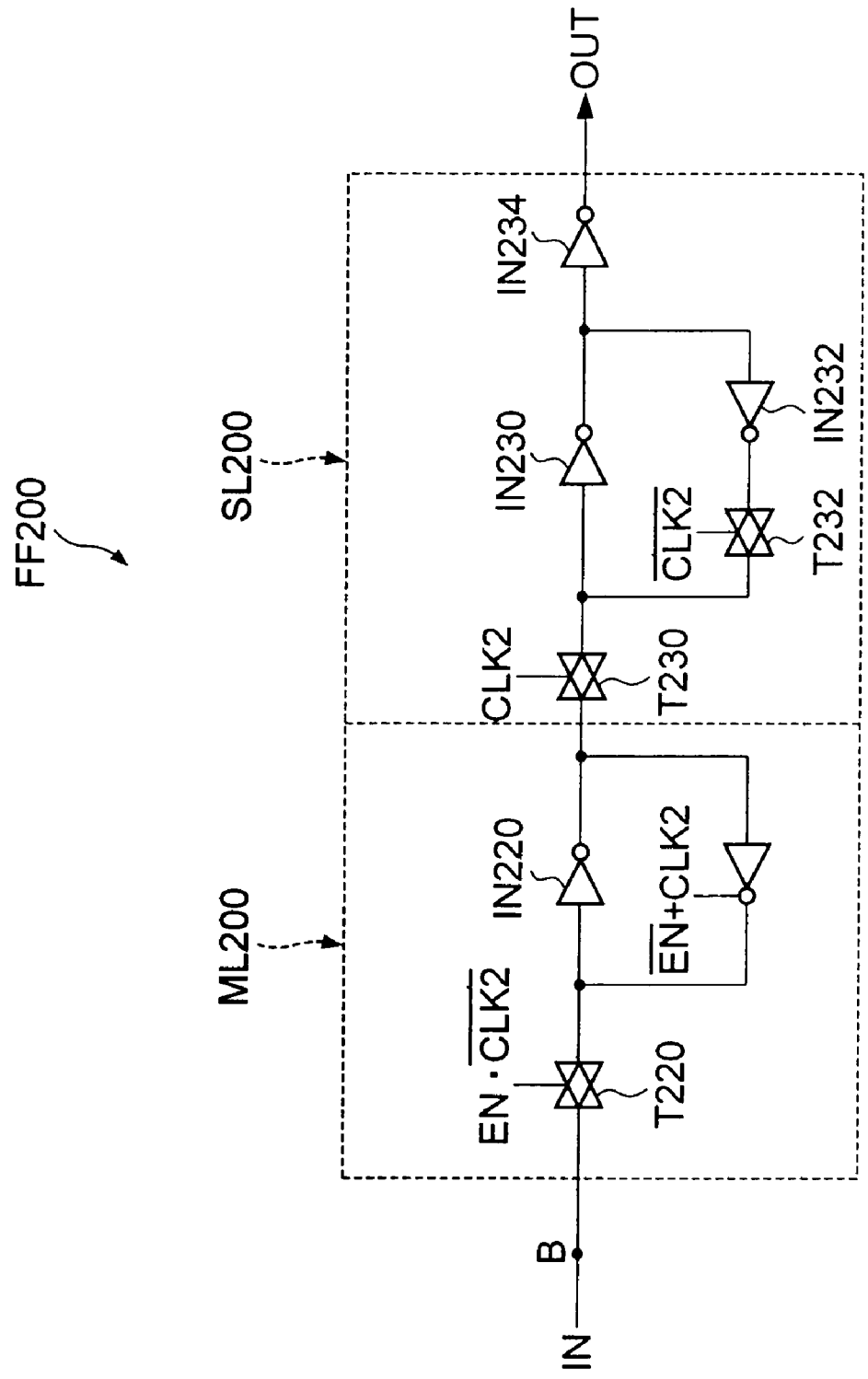
FIG. 50 shows an example of a specific circuit configuration of the flip-flop circuit in FIG. 40.

FIG. 50 shows an example of a specific circuit configuration of the flip-flop circuit FF200 in the semiconductor integrated circuit shown in FIG. 42. As shown in FIG. 50, in the flip-flop circuit FF200, the master latch circuit ML200 includes a transfer gate T220, an inverter IN220, and a clocked inverter IN222. The slave latch circuit SL200 includes a transfer gate T230, a transfer gate T232, and inverters IN230, IN232, and IN234.

A signal obtained by performing a logical AND between the above circuit control signal EN and the inverted clock signal CLK2B is inputted to the transfer gate T220 of the master latch circuit ML200. On the other hand, a signal obtained by performing a logical OR between a signal obtained by inverting the circuit control signal EN and the clock signal CLK2 is inputted to the inverter IN222. In other words, a signal obtained by inverting a signal obtained by performing a logical AND between the circuit control signal EN and the inverted clock signal CLK2B is inputted to the inverter IN222.

The clock signal CLK2 is inputted to the transfer gate T230 of the slave latch circuit SL200. The inverted cock signal CLK2B is inputted to the transfer gate T232.

In the flip-flop circuit FF200 thus configured, as described above, the input signal IN outputted from the combinational logic circuit COM200 is inputted to the transfer gate T220 via the node B, and the output signal OUT is outputted from the inverter IN234.

Figure 51:
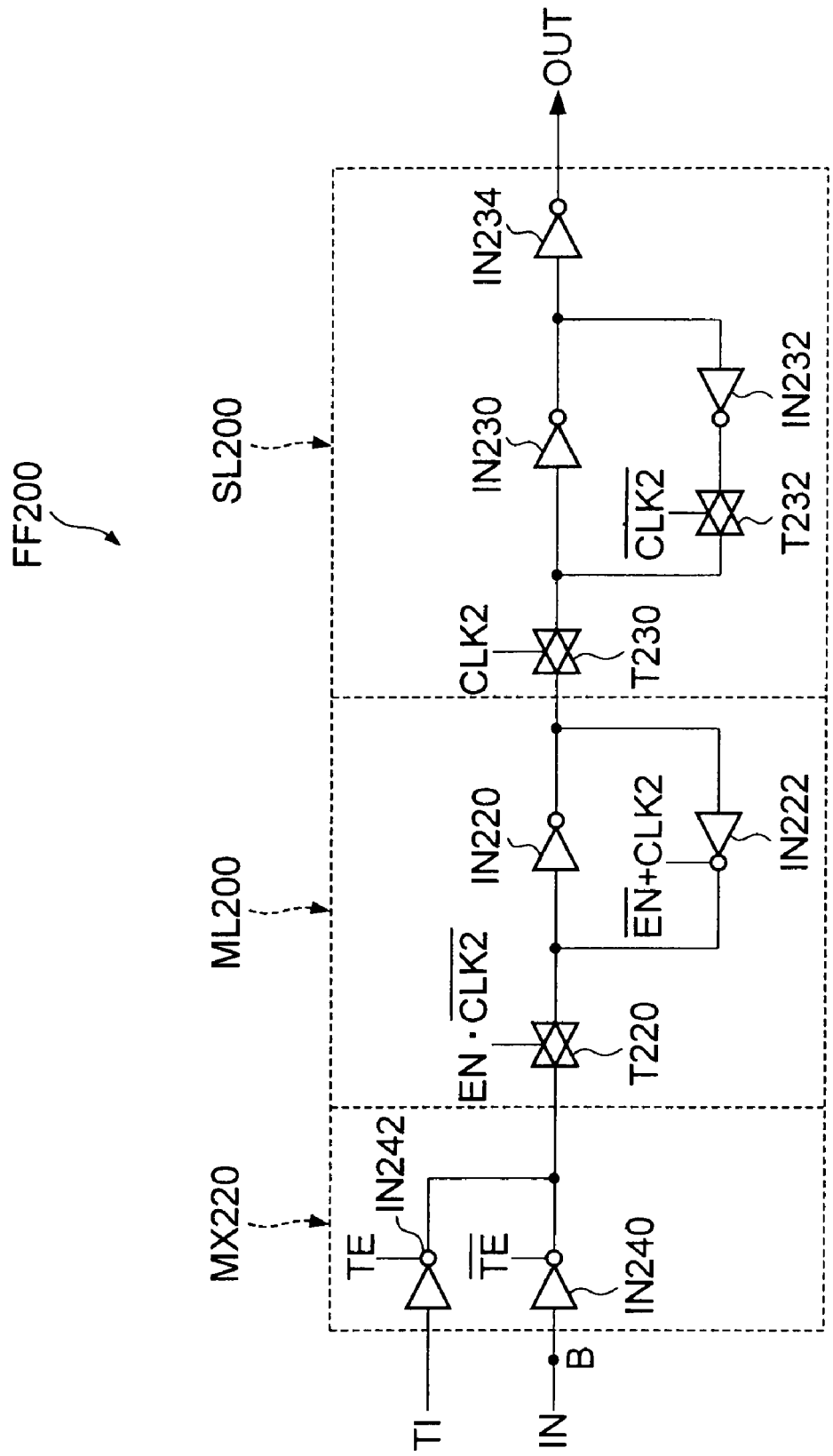
FIG. 51 shows an example of a circuit configuration when a test function is added to the flip-flop circuit in FIG. 50.

FIG. 51 shows an example of a circuit configuration of the flip-flop circuit FF200 when a test function is added to the flip-flop circuit FF200 in FIG. 50. As shown in FIG. 51, in the flip-flop circuit FF200 to which the test function is added, a multiplexer MX220 is provided at a stage previous to the master latch circuit ML200.

The multiplexer MX220 includes clocked inverters IN240 and IN242. The test enable signal TE is inputted to the clocked inverter IN242, and an inverted test enable signal /TE obtained by inverting the test enable signal TE is inputted to the clocked inverter IN240. Hence, the clocked inverters IN240 and IN242 are alternatively gated by the test enable signal TE and the test enable signal /TE.

The input signal IN outputted from the combinational logic circuit COM200 is inputted to the clocked inverter IN240, and the test signal TI is inputted to the clocked inverter IN242. Accordingly, when the test signal TE is high (namely, in a test operation), the test signal TI inputted to the clocked inverter IN242 is inputted to the master latch circuit ML200, and when the test enable signal TE is low (namely, in the normal operation), the input signal IN from the combinational logic circuit COM200 inputted to the clocked inverter IN240 is inputted to the master latch circuit ML200. From this it can be seen that the flip-flop circuit FF200 having the test function can be realized.

As just described, according to the semiconductor integrated circuit of this embodiment, as shown in FIG. 42, the high through latch circuit HTL200 can be omitted. As a result, the number of transistors can be reduced, and the circuit area can be reduced. Moreover, the master latch circuit ML200 of the flip-flop circuit FF200 has also a function of holding the level of the input signal, so that when the semiconductor integrated circuit is tested, the same test signal as in the normal test of the flip-flop circuit is required to be applied. Consequently, testability is improved compared with when the high through latch circuit HTL200 exists.

Nineteenth Embodiment

In the above embodiments, the output of the combinational logic circuit is fixed high in the sleep mode. For example, in the above first embodiment, as shown in FIG. 1 and FIG. 2, the node E as the output of the combinational logic circuit COM10 is forcibly driven high by the P-type MOS transistor PM13 during the sleep mode (while the circuit control signal EN is low).

However, if the output of the combinational logic circuit COM10 is directed to a clock gating circuit which controls the supply and stop of a clock signal, or the like, the supply of the clock signal is continued without being stopped although normally the supply of the clock signal must be stopped because of the sleep mode since the output of the node E is high. Namely, the clock gating circuit comes to supply the clock signal unconditionally due to the pull-up of the P-type MOS transistor PM13.

Figure 52:
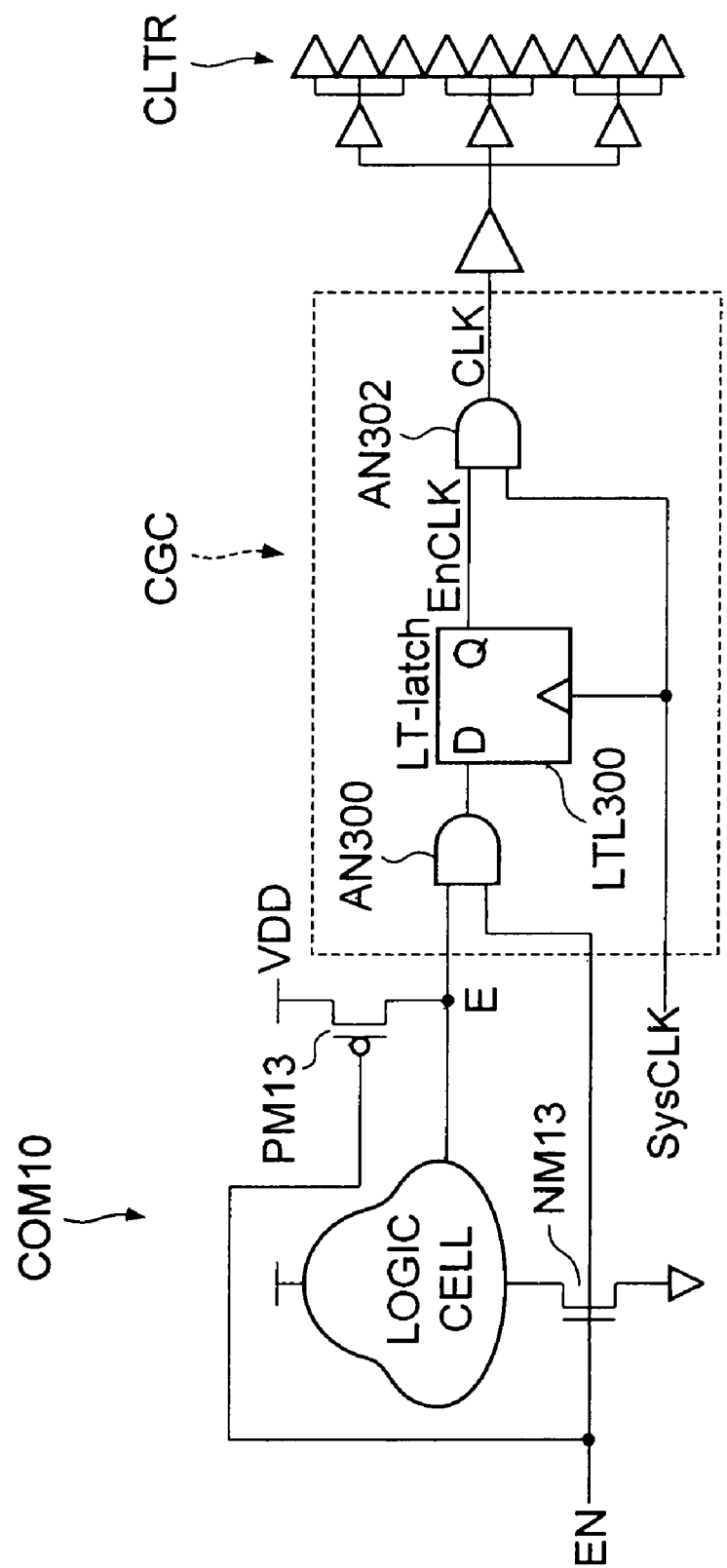
FIG. 52 shows an example of a circuit configuration of a clock gating circuit to which a signal outputted from a combinational logic circuit including a pull-up transistor is inputted.

Hence, in this embodiment, as shown in FIG. 52, a logical AND between the output of the combinational logic circuit COM10 and the circuit control signal EN is performed, and a clock gating circuit CGC is controlled by a signal obtained by performing the logical AND.

More specifically, as shown in FIG. 52, in this embodiment, the clock gating circuit CGC includes AND circuits AN300 and AN302 and a low through latch circuit LTL300. The combinational logic circuit COM10 is configured by various combinations of logic cells, and in FIG. 52, the pull-up P-type MOS transistor PM13 and the N-type MOS transistor NM13 as the foot switch in the last stage of the combinational logic circuit COM10 are shown. This combinational logic circuit COM10 is configured, for example, as shown in FIG. 1.

As shown in FIG. 52, a signal at the node E as the output of the logic circuit COM10 and the circuit control signal EN inputted also to the control terminal of the N-type MOS transistor NM13 are inputted to the AND circuit AN300 of the clock gating circuit CGC. An output signal of the AND circuit AN300 is inputted to a data input terminal D of the low through latch circuit LTL300. This AND circuit AN300 forms a first gating logic circuit in this embodiment, and the AND circuit is an example of the first gating logic circuit.

The system clock signal SysCLK is inputted to a control terminal of the low through latch circuit LTL300. Therefore, while the system clock signal SysCLK is low, the clock control signal EnCLK inputted from the data input terminal D is outputted from a data output terminal Q, but while the system clock signal SysCLK is high, the clock control signal EnCLK which holds its immediately preceding level is outputted from the data output terminal Q.

The clock control signal EnCLK is inputted to the AND circuit AN302. The system clock signal SysCLK is also inputted to the AND circuit AN302. An output of the AND circuit AN302 is supplied as the clock signal CLK to a subsequent-stage clock tree CLTR. This AND circuit AN302 forms a second gating logic circuit in this embodiment, and the AND circuit is an example of the second gating circuit.

As can be seen from this configuration, if the clock gating circuit CGC in FIG. 52 is used, the same logic value as the output of the combinational logic circuit COM10 is inputted to the data input terminal D of the low through latch circuit LTL300 when the circuit control signal EN is high (namely, in the active mode). Consequently, the clock signal CLK synchronized with the system clock signal SysCLK is outputted from the AND circuit AN302.

On the other hand, when the circuit control signal EN is low (namely, in the sleep mode), the output of the AND circuit AN300 goes low regardless of the output of the combinational logic circuit COM10, and the low-level signal is inputted to the data input terminal D of the low through latch circuit LTL300. Consequently, the output of the low through latch circuit LTL300 is also fixed low, and the output of the clock gating circuit CGC is also fixed low. This makes it possible to stop the supply of the clock signal to the subsequent-stage clock tree CLTR.

As can be seen from this, this embodiment is effective when the clock signal CLK is stopped in a low-level state when the combinational logic circuit COM10 is brought into the sleep mode.

Twentieth Embodiment

The above embodiment is effective when there is a regularity that in the sleep mode, the input to and output from the low through latch circuit LTL300 goes low and the output of the clock gating circuit CGC also goes low, but in some cases, such a regularity does not exist. In this embodiment, the configuration of the clock gating circuit CGC when such a regularity does not exist will be described.

Figure 53:
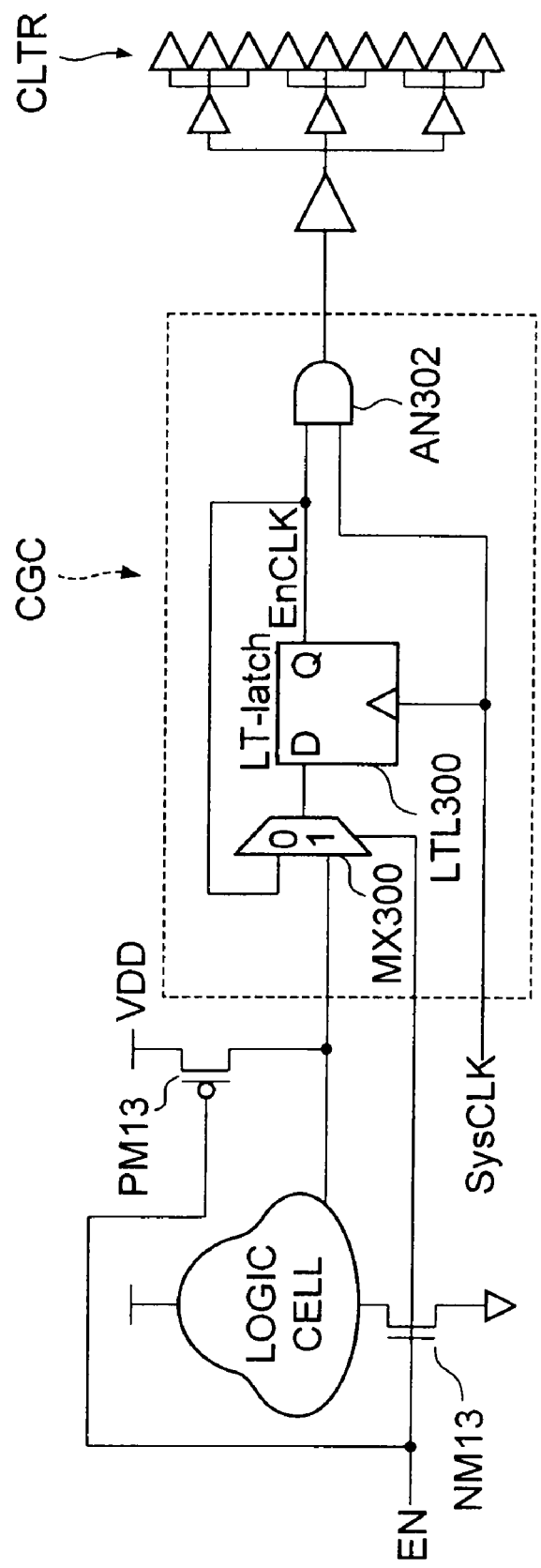
FIG. 53 shows a modified example of the clock gating circuit in FIG. 52.

FIG. 53 shows the combinational logic circuit COM10 according to this embodiment, the clock gating circuit CGC to gate the system clock signal SysCLK using the output of the combinational logic circuit COM10, and the clock tree CLTR which receives the supply of the clock signal CLK from the clock gating circuit CGC.

Portions different from the above embodiment will be described. The clock gating circuit CGC includes a multiplexer MX300 in place of the AND circuit AN300. The output signal of the combinational logic circuit COM10 and the clock control signal EnCLK being an output signal of the low through latch circuit LTL300 are inputted to the multiplexer MX300. The circuit control signal EN is inputted to a control terminal of the multiplexer MX300. The AND circuit AN302 forms a third gating logic circuit in this embodiment, and the AND circuit is an example of the third gating logic circuit.

As can be seen from this configuration, if the clock gating circuit CGC in FIG. 53 is used, the multiplexer MX300 outputs an input from the combinational logic circuit COM10 to the low through latch circuit LTL when the circuit control signal EN is high (namely, in the active mode), so that the same logic value as the output of the combinational logic circuit COM10 is inputted to the data input terminal D of the low through latch circuit LTL300. Therefore, the clock signal CLK synchronized with the system clock signal SysCLK is outputted form the AND circuit AN302.

On the other hand, when the circuit control signal EN is low (namely, in the sleep mode), the multiplexer MX300 outputs the clock control signal EnCLK inputted from the low through latch circuit LTL300 to the low through latch circuit LTL300. Therefore, the output of the low through latch circuit LTL300 becomes the input of the low through latch circuit LTL300, so that the output of the low through latch circuit LTL300 becomes unchanged.

Hence, this embodiment can be applied to a case where the regularity that the clock control signal EnCLK is always stopped in a low-level state in the sleep mode does not exist. When the clock control signal EnCLK enters the sleep mode in the low-level state, the supply of the clock signal CLK to the clock tree CLTK can be stopped.

Figure 54:
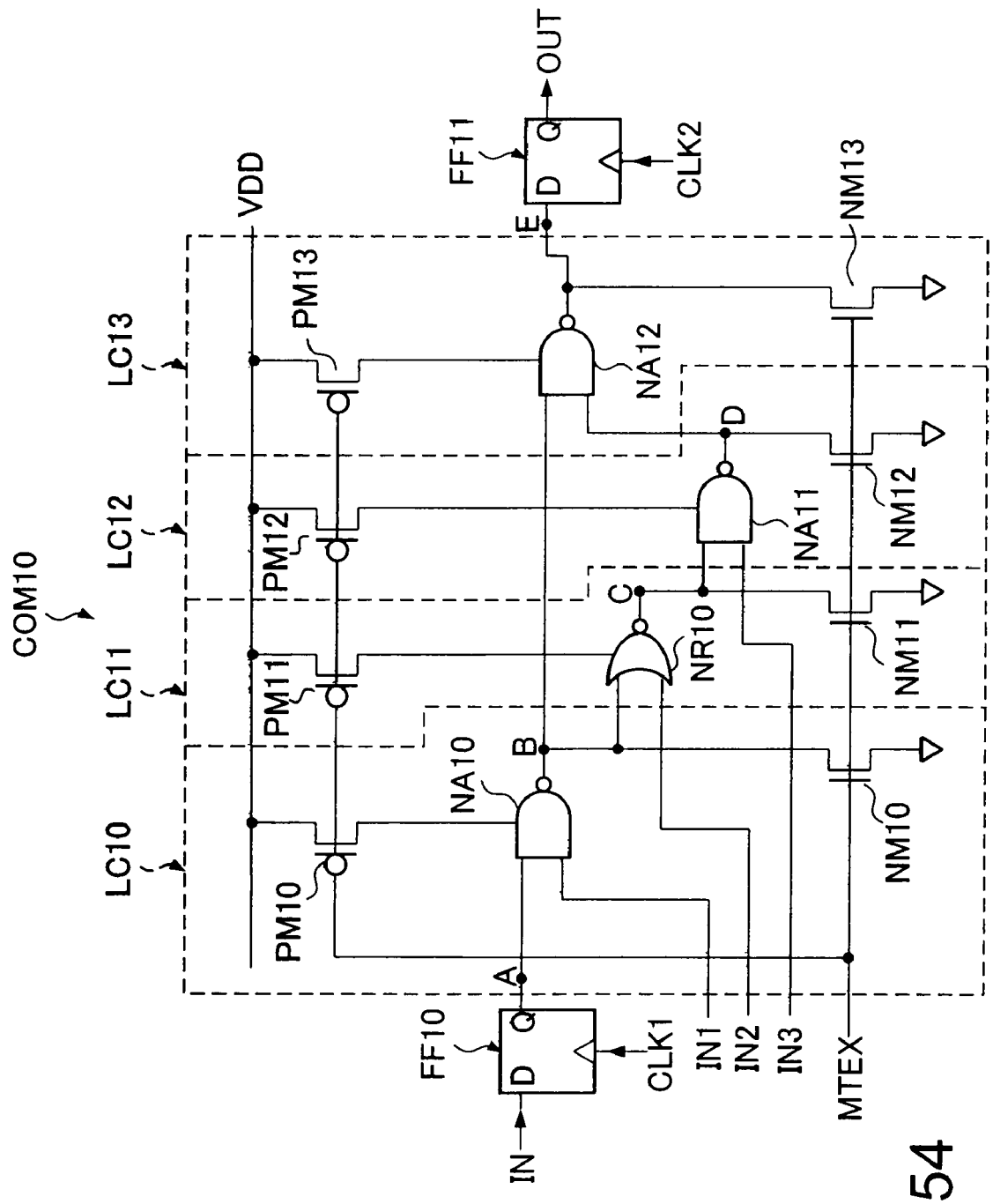
FIG. 54 shows an example in which the pull-up type semiconductor integrated circuit device shown in FIG. 1 is modified into a pull-down type one.
Figure 55:
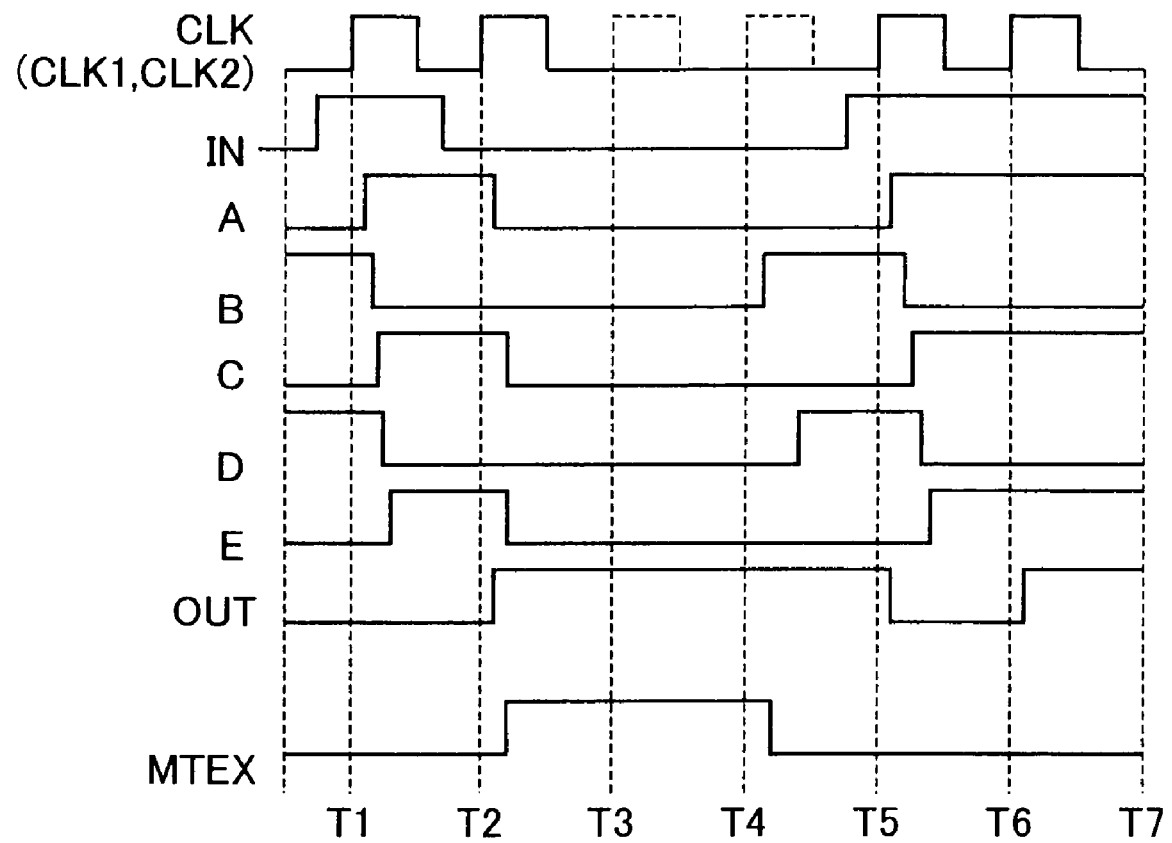
FIG. 55 shows an example of an operation timing chart of the semiconductor integrated circuit device shown in FIG. 54.

It should be mentioned that the present invention is not limited to the above respective embodiments, and various changes may be made therein. For example, in the above embodiments, the present invention is realized by the pull-up configuration using the P-type MOS transistor, but the present invention may be realized by a pull-down configuration using the N-type MOS transistor. If the present invention is realized by the pull-down configuration, for example, the semiconductor integrated circuit device in the above first embodiment comes to have a circuit configuration such as shown in FIG. 54. FIG. 55 shows an operation timing chart in this case. More specifically, in the sleep mode between the time T2 and the time T4, the P-type MOS transistors PM10 to PM13 are turned off so that the node B to the node E as the outputs of the respective logic cells LC10 to LC13 are pulled down low and the leakage current does not flow.

Moreover, the MOS transistor forming the combinational logic circuit in the above embodiments is an example of a MIS transistor (Metal Insulator Semiconductor Transistor), and some other kind of MIS transistor is also available.

What is claimed is:

1. A semiconductor integrated circuit device comprising:
   a first flip-flop circuit which outputs a clock control data signal inputted from its outside as a clock control signal in synchronization with a first clock signal;
   a first logic circuit to which the clock control signal and the first clock signal are inputted and which outputs a second clock signal;
   a second logic circuit to which the clock control signal is inputted and which inverts the clock control signal and outputs the inverted clock control signal as a circuit control signal;
   a first standard cell which comprises at least one input including a first input and a first output and which outputs a first output signal from the first output;
   a first conductivity-type transistor, the circuit control signal being inputted to a gate of the first conductivity-type transistor, one of a source and a drain of the first conductivity-type transistor being connected to a first power supply, and the other of the source and the drain of the first conductivity-type transistor being connected to the first output;
   a second conductivity-type transistor, the circuit control signal being inputted to a gate of the second conductivity-type transistor, one of a source and a drain of the second conductivity-type transistor being connected to a second power supply, and the second conductivity-type transistor being provided in a power current conducting path of the first standard cell between the first power supply and the second power supply;
   a second standard cell which comprises at least one input including a second input and a second output, the first output signal or a result of a predetermined logical operation based on the first output signal being inputted to the second input, and a second output signal being outputted from the second output; and
   a second flip-flop circuit to which the second output signal is inputted and which outputs the second output signal in synchronization with the second clock signal.

2. The semiconductor integrated circuit device according to claim 1, wherein the circuit control signal is changed to a high level or a low level in response to a rising edge or a falling edge of the first clock signal.

3. The semiconductor integrated circuit device according to claim 1, wherein the first standard cell includes a MOS transistor.

4. The semiconductor integrated circuit device according to claim 3, wherein a threshold voltage of the second conductivity-type transistor is higher than that of the MOS transistor of the first standard cell.

5. The semiconductor integrated circuit device according to claim 4, wherein a threshold voltage of the first conductivity-type transistor is substantially equal to or lower than that of the second conductivity-type transistor.

6. The semiconductor integrated circuit device according to claim 4, wherein a gate width of the first conductivity-type transistor is smaller than that of the MOS transistor of the first standard cell.

7. The semiconductor integrated circuit device according to claim 1, wherein the first conductivity-type transistor is a P-type MOS transistor and the second conductivity-type transistor is an N-type MOS transistor.

8. The semiconductor integrated circuit device according to claim 1, wherein the semiconductor integrated circuit device is configured so that a timing difference between the second clock signal and the circuit control signal does not occur.

9. The semiconductor integrated circuit device according to claim 1, wherein the second flip-flop circuit brings in the second output signal and outputs the second output signal when the second clock signal is changed from a low level to a high level.

10. The semiconductor integrated circuit device according to claim 1, further comprising a third flip-flop circuit which outputs an input signal inputted from its outside as a fourth output signal in synchronization with a third clock signal, the fourth output signal or a result of a predetermined logical operation based on the fourth output signal being inputted to the first input.

11. A semiconductor integrated circuit device comprising:
a first flip-flop circuit which outputs a clock control data signal inputted from its outside as a clock control signal in synchronization with a first clock signal;
a first logic circuit to which the clock control signal and the first clock signal are inputted and which outputs a second clock signal;
a second logic circuit to which the clock control signal is inputted and which inverts the clock control signal and outputs the inverted clock control signal as a circuit control signal;
a second flip-flop circuit which outputs an input signal inputted from its outside as a first synchronization signal in synchronization with a second clock signal;
a first standard cell which comprises at least one input including a first input and a first output, the first synchronization signal or a result of a predetermined logical operation based on the first synchronization signal being inputted to the first input, and a first output signal being outputted from the first output;
a first conductivity-type transistor, the circuit control signal being inputted to a gate of the first conductivity-type transistor, one of a source and a drain of the first conductivity-type transistor being connected to a first power supply, and the other of the source and the drain of the first conductivity-type transistor being connected to the first output;
a second conductivity-type transistor, the circuit control signal being inputted to a gate of the second conductivity-type transistor, one of a source and a drain of the second conductivity-type transistor being connected to a second power supply, and the second conductivity-type transistor being provided in a power current conducting path of the first standard cell between the first power supply and the second power supply; and
a second standard cell which comprises at least one input including a second input and a second output, the first output signal or a result of a predetermined logical operation based on the first output signal being inputted to the second input, and a second output signal being outputted from the second output.

12. The semiconductor integrated circuit device according to claim 11, wherein the circuit control signal is changed to a high level or a low level in response to a rising edge or a falling edge of the first clock signal.

13. The semiconductor integrated circuit device according to claim 11, wherein the first standard cell includes a MOS transistor.

14. The semiconductor integrated circuit device according to claim 13, wherein a threshold voltage of the second conductivity-type transistor is higher than that of the MOS transistor of the first standard cell.

15. The semiconductor integrated circuit device according to claim 14, wherein a threshold voltage of the first conductivity-type transistor is substantially equal to or lower than that of the second conductivity-type transistor.

16. The semiconductor integrated circuit device according to claim 14, wherein a gate width of the first conductivity-type transistor is smaller than that of the MOS transistor of the first standard cell.

17. The semiconductor integrated circuit device according to claim 11, wherein the first conductivity-type transistor is a P-type MOS transistor and the second conductivity-type transistor is an N-type MOS transistor.

18. The semiconductor integrated circuit device according to claim 11, wherein the semiconductor integrated circuit device is configured so that a timing difference between the second clock signal and the circuit control signal does not occur.

19. The semiconductor integrated circuit device according to claim 11, wherein the second flip-flop circuit brings in the input signal inputted from its outside and outputs the input signal inputted from its outside when the second clock signal is changed from a low level to a high level.

20. The semiconductor integrated circuit device according to claim 11, further comprising a third flip-flop circuit to which the second output signal is inputted and which outputs the second output signal in synchronization with a third clock signal.

* * * * *